(12) United States Patent
Chew et al.

(10) Patent No.: US 11,990,353 B2
(45) Date of Patent: May 21, 2024

(54) SEMICONDUCTOR DEVICE WITH BUFFER LAYER

(71) Applicant: PEP INNOVATION PTE. LTD., Singapore (SG)

(72) Inventors: Hwee Seng Jimmy Chew, Singapore (SG); Senthil Kumar Munirathinam, Singapore (SG)

(73) Assignee: PEP INNOVATION PTE. LTD., Singapore (SG)

(*) Notice: Subject to any disclaimer, the term of this patent is extended or adjusted under 35 U.S.C. 154(b) by 431 days.

(21) Appl. No.: 17/376,187

(22) Filed: Jul. 15, 2021

(65) Prior Publication Data
US 2021/0343549 A1 Nov. 4, 2021

Related U.S. Application Data

(60) Continuation-in-part of application No. 17/346,310, filed on Jun. 14, 2021, which is a division of (Continued)

(30) Foreign Application Priority Data

Jul. 15, 2020 (SG) .......................... 10202006768U

(51) Int. Cl.
*H01L 21/56* (2006.01)
*H01L 21/78* (2006.01)
(Continued)

(52) U.S. Cl.
CPC .......... *H01L 21/568* (2013.01); *H01L 21/561* (2013.01); *H01L 21/78* (2013.01);
(Continued)

(58) Field of Classification Search
CPC ..... H01L 21/568; H01L 21/561; H01L 21/78; H01L 23/3114; H01L 23/3121;
(Continued)

(56) References Cited

U.S. PATENT DOCUMENTS

2008/0006910 A1  1/2008  Miyata et al.
2012/0061823 A1* 3/2012  Wu ........................ H01L 24/13
                                              257/E21.59
(Continued)

FOREIGN PATENT DOCUMENTS

CN   110783300 A    2/2020
CN   110828394 A    2/2020
WO   2006054606 A1  11/2005

*Primary Examiner* — Thanhha S Pham
(74) *Attorney, Agent, or Firm* — Javalon Law, PC

(57) ABSTRACT

A wafer-level buffer layer is disclosed. The wafer-level buffer layer is configured to prevent cracking and chipping the back-end-of-line (BEOL) dielectric during wafer singulation process. The wafer-level buffer layer is a composite wafer-level buffer layer with a vibration damping agent. The vibration damping agent includes a polymer-based base layer with fillers. The damping agent absorbs or dampens the vibration of the saw blade during dicing to prevent cracking and chipping of the BEOL dielectric.

20 Claims, 53 Drawing Sheets

Related U.S. Application Data application No. 15/826,268, filed on Nov. 29, 2017, now Pat. No. 11,049,734.

(60) Provisional application No. 63/114,536, filed on Nov. 17, 2020.

(51) Int. Cl.
  *H01L 23/00* (2006.01)
  *H01L 23/31* (2006.01)
  *H01L 23/367* (2006.01)
  *H01L 23/498* (2006.01)
  *H01L 23/528* (2006.01)
  *H01L 23/538* (2006.01)
  *H01L 25/065* (2023.01)

(52) U.S. Cl.
  CPC ...... *H01L 23/3114* (2013.01); *H01L 23/3121* (2013.01); *H01L 23/3135* (2013.01); *H01L 23/367* (2013.01); *H01L 23/49838* (2013.01); *H01L 23/528* (2013.01); *H01L 24/19* (2013.01); *H01L 24/96* (2013.01); *H01L 25/0657* (2013.01); *H01L 23/5389* (2013.01); *H01L 2223/5448* (2013.01); *H01L 2224/04105* (2013.01); *H01L 2224/12105* (2013.01); *H01L 2224/32225* (2013.01); *H01L 2224/92144* (2013.01); *H01L 2224/97* (2013.01); *H01L 2924/19105* (2013.01)

(58) Field of Classification Search
  CPC ............... H01L 23/3135; H01L 23/367; H01L 23/49838; H01L 23/528; H01L 24/19; H01L 24/96; H01L 25/0657; H01L 24/81; H01L 24/05; H01L 24/13; H01L 2221/68345; H01L 2221/68372; H01L 2224/0239; H01L 2224/0401; H01L 2224/05024; H01L 2224/05027; H01L 21/6835; H01L 23/3128; H01L 24/20; H01L 2224/8119; H01L 2224/96; H01L 2924/181; H01L 2924/18162
  See application file for complete search history.

(56) References Cited

U.S. PATENT DOCUMENTS

| | | |
|---|---|---|
| 2017/0098628 A1 | 4/2017 | Liu et al. |
| 2018/0166396 A1 | 6/2018 | Lee et al. |
| 2020/0051928 A1 | 2/2020 | Park et al. |
| 2020/0168506 A1 | 5/2020 | Kwon et al. |
| 2020/0203188 A1 | 6/2020 | Chew |
| 2021/0343549 A1 | 11/2021 | Chew et al. |

* cited by examiner

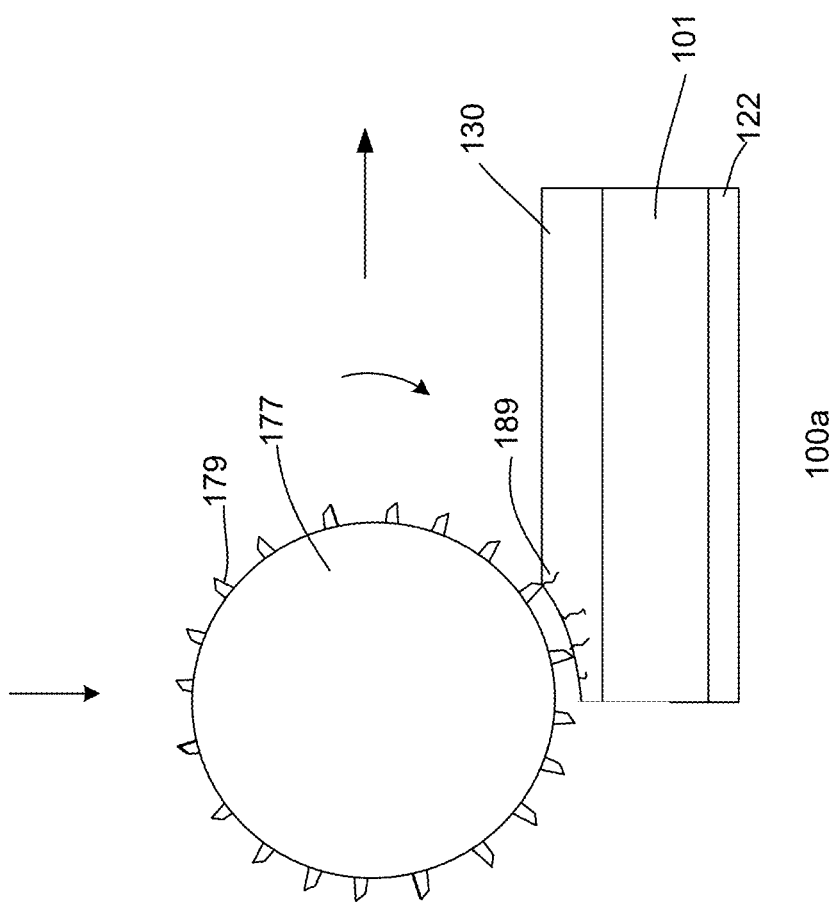

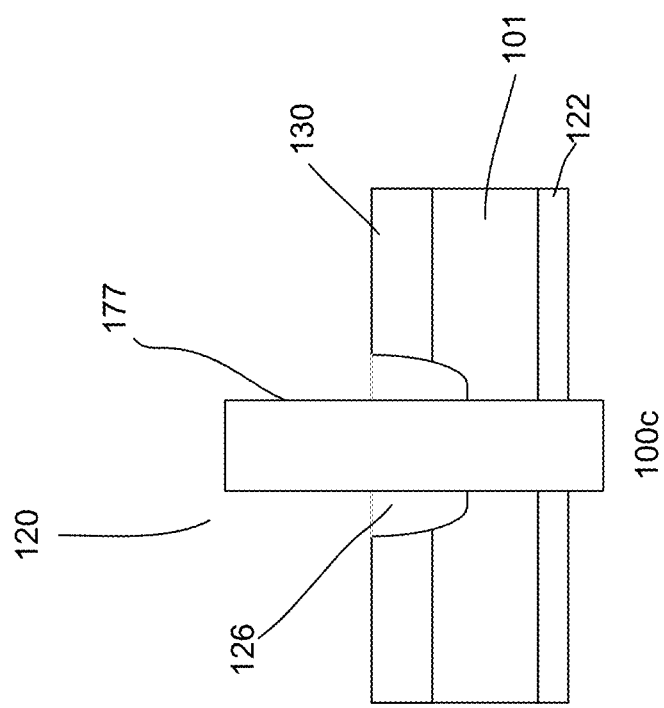

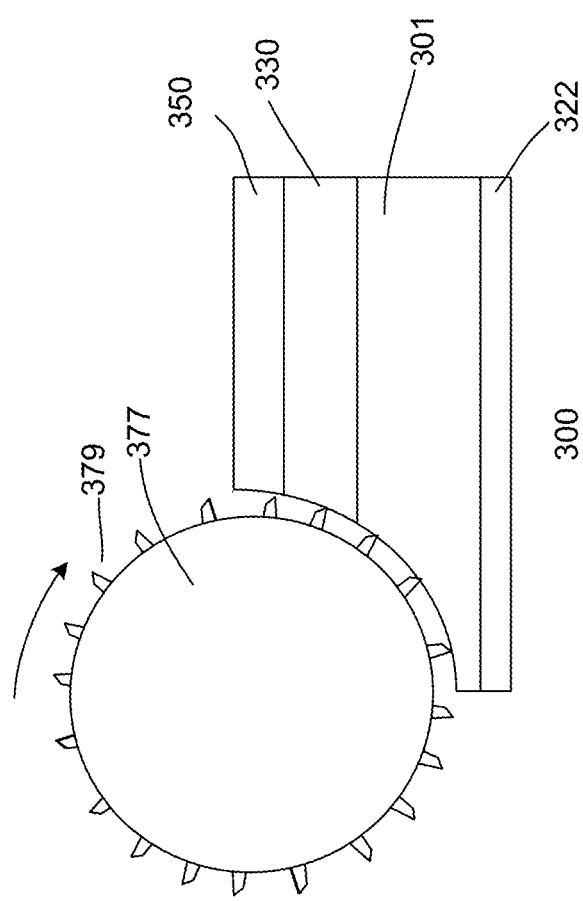

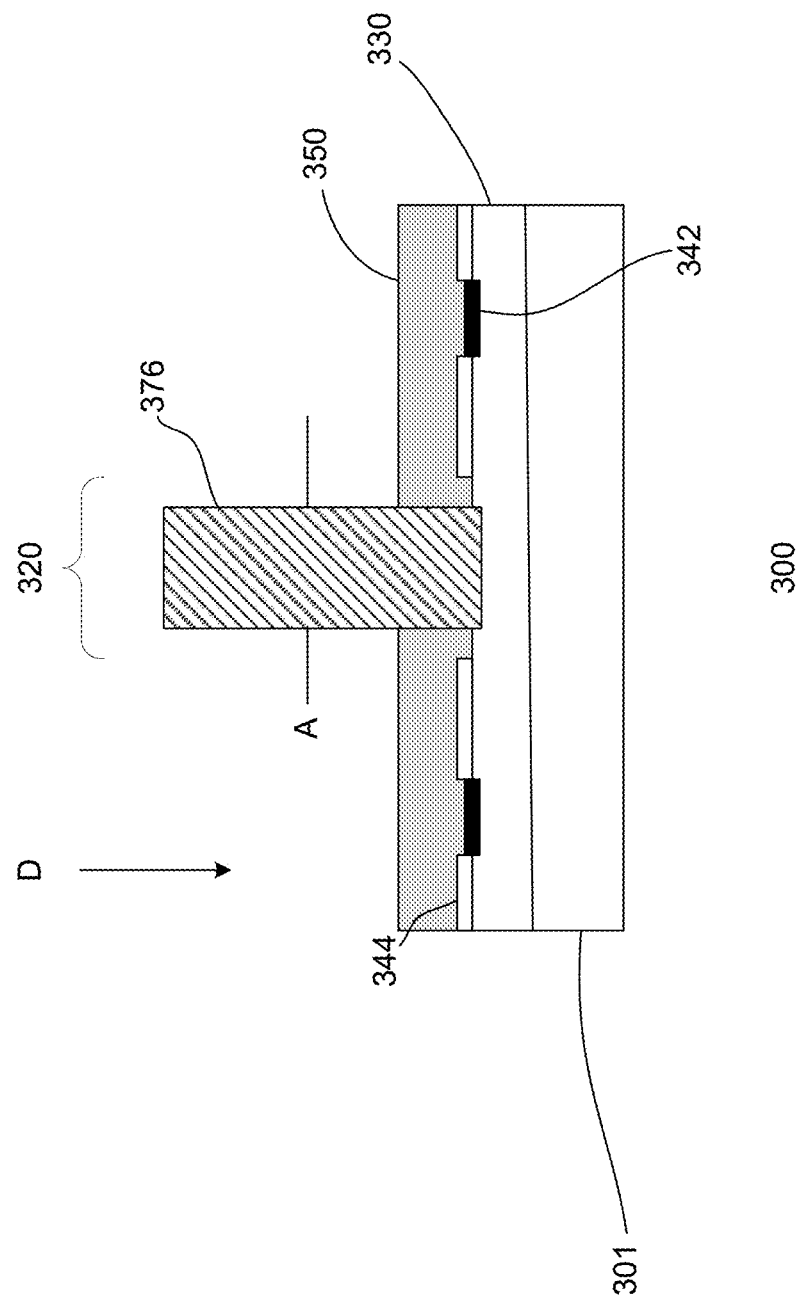

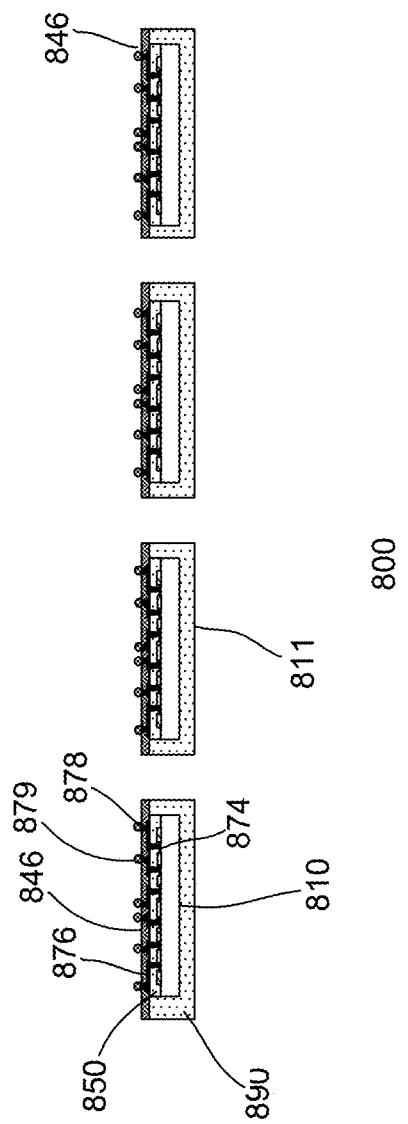

SEMICONDUCTOR DEVICE WITH BUFFER LAYER

CROSS-REFERENCE TO RELATED APPLICATIONS

This application is a continuation-in-part of co-pending U.S. patent application Ser. No. 17/346,310, filed on Jun. 14, 2021, which is a divisional application of U.S. patent application Ser. No. 15/826,268, now U.S. Pat. No. 11,049,734, filed on Nov. 29, 2017. This application also claims the benefit of S. G. Provisional Application No. 10202006768U, filed on Jul. 15, 2020, and U.S. Provisional Application No. 63/114,536, filed on Nov. 17, 2020. The disclosure of all of which are herein incorporated by reference in their entireties for all purposes.

FIELD OF THE INVENTION

The present disclosure generally relates to integrated circuits (ICs). More particularly, the present disclosure relates to prevention or reduce chipping to the ICs during wafer singulation.

BACKGROUND

Integrated circuits (ICs) require interconnects for providing external connections to the internal components. Typically, interconnects in ICs are formed in multiple dielectric layers. The continued demand for increased performance at a lower cost, such as faster operating speed with low interconnect delays, smaller feature sizes, and higher density or functionality is driving the transition to the use of copper as the interconnects and low-k or ultra-low k dielectrics (e.g., dielectric constant k of less than 3.0) as insulators. For example, 65 nm or less technology nodes use copper lines and vias with low-k or ultra-low k dielectrics as insulators for electrical isolation. Low-k dielectrics may include low-k or ultra-low k dielectrics. Furthermore, to satisfy this demand, ICs use thicker inter-layer dielectric stacks and higher metal density.

However, we have observed that devices employing thick low-k dielectrics exhibit reliability issues only detectable during field testing and package reliability testing. Through investigation, we have discovered that the cause of the failures is due to micro-cracking existing in the low-k dielectric layers in the active die region within the die seal ring. The die seal ring, for example, isolates the active area of the die from the saw streets. The micro-cracks or hair-like defects are almost virtually impossible to detect as they are hidden beneath the top wafer surface.

Although not to be bound by theory, it is believed that the micro-cracks in the active die region occur because the low-k dielectrics on the semiconductor wafer is brittle in nature. The brittleness of the low-k dielectrics causes micro-cracks, which originated during the dicing process for singulating the dies of the wafer, to propagate underneath the die seal ring and into the active die region. For example, cracks originating in the saw streets propagate underneath the die seal ring and into the active die region, causing die-level interconnect failures that negatively impact yields.

FIG. 1a is a simplified diagram depicting a dicing process 100a on a wafer. As shown, a wafer 101 is attached to a wafer dicing tape 122. The wafer, for example, is processed with circuit components on its active surface and a back-end-of-line (BEOL) dielectric 130 with multiple metal levels having low-k inter-layer and/or intra-layer dielectrics with metal lines and via contacts.

As shown, a saw blade 177 rotates and is lowered onto an edge of the wafer to start a dicing or cutting process along a saw or dicing street in the x or y direction. The saw blade includes diamond grits 179 embedded at its circumference for cutting the wafer. The initial point of contact by the saw blade is on the BEOL dielectric. As the saw blade continues to be lowered into the wafer, it cuts the wafer along the dicing street. Vibration from the saw blade causes cracks 189 to form in the BEOL dielectric. As discussed, the cracks, even though only occurring at the edge of the dies on the wafer, have been found to negatively impact yield and package reliability.

To prevent cracking, a laser may be employed to first form a groove along the dicing streets of the wafer. FIG. 1b shows a simplified diagram of a process 100b for forming a laser groove 126 along a saw street 120 of a wafer 101. The wafer, which includes the BEOL dielectric 130 with low-k dielectrics, is mounted on a wafer dicing tape 122. The laser groove 126 is formed by a laser 192. The laser groove 126 penetrates through the BEOL dielectric 130 and into the wafer 101. Since the laser is non-mechanical, there is no vibration to cause cracks in the low-k BEOL dielectric. After forming the laser groove, process 100b continues by completely dicing the wafer using a diamond saw blade 177, as shown in process 100c of FIG. 1c.

Although laser grooving may reduce cracking in the low-k BEOL dielectric, the requirement of a laser adds significant manufacturing costs, both in terms of equipment cost as well as throughput time. For example, the laser equipment is expensive and the laser grooving process is much slower than using just a saw blade. The requirement of both laser grooving and mechanical sawing extends the processing time of each wafer significantly. In some instances, even with the use of both laser grooving and mechanical sawing, wafer chipping has still been observed at the edge of the dies.

Therefore, based on the foregoing discussion, it is desirable to provide a cost-effective solution for preventing cracks in BEOL dielectrics of devices during wafer dicing to singulate the devices.

SUMMARY

Embodiments of the present disclosure generally relate to semiconductor devices or integrated circuits (ICs). In particular, the present disclosure relates to prevention or reduce chipping to the ICs during wafer singulation.

In one embodiment, a semiconductor package includes a die with active and inactive surfaces. The active surface includes die pads on a back-end-of-line (BEOL) dielectric. A buffer layer is disposed on the active surface of the die. The buffer layer includes a vibration damping composition to prevent cracking of the BEOL dielectric from a wafer singulation process. The buffer layer includes via openings to expose the die pads. Via contacts disposed on the via openings to provide electrical connection to the die pads.

In another embodiment, a semiconductor package includes a die with active and inactive surfaces. The active surface includes die pads on a back-end-of-line (BEOL) dielectric. A buffer layer is disposed on the active surface of the die. The buffer layer includes a Young's Modulus and a Breaking Strength to prevent cracking of the BEOL dielectric from a wafer singulation process. The buffer layer includes via openings to expose the die pads. Via contacts disposed on the via openings to provide electrical connection to the die pads.

In yet another embodiment, a method of processing a semiconductor wafer includes providing a semiconductor wafer having an active surface. The active surface is processed with a plurality of dies, wherein a top die surface of the plurality of dies includes die pads on a back-end-of-line (BEOL) dielectric. The method further includes forming a buffer layer on the semiconductor wafer covering the top die surface. The buffer layer includes a vibration damping composition for preventing cracking of the BEOL dielectric from a wafer singulation process.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIG. 1a shows a simplified diagram of dicing a wafer along a dicing line by mechanical sawing;

FIGS. 1b-1c show dicing a wafer along a dicing line using both laser grooving and mechanical sawing;

FIGS. 3b-3c show cross-section views of dicing a wafer along the saw street;

FIG. 3e shows a cross-section view of dicing a wafer with the present buffer layer perpendicular to the saw street;

FIGS. 8b-8j show cross-sectional views of a process for processing a panel assembly;

DETAILED DESCRIPTION

Embodiments generally relate to devices, for example, semiconductor devices or integrated circuits (ICs). In particular, the present disclosure relates to a buffer layer that prevents or reduces cracking and chipping in the BEOL dielectric with low-k dielectrics on wafers resulting from the singulation process.

Figure 1B:
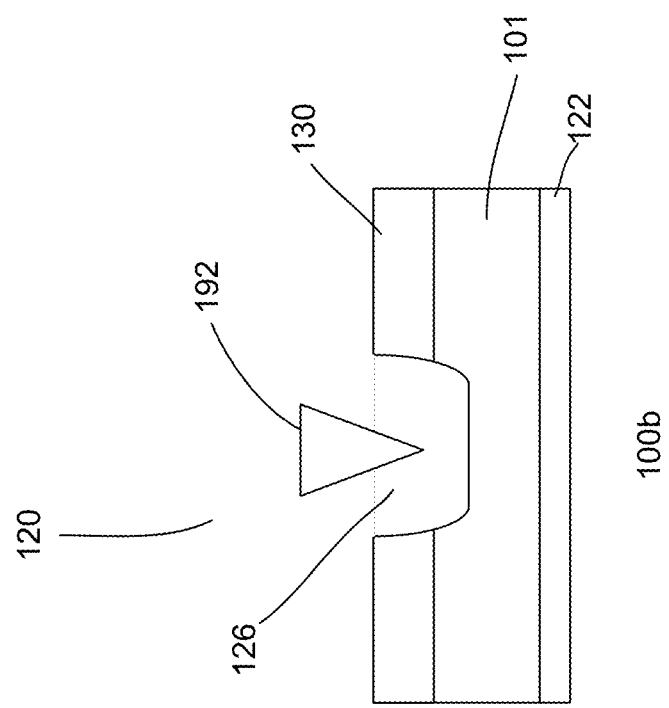
Figure 2A:
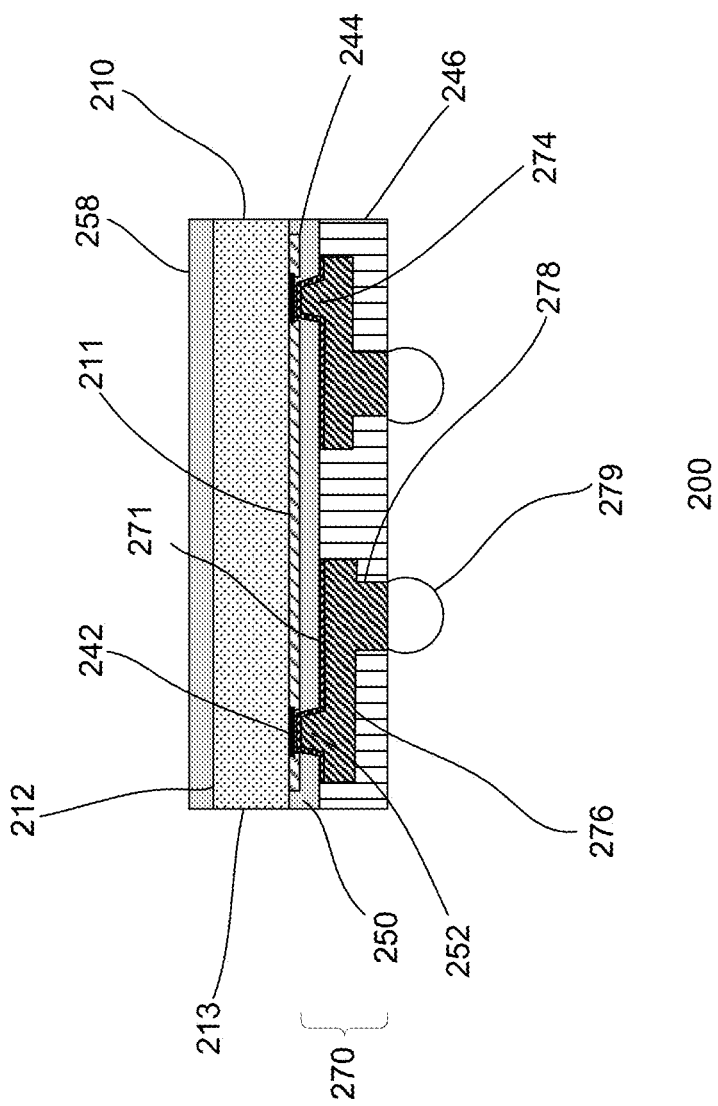
FIGS. 2a-2e show simplified cross-sectional views of various embodiments of semiconductor packages.
Figure 2B:
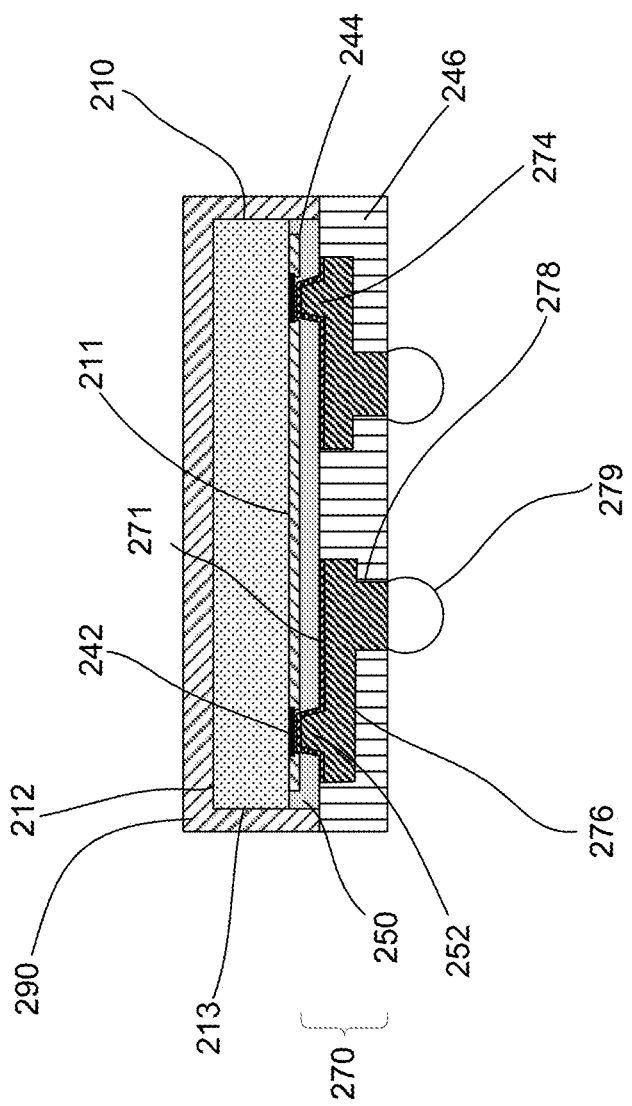
Figure 2C:
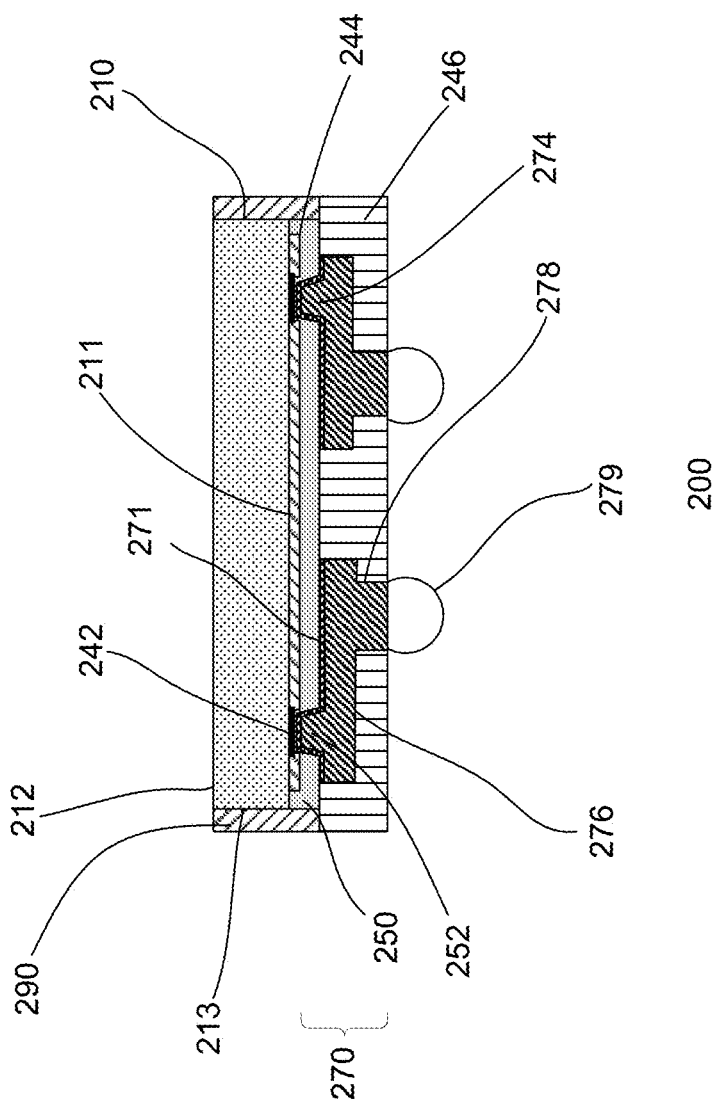
Figure 2D:
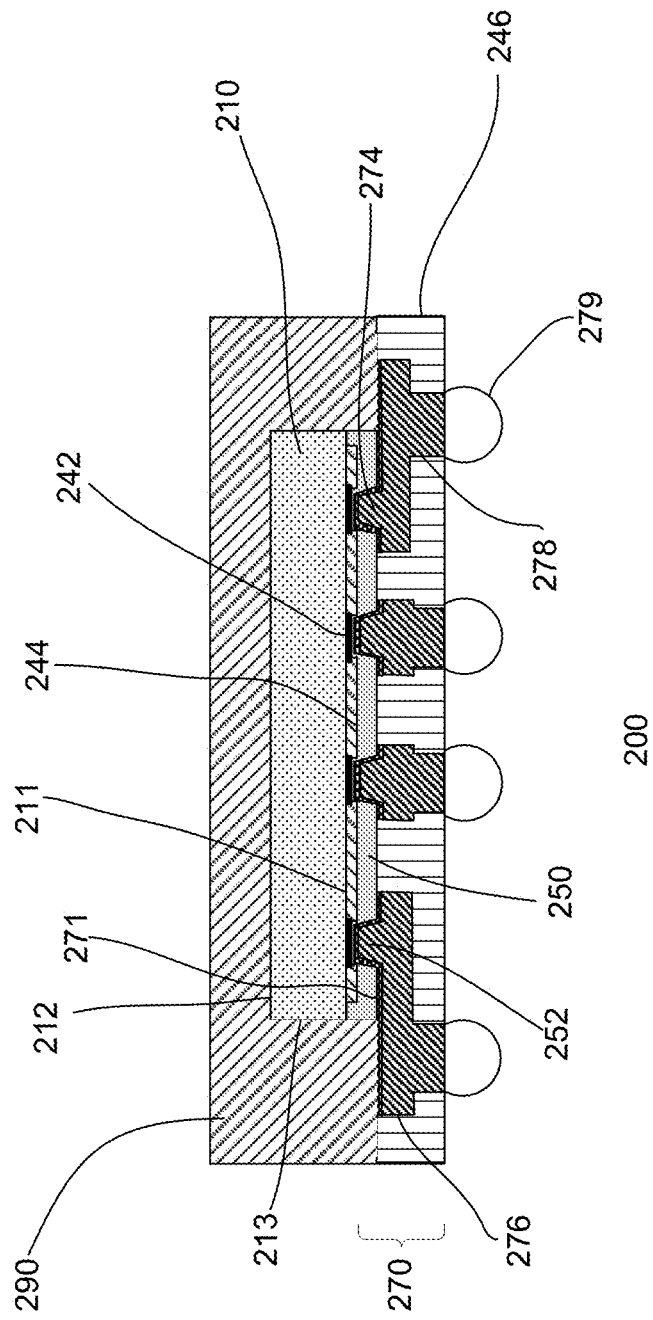
Figure 2E:
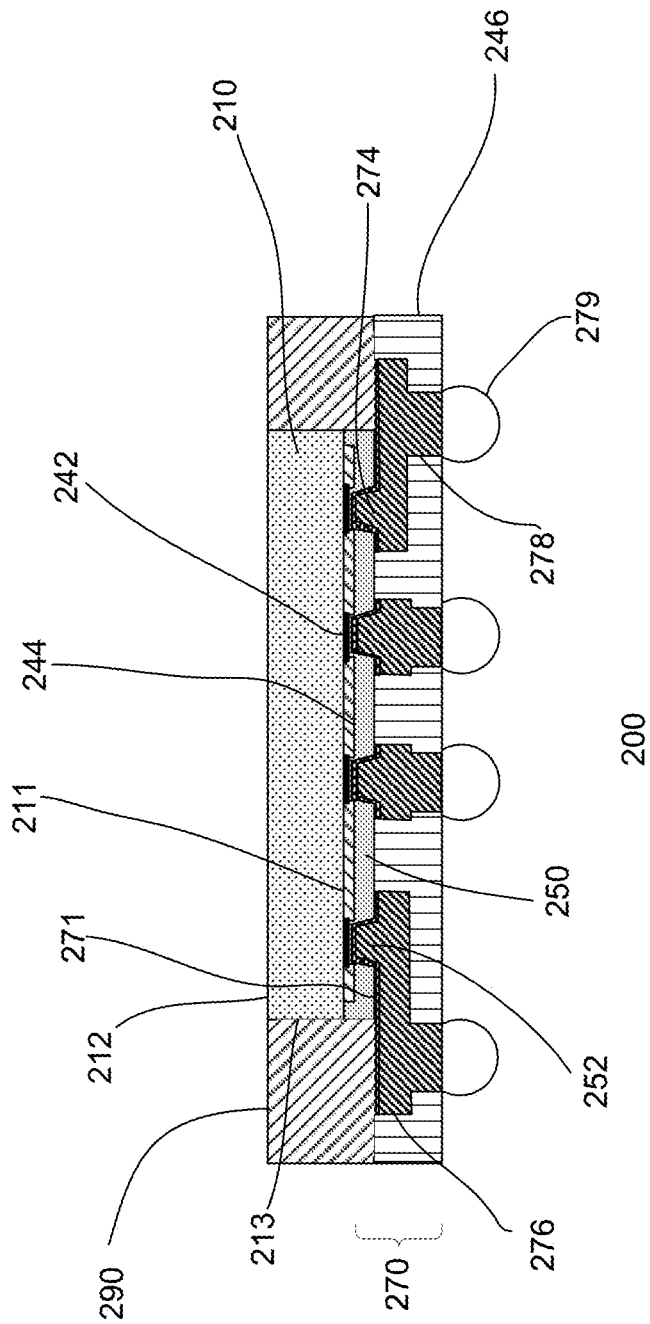

FIGS. 2a-2e show simplified cross-sectional views of various embodiments of semiconductor packages 200. In particular, FIGS. 2a-2c show simplified cross-sectional views of different embodiments of fan-in semiconductor packages while FIGS. 2d-2e show simplified cross-sectional views of different embodiments of fan-out packages. Referring to FIGS. 2a-2e, the semiconductor package includes a die 210. The die 210 includes first and second major die surfaces 211 and 212 and side die surfaces 213. The first major die surface may be referred to as the active die surface and the second major die surface may be referred to as the inactive die surface. The die, for example, is singulated from a processed wafer, such as a silicon wafer, with a plurality of dies. Other types of wafers may also be useful. For example, the wafer may be a silicon carbide (SiC) wafer, a gallium nitride (GaN) wafer, a gallium arsenide (GaAs) wafer, or an indium phosphide (InP) wafer. Other types of wafers may also be useful. The bare or unprocessed wafer may be a substrate for the die (i.e., die substrate).

The die substrate may be processed with circuit components or elements. The circuit components may include active and inactive circuit components. Active components may include, for example, transistors, diodes, and triodes, while passive components include voltage elements, capacitors, resistors, and inductors. Other types of active and passive components may also be included. The circuit components may be formed by using a series of processes such as doping (e.g., implantation or diffusion), deposition (e.g., oxidation, chemical vapor deposition (CVD), plating, and sputtering), and patterning (e.g., lithography and etching). Other techniques may also be employed to form the circuit components.

A BEOL dielectric with multiple interconnect levels having conductive lines coupled to via contacts is formed on the die substrate. The BEOL dielectric, for example, covers the die substrate surface with the circuit components. The BEOL dielectric, in one embodiment, includes low-k dielectrics or dielectric layers isolating the conductive lines of the different interconnect levels. The low-k dielectric layers may also include ultra low-k dielectric layers. Low-k dielectrics or dielectric layers may collectively refer to low-k dielectrics or dielectric layers and ultra low-k dielectrics or dielectric layers. Other types of dielectric layers may also be useful.

A top of the BEOL may include a dielectric passivation layer 244 with pad openings to expose conductive die contact pads 242. The contact pads may also be referred to as die pads or bond pads. The contact pads, for example, may be aluminum (Al) contact pads. Other types of contact pads, such as copper (Cu), nickel (Ni), palladium (Pd), gold (Au), chromium (Cr) or a combination or alloys thereof, such as Al—Cu, may also be possible.

The dielectric passivation layer may be a passivation stack with multiple dielectric layers. For example, the passivation stack may include a combination of dielectric layers, such as silicon oxide and silicon nitride layers. Other types of dielectric layers may also be useful. The pad openings, in one embodiment, are smaller than the contact pads. For example, the passivation layer has a top surface which is above the top surface of the contact pads, with the pad openings being smaller than the contact pads. As shown, the passivation layer covers an edge portion of the contact pads. The pad openings may be formed by, for example, an anisotropic etch, such as a reactive ion etch (RIE). Other types of etching may also be used to form the pad openings.

Exposed portions of the top of the BEOL dielectric, passivation layer, and contact pads, in one embodiment, may be the active die surface. In some cases, the active die surface may include the top of the BEOL dielectric and contact pads, but no passivation layer.

In one embodiment, a buffer layer 250 is disposed on the active die surface of the die. For example, the buffer layer covers the active die surface with the contact pads and passivation layer. In the case that the active die surface does not include a passivation layer, the buffer layer covers the active die surface and contact pads. The buffer layer, for example, may be referred to as a wafer-level buffer layer. For example, the buffer layer is disposed on the active wafer surface processed with a plurality of dies before the wafer singulation process.

The buffer layer prevents or reduces cracking and chipping in the BEOL dielectric during dicing. The mechanical properties of the buffer layer are also important to reduce or prevent cracking in the BEOL dielectric during dicing of the wafer. In particular, the Young's Modulus and the Breaking Strength of the buffer layer are important to reduce or prevent cracking and chipping during dicing of the wafer.

In one embodiment, the buffer layer is transparent. Providing non-transparent buffer layers may also be useful. In some cases, a material can be configured to be transparent or non-transparent. The buffer layer, in one embodiment, is a non-photoimageable. For example, the buffer layer is non-photosensitive. Patterning the buffer layer may be achieved by, for example, laser etching, mask and etch techniques, or a combination thereof.

In one embodiment, the buffer layer is a tunable buffer layer. For example, the Young's Modulus and the Breaking Strength of the buffer layer can be tunable or adjustable. The Young's Modulus and the Breaking Strength of the buffer layer can be tailored to prevent cracking in the BEOL dielectric. In one embodiment, the Young's Modulus is about 10,000-25,000 MPa. In other embodiments, the Young's Modulus is about 14,000-25,000 MPa. In yet other embodiments, the Young's Modulus is about 15,000-25,000 MPa. In another embodiment, the Young's Modulus is about 16,000-25,000 MPa. In another embodiment, the Young's Modulus is about 15,000-20,000. In other embodiments, the Young's Modulus is about 20,000-25,000 MPa.

As for the Breaking Strength, it may be about 45-150 MPa. In other embodiments, the Breaking Strength is about 70-150 MPa. In another embodiment, the Breaking Strength is about 70-120 MPa. In another embodiment, the Breaking Strength is about 70-105 MPa. In another embodiment, the Breaking Strength of the buffer layer is about 80-120 MPa. In yet another embodiment, the Breaking Strength of the buffer layer is about 90-120 MPa. A coefficient of thermal expansion (CTE) of the buffer layer, for example, may be about 6-20 ppm/K. The buffer layer may have a temperature stability through the region −65-+300° C.

In one embodiment, the tunable buffer layer is a tunable composite buffer layer. The tunable composite buffer layer includes a vibration damping composition or a damping agent. The vibration damping composition, for example, includes a base layer containing fillers or granules to reduce vibration from the dicing process.

In one embodiment, the base buffer layer of the tunable composite buffer layer is an organic polymer matrix material. Various types of polymers may be used for the base buffer layer. For example, polymers may include thermosetting plastics or thermoplastics, such as polyimides, epoxy resins, as well as other types of polymers. In one embodiment, the base buffer layer includes a resin, such as epoxy or cyanate esters. Preferably, the base buffer layer is a low viscosity resin, such as a biphenyl epoxy resin. The thickness of the buffer layer may be about 10-100 um, about 15-100 um, about 20-100 um, about 25-100 um, about 45-100 um or about 60-100 um. The tolerance of the buffer layer may be ±1-5 um, depending on the thickness of the buffer layer. Providing buffer layers having other thicknesses may also be useful.

The fillers of the base buffer layer may be organic-based, inorganic-based, or a combination thereof. For example, fillers may include silica ($SiO_2$) fillers, amorphous aluminum oxide ($\alpha$-$Al_2O_3$) fillers, or a combination thereof. Other types of non-conductive fillers may also be useful. Other types of non-conductive fillers may also be useful. For example, the fillers may be silica, glass beads, sand, or a combination thereof. The fillers, for example, may be spherical-shaped fillers. The spherical fillers may have a diameter of about 0.5-12 um. In other embodiments, the spherical fillers may have a diameter of about 0.5-10 um. Other sized fillers may also be useful, including nano-sized fillers. In addition, the fillers may have any shape. Preferably, the fillers may be non-uniformly sized fillers. For example, the fillers of the base buffer layer have different diameters. The fillers of the base buffer layer may also have different shapes. Providing fillers having different sizes enables the buffer layer to contain a higher density of fillers. For example, smaller sized fillers can fill the gaps between the larger sized fillers.

The sizes of the fillers may depend on the width of the saw blade used in dicing the wafer. In one embodiment, the sizes of the fillers are less than the width of the saw blade used in dicing. For example, the sizes of the fillers may be less than or equal to about ½ or about ⅓ of the width of the saw blade used in dicing. In one embodiment, the sizes of the fillers may be about 0.5 um to −⅓ of the width of the saw blade used in dicing the wafer. The width of a saw blade is typically about 30-36 um. For example, in the case of a 36 um wide saw blade, the sizes of the fillers may be about 0.5-10 um or about 0.5-12 um in the case of a 30 um wide saw blade. In one embodiment, the concentration of fillers in the composite buffer layer is from about 70-90 weight percent (wt %) based on the total weight of the composite buffer layer. In another embodiment, the concentration of fillers in the composite buffer layer is from about 80-90 wt %.

In one embodiment, tuning the composite buffer layer with the selected or defined Young's Modulus and Breaking Strength can be achieved by selecting the appropriate base buffer layer material, filler material, filler concentration, or a combination thereof. Furthermore, these various factors may also affect CTE as well as temperature stability.

In one embodiment, the composite buffer layer is a preformed layer which is laminated onto the wafer or die. For example, the composite buffer layer is preformed into a sheet which is laminated onto the wafer. In other embodiments, the composite buffer layer may be formed on the wafer. Other configurations of the composite buffer layer may also be useful.

The buffer layer includes via openings 252 to expose the contact pads 242. The via openings may be formed by laser etching. For example, the via openings include laser-etched via sidewalls. Other techniques for forming the via openings may also be useful. For example, the via openings may be formed by a plasma etch, such as a reactive ion etch (RIE), using a patterned photoresist mask. In such cases, the via openings include plasma etched sidewalls. In other embodiments, the via openings are formed using a multi-etch process, such as a high-power laser etch followed by a low-power laser etch or the high-power laser etch followed by a plasma etch. The laser, for example, is a laser set for non-photoimageable patterning. The two-step etch avoids damage to aluminum pads caused by the high-power laser etching. The two-step etch process may result in the upper portion of the via openings having a laser-etched sidewall while the lower portion may be a laser-etched sidewall or a plasma etched sidewall.

As shown, the bottom of the via openings of the buffer layer is smaller than the pad openings of the passivation layer. For example, the pad openings are formed prior to forming the buffer layer while via openings are formed after forming the buffer layer. The bottom of the via openings may be disposed at about the center of the pad openings. Alternatively, the bottom of the via openings and pad openings have the same dimension. For example, the via openings and pad openings are formed at about the same time. In some embodiments, the passivation layer does not include pad openings when the buffer layer is formed. Via openings are formed followed by forming the pad openings.

An RDL structure 270 is formed on the package. The RDL structure provides interconnections to the contact pads 242. In one embodiment, the RDL structure includes RDL via contacts 274, RDL lines 276, and RDL studs 278. The various components of the RDL structure may be copper or copper alloy RDL components. For example, the RDL via contacts, RDL lines, and RDL studs are formed of copper or copper alloy. Other types of conductive metals may also be useful.

The RDL components may be formed by plating using a seed layer 271. For example, a seed layer lines the buffer layer 250, including the sidewalls and bottoms of the via openings. The seed layer may be a titanium copper (TiCu) seed layer formed by sputtering. A plating mask, such as a patterned photoresist layer patterned by laser direct imaging (LDI), is used to plate an RDL layer. For example, a dry film photoresist is laminated over the seed layer and patterned by LDI using a laser set for photoimageable patterning. The patterned photoresist layer includes openings corresponding to the RDL lines, including the via openings. The plating process fills the mask openings, including the via openings, with a conductive layer, such as copper to form RDL lines coupled to the contact pads by RDL via contacts in the via openings. The plating process stops slightly below the height of the patterned photoresist layer. The patterned photoresist layer may remain after forming the RDL lines. Another dry film photoresist is laminated on the RDL lines and mask. The photoresist film is patterned by, for example, LDI, to form stud openings over the RDL lines where studs are to be formed. For example, the patterned resist layer may be a plating mask for selectively forming the RDL studs 278 on the RDL lines 276. A plating process is employed to form the RDL studs 278 in the stud openings followed by the removal of the photoresist films.

An RDL encapsulation layer 246 is disposed over the buffer layer 250 with the RDL structure 270. The RDL encapsulation layer 246 has a first surface which is coplanar with the surface of the studs. The RDL encapsulation layer, for example, fills the gaps between the RDL lines 276 and RDL studs 278, leaving the surface of the studs exposed.

The RDL encapsulation layer, in one embodiment, is an RDL composite encapsulation layer. The RDL composite encapsulation 246 layer may be similar to the composite buffer layer 250. For example, the RDL composite encapsulation layer 246 includes a base RDL encapsulation layer containing fillers or granules. In the case of the RDL composite encapsulation layer, the fillers may be larger than those of the composite buffer layer 250.

The RDL composite encapsulation layer 248, for example, may be preformed into an encapsulation sheet and laminated onto the buffer layer, such as by film molding, compression molding, vacuum lamination or roller lamination. Other techniques for forming the RDL composite encapsulation layer may also be useful. The laminated RDL composite encapsulation layer covers the buffer layer 250 and RDL structure 270.

As shown, the surface of the RDL encapsulation layer 246 and the surface of the RDL studs are coplanar. The coplanar surface of the RDL encapsulation layer and the RDL studs 278 may be referred to as a first, a top, or an exposed surface. When forming the RDL encapsulation layer 248, it may cover the top surface of the RDL studs 278. A grinding process or planarizing process, such as chemical mechanical polish (CMP), may be performed to remove the excess RDL encapsulation material, resulting in a coplanar surface between the RDL studs 278 and the encapsulation layer 248.

In one embodiment, package contacts 279 are disposed on the studs 278. As shown, the package contacts include solder bumps. The solder bumps may be formed by solder bump technology (SBT). SBT, for example, may include solder drop and reflow to form the solder balls. The solder bumps, for example, may be employed for ball grid array (BGA) packages. Other types of package contacts, such as for LGA and QFN packages, may also be useful. For example, the package contacts may be metal-plated contacts, such as tin-plated contacts. Plated contacts can be formed on the studs by, for example, a matt plating process. Other techniques for forming the plated contacts may also be useful.

As shown, the RDL structure includes one RDL level. For example, the RDL structure includes one RDL line level with RDL lines coupled to the contact pads by RDL via contacts and a final stud level disposed on the RDL line level. In other embodiments, the RDL line level may include multiple line levels (from 1-x levels) with RDL via contacts, RDL lines, and a final stud level disposed on an uppermost RDL line level ($i^{th}$ level=x). In such cases, there may be multiple RDL encapsulation levels with RDL encapsulation layers. An RDL encapsulation layer is formed after each RDL line level is formed, except for the last level. For the uppermost line level, the encapsulation layer covers the RDL lines of the uppermost RDL line level and the RDL studs of the final stud level.

As shown in FIG. 2a, the package is a fan-in type semiconductor package 200. For fan-in type semiconductor packages, the RDL structure, including the RDL lines and RDL studs, is disposed within the footprint of the die. The RDL structure and the RDL encapsulation layer are wafer-level RDL structure and wafer-level RDL encapsulation layer, respectively. For example, the RDL structure and RDL encapsulation layer are formed on the wafer prior to singulation. In such cases, the side surfaces of the die, the composite buffer layer, and the RDL encapsulation layer are flush or aligned from the singulation process.

In one embodiment, the inactive die surface 212 is also provided with an inactive or backside protection layer 258. For example, a backside protection layer 258 is provided on the inactive or backside surface of the die. The backside protection layer, in a preferred embodiment, is similar to the composite buffer layer 250. For example, the backside protection layer is a composite backside protection layer. The backside protection layer prevents chipping of the wafer on the backside of the wafer during the singulation process. Other types of backside protection layers may also be useful. Similar to the composite buffer layer 250, the composite backside protection layer is a wafer-level layer. The backside protection layer is applied to the backside surface of the wafer prior to dicing. As such, the side surfaces of the backside protection layer are also flush with the die side surfaces. The thickness of the backside protection layer may be about 25-200 um, about 25-150 um or about 50-120 um. Other thicknesses for the backside protection layer may also be useful.

Other embodiments of fan-in type semiconductor packages 200 are shown in FIGS. 2b-2c. In one embodiment, the RDL structure and RDL encapsulation layer are panel-level RDL structure and encapsulation layer. For example, the RDL structure and RDL encapsulation layer are formed at the panel-level after the wafer has been diced into individual dies and formed into a panel assembly. A panel assembly, for example, includes a plurality of dies arranged in a matrix and encapsulated by a mold layer 290. As such, the RDL encapsulation layer 246 extends beyond the footprint of the die 210. For example, the sides of the RDL encapsulation layer are not flush with the sides of the die and buffer layer. As shown, the sides of the die 210 and buffer layer 250 are recessed from the sides of the RDL encapsulation layer.

A mold layer 290 encapsulates the die. The mold layer, for example, is an epoxy mold compound (EMC). Other types of mold layers may also be useful. For example, the mold layer can be formed from a liquid mold compound. The mold layer covers the sides of the die and is disposed on top of the RDL encapsulation layer 246. Sides of the RDL encapsulation layer and mold layer are flush and the bottom mold layer surface on top of the RDL encapsulation layer is flush with the bottom surface of the buffer layer.

As shown in FIG. 2b, the mold layer covers the top of the die. For example, the top mold layer surface is disposed above the inactive die surface 212. Such a package may be referred to as a six sided fan-in package in which all six sides of the die are protected. In another embodiment, as shown in FIG. 2c, the top mold layer surface and inactive die surface are coplanar. Such a package may be referred to as a five sided fan-in package.

In other embodiments, the packages are fan-out packages, as shown in FIGS. 2d-2e. For fan-out type semiconductor packages, the RDL structure 270, including the RDL lines 276 and studs 278, extends beyond the footprint of the die 210. The RDL structure and RDL encapsulation layer 246 are panel-level RDL structure and RDL encapsulation layer, respectively. For example, the RDL structure and RDL encapsulation layer are formed on the panel-level after wafer singulation. In such cases, the side surfaces of the RDL encapsulation layer are not flush with the sides of the die and buffer layer.

A mold layer 290 encapsulates the die. The mold layer covers the sides of the die and is disposed on top of the RDL encapsulation layer 246. Sides of the RDL encapsulation layer and mold layer are flush and the bottom mold layer surface on top of the encapsulation layer is flush with the bottom surface of the buffer layer. As shown in FIG. 2d, the mold layer covers the top of the die. For example, the top mold layer surface is disposed above the inactive die surface. Such a package may be referred to as the six sided fan-in package. In another embodiment, as shown in FIG. 2e, the top mold layer surface and inactive die surface are coplanar. Such a package may be referred to as the five sided fan-in package.

Figure 2F:
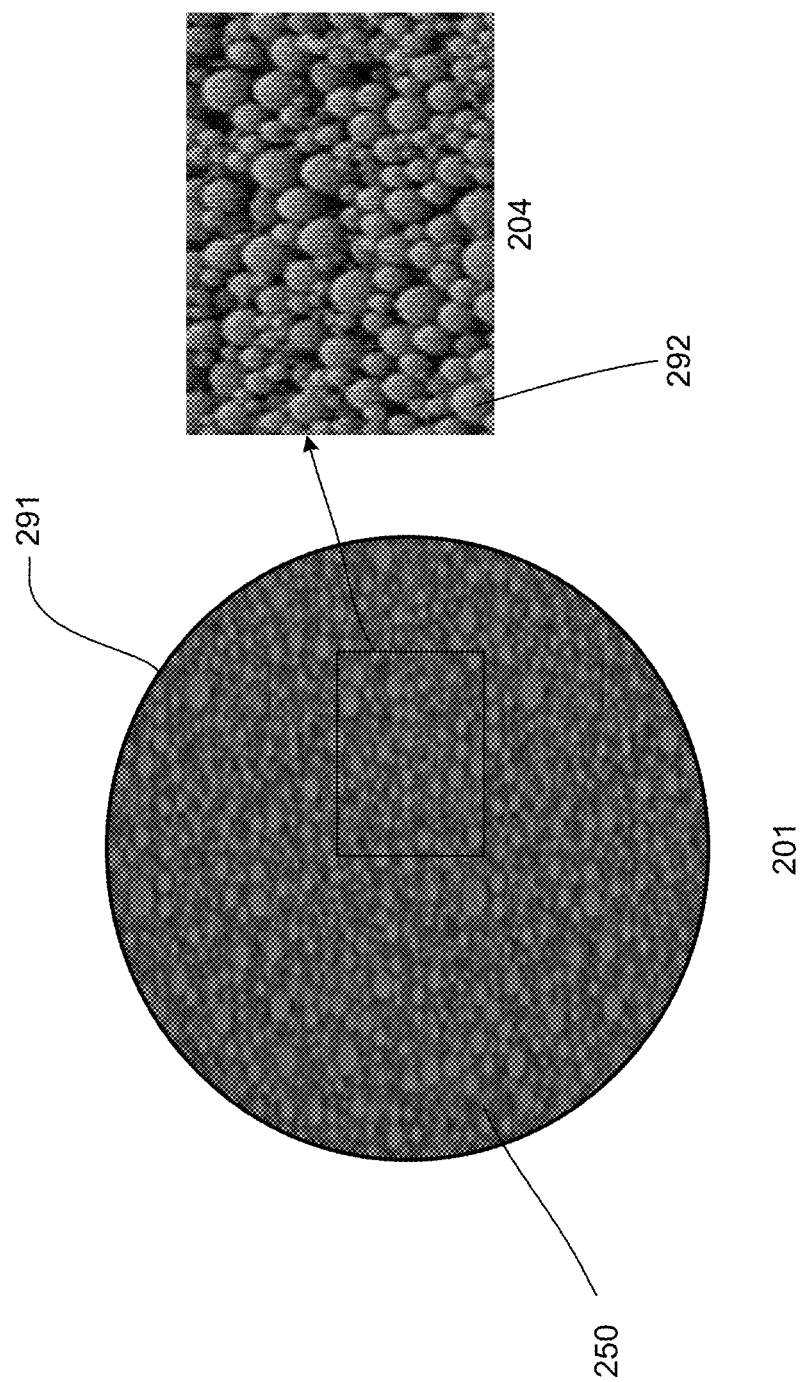
FIG. 2f shows an image of a top view of a wafer with a buffer layer and an image of a magnified view of a portion of the buffer layer.

FIG. 2f shows an image of a top view of a wafer 201 with an embodiment of a buffer layer 250. An image of a magnified portion 204 of the buffer layer is also included. As discussed, the buffer layer prevents or reduces cracking and chipping in the BEOL dielectric during dicing. The buffer layer includes a vibration damping agent. In one embodiment, the buffer layer has a Young's Modulus and a Breaking Strength tailored to prevent cracking and chipping in the BEOL dielectric during dicing. In one embodiment, the Young's Modulus is about 10,000-25,000 MPa. In other embodiments, the Young's Modulus is about 14,000-25,000 MPa. In yet other embodiments, the Young's Modulus is about 15,000-25,000 MPa. In another embodiment, the Young's Modulus is about 16,000-25,000 MPa. In another embodiment, the Young's Modulus is about 15,000-20,000. In other embodiments, the Young's Modulus is about 20,000-25,000 MPa.

In one embodiment, the Breaking Strength of the buffer layer is about 45-150 MPa. In other embodiments, the Breaking Strength is about 70-150 MPa. In another embodiment, the Breaking Strength is about 70-120 MPa. In another embodiment, the Breaking Strength is about 70-105 MPa. In another embodiment, the Breaking Strength of the buffer layer is about 80-120 MPa. In yet another embodiment, the Breaking Strength of the buffer layer is about 90-120 MPa. A coefficient of thermal expansion (CTE) of the buffer layer, for example, may be about 6-20 ppm/K. The buffer layer may have a temperature stability through the region −65-+300° C.

The thickness of the buffer layer may be about 10-100 um, 15-100 um, 20-100 um, 25-100 um, 45-100 um or 60-100 um. The tolerance of the buffer layer may be ±1-5 um, depending on the thickness of the buffer layer. Providing buffer layers having other thicknesses may also be useful.

In one embodiment, the buffer layer is a composite buffer layer having a base buffer layer 291 containing fillers or granules 292. The base buffer layer, in one embodiment, is a transparent base buffer layer, such as a transparent polymeric base buffer layer. Various types of polymers may be used for the base buffer layer. The polymeric base buffer may be a thermosetting plastic or a thermoplastic, such as polyimide, or resins. In one embodiment, the base buffer layer includes a resin, such as epoxy or cyanate esters. Preferably, the base buffer layer is a low viscosity resin, such as a biphenyl epoxy resin.

The fillers may be organic-based, inorganic-based, or a combination thereof. For example, fillers may include silica ($SiO_2$) fillers, amorphous aluminum oxide ($\alpha$-$Al_2O_3$) fillers, or a combination thereof. Other types of non-conductive fillers may also be useful. For example, the fillers may be silica, glass beads, sand, or a combination thereof. The fillers, for example, may be spherical-shaped fillers. Other shaped fillers may also be useful. Preferably, the fillers have a diameter of about 0.5-12 um.

The sizes of the fillers may depend on the width of the saw blade used in dicing the wafer. In one embodiment, the sizes of the fillers are less than the width of the saw blade used in dicing. For example, the sizes of the fillers may be less than or equal to about ½ or about ⅓ of the width of the saw blade used in dicing. In one embodiment, the sizes of the fillers may be about 0.5 um to −⅓ of the width of the saw blade used in dicing the wafer. The width of a saw blade is typically about 30-36 um. For example, in the case of a 36 um wide saw blade, the sizes of the fillers may be about 0.5-10 um or about 0.5-12 um in the case of a 30 um wide saw blade. In one embodiment, the concentration of fillers in the composite buffer layer is from about 70-90 wt % based on the total weight of the composite buffer layer. In another embodiment, the concentration of fillers in the composite buffer layer is from about 80-90 wt %.

To form the buffer layer, the components may be combined together in a flowable form and applied onto the wafer. For example, a liquid, which includes the epoxy resin and additives (hardener), is combined or mixed with fillers (granules). The liquid mixture with fillers is applied onto the wafer. After application, the wafer is cured to harden the buffer layer with fillers. Such techniques, for example, may include spin-coating onto the wafer or slit die or printing onto the wafer.

Figure 2G:
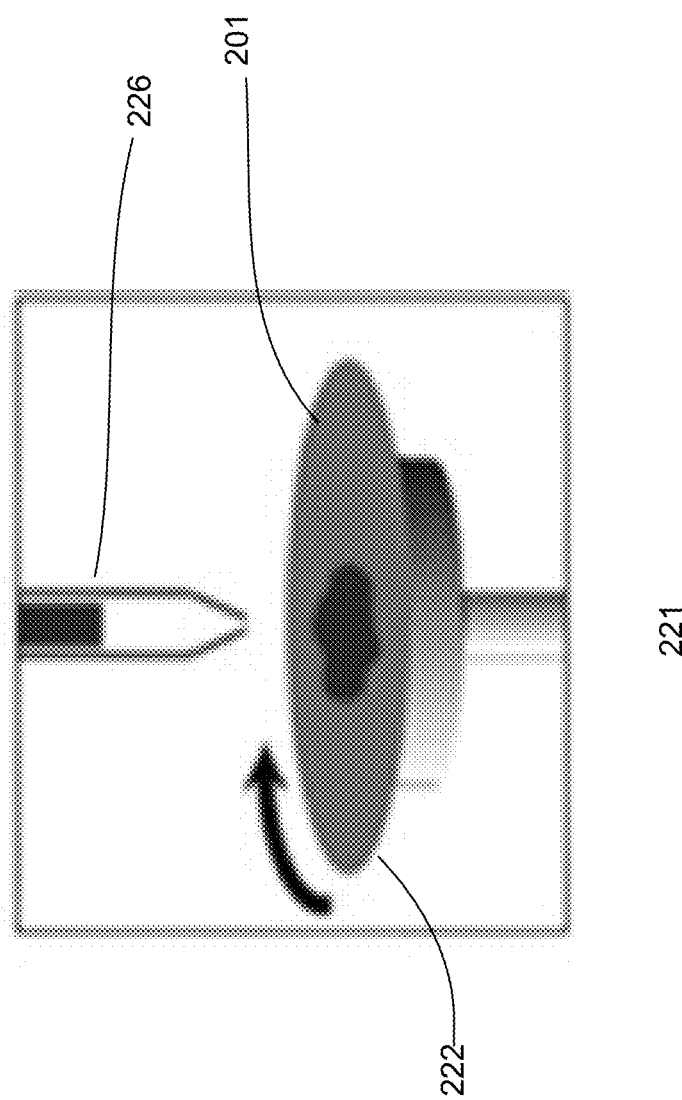
FIGS. 2g-2h show embodiments of a process for forming a composite buffer layer.

FIG. 2g illustrates forming the buffer layer by spin-coating. As shown, a spin coater 221 includes a rotatable table 222 on which a wafer 201 is mounted. For example, the wafer may be mounted onto the table by a vacuum chuck. A dispenser 226 dispenses the flowable buffer layer composition (resin, fillers, and hardeners) onto the wafer, coating it. After coating, the wafer is heated to cure the buffer layer with the fillers.

Figure 2H:
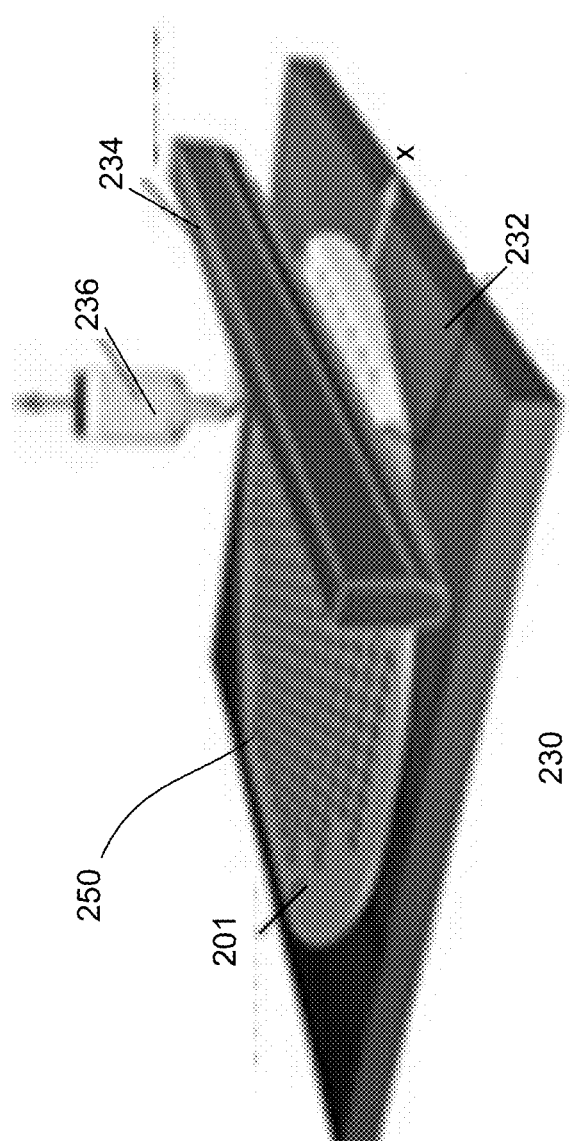

FIG. 2h illustrates forming the buffer layer by slit die or printing. As shown, a slit die printer 230 includes a table 232 on which a wafer 201 is mounted. The wafer may be mounted to the table by, for example, a vacuum press. An elongated slit die coater 234 is disposed over the table in the y direction. A container tank 236 feeds the slit die coater with the flowable buffer layer. The slit die coater is configured to translate along the table in, for example, the x direction. A coating head on the slit die coater coats the wafer surface with the buffer layer 250 as it translates across the wafer. After coating, the wafer is heated to cure the buffer layer with the fillers.

Other techniques for forming the buffer layer on the wafer may also be useful. In one embodiment, the buffer layer may be formed by compression molding. For example, a liquid solution of the buffer layer (resin, additives, and fillers) is injected into a compression molding tool with a wafer. In other embodiments, the buffer layer may be laminated onto the wafer by vacuum type or roller type lamination. For example, the buffer layer may be pre-cut into a sheet. The sheet may be cut and laminated onto the wafer surface using vacuum type lamination. Alternatively, the pre-fabricated sheet may be rolled into a roller and laminated onto the wafer surface using roller type lamination. The sheet is pressed onto the wafer and cured, forming the buffer layer on the wafer.

The Young's Modulus and Breaking Strength have been found to be important in reducing cracking of the BEOL dielectric during dicing. The Young's Modulus corresponds to the ratio of stress and corresponding strain and is defined as follows:

Young's Modulus=stress/strain.

Figure 3A:
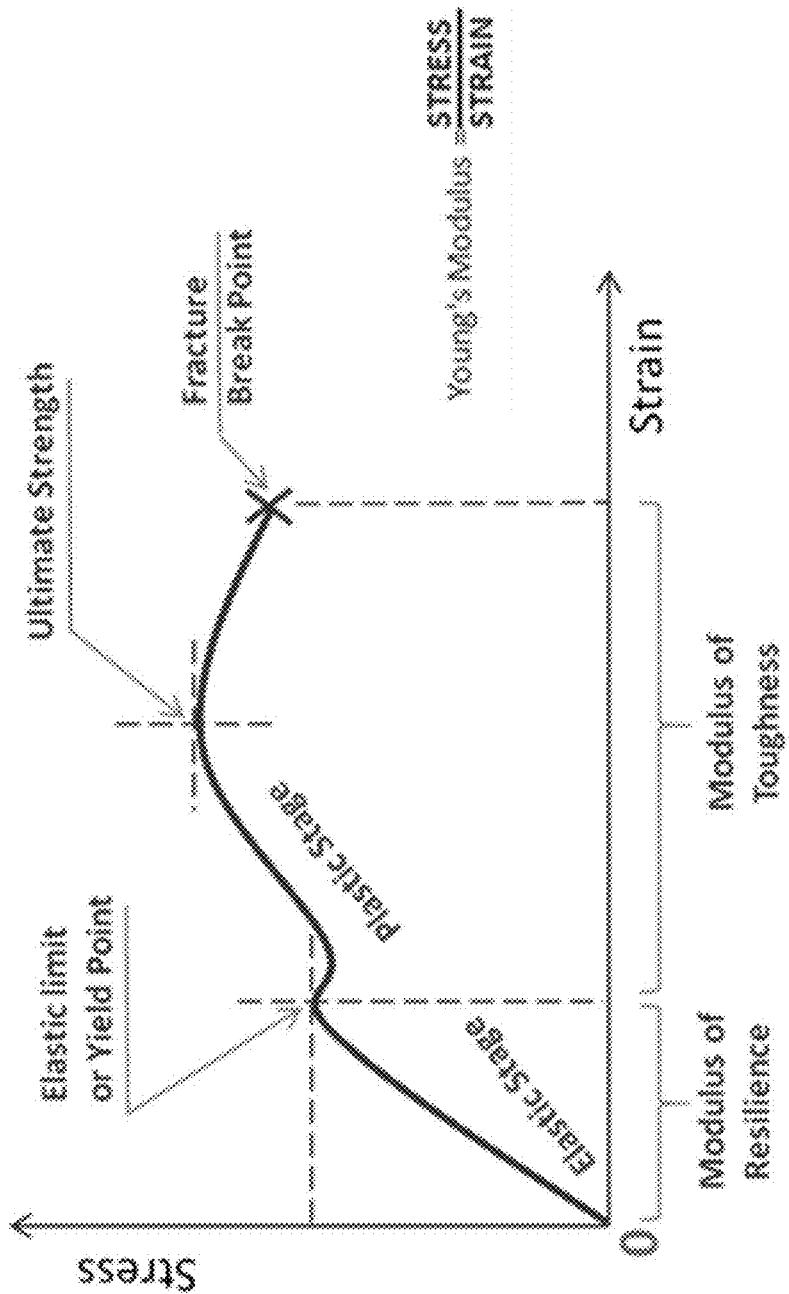
FIG. 3a shows a stress/strain curve.

FIG. 3a shows an example of a generic stress/strain curve 301 of any given material. The curve includes two portions. The first or initial portion represents a material's modulus of resilience; the second or final portion represents the material's modulus of toughness.

The modulus of resilience is the maximum amount of energy per unit volume that the material can absorb and still return to its original shape. This is the elastic stage of the material. For example, the initial part of a stress/strain curve describes the ability of a material to resist elastic deformation under load (strain). It indicates a material's propensity to retain its shape, even when it is deformed, such as being stretched, pulled, twisted, or compressed. The limit of the elastic stage is the yield point or elastic limit. The yield point represents the limit before the material stays permanently deformed if the application of force continues.

As for the modulus of toughness, it indicates the material's ability to absorb energy in plastic deformation. It is the amount of strain energy density that the material can absorb before it fractures. This is the plastic stage of the material. The plastic stage includes a strain hardening part, which is from the yield point to the ultimate strength point of the material, and a necking part, which continues from the ultimate strength point to the fracture point of the material.

A material's stress/strain curve 301 can be used to determine its characteristics. For example, stiffer material exhibits a steeper slope in the elastic stage, a brittle material lacks a plastic region, while a stronger material shows a higher ultimate tensile strength.

In one embodiment, we have found that the buffer layer, as described, having a Young's Modulus about 10,000-25,000 MPa, about 14,000-25,000 MPa, about 15,000-25,000 MPa, about 16,000-25,000 MPa, about 15,000-20,000 MPa or about 20,000-25,000 MPa is effective in preventing cracking from occurring on the brittle low-k BEOL dielectric during wafer singulation. In addition, the buffer layer may have a Breaking Strength of about 45-150 MPa, about 70-150 MPa, about 70-120 MPa, about 70-105 MPa, about 80-120 MPa or about 90-100 MPa. A coefficient of thermal expansion (CTE) of the buffer layer, for example, may be about 6-20 ppm/K. The buffer layer may have a temperature stability through the region −65-+300° C.

Not to be bound by any theory, it is believed that the buffer layer exhibits good tensile strength, elastic properties as well as stiffness. For example, the base buffer layer provides good elastic properties while the fillers provide stiffness and good tensile strength, resulting in a relatively high Breaking Strength, such as about 50-100 MPa, about 70-100 MPa or about 80-100 MPa.

Figure 3B:
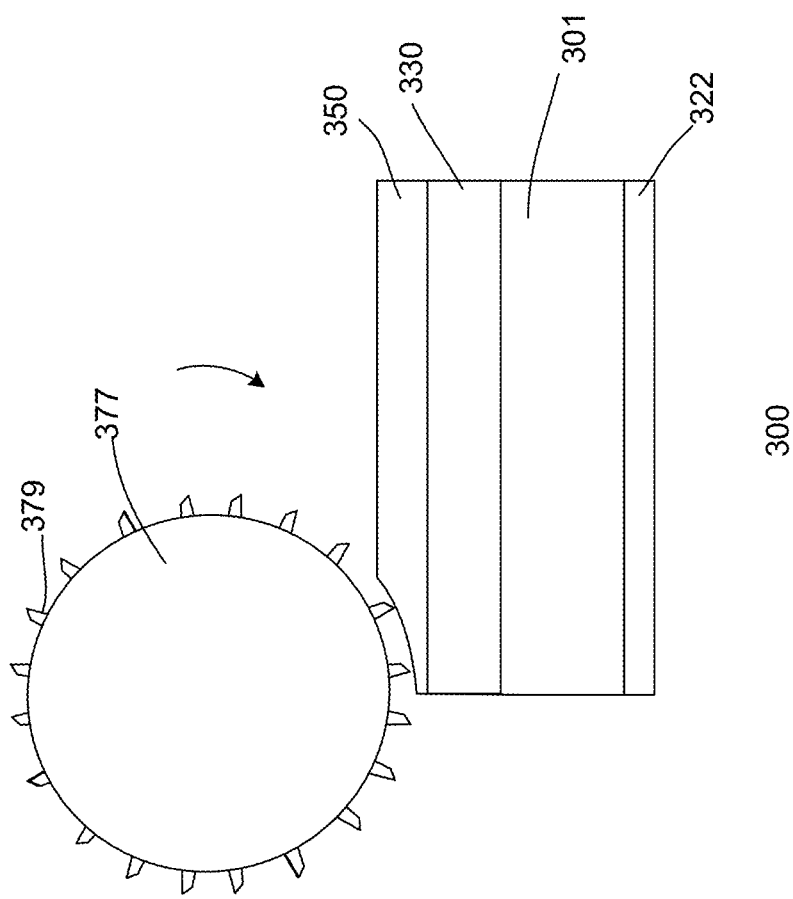

By providing the buffer layer over the low-k dielectric, the initial point of contact of the saw blade is the buffer layer and not the low-k BEOL dielectric. FIGS. 3b-3c show simplified side or cross-sectional views 300 of a wafer 301 illustrating this point. Referring to FIG. 3b, a wafer 301 having a low-k BEOL dielectric 330 is provided on a dicing tape 322. The top of the BEOL dielectric, for example, includes a passivation layer with openings to expose the die pads. (not shown). The passivation layer is removed from the saw streets to expose the BEOL dielectric. The buffer layer 350 is disposed over the wafer, for example, covering the BEOL dielectric, passivation layer, and contact pads. In particular, the buffer layer 350 covers the BEOL dielectric in the saw streets of the wafer.

As the rotating saw blade 377 with diamond grits 379 is lowered to dice the wafer, the saw blade's initial point of contact is the buffer layer. The force caused by the vibration of the rotating saw blade at the initial contact point of the wafer is absorbed by the buffer layer. This is unlike conventional dicing processes in which the brittle low-k dielectric is the initial point of contact, resulting in the formation of micro-cracks. By dampening the dicing vibration with the buffer layer, the formation of micro-cracks in the low-k BEOL dielectric is avoided. Not only does the buffer layer absorb the vibration, it also dissipates the vibration through the layer to prevent the formation of micro-cracks, as the saw blade continues to cut through the wafer, as shown, in FIG. 3c.

Figure 3D:
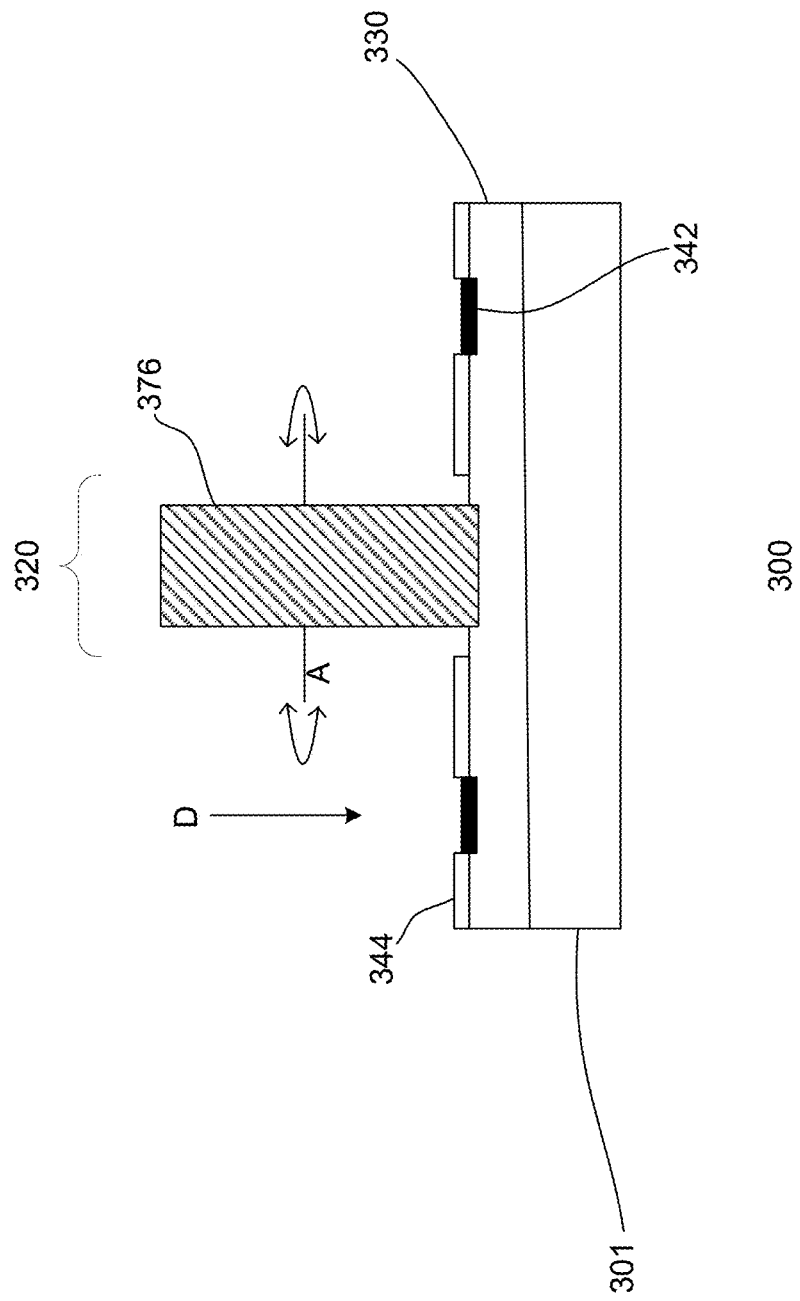
FIG. 3d shows a cross-section view of dicing a conventional wafer without the buffer layer perpendicular to the saw street.

To reduce the vibration of the saw blade during dicing, the buffer layer may be a saw blade guide during dicing. FIGS. 3d-3e show simplified cross-sectional views 300 of a wafer 301 across a saw street 320.

Referring to FIG. 3d, a conventional wafer is shown. For example, the wafer 301 is processed with circuit components and a low-k BEOL dielectric 330 thereover. The top of the BEOL dielectric, for example, includes a passivation layer 344 with openings to expose contact pads 342 below. The passivation layer is removed from the saw streets to expose the BEOL dielectric therein. As shown, during dicing, a rotating saw blade 376 is lowered onto the wafer, as indicated by arrow D. The saw blade rotates about an axis A. However, there may be some play or movement in the saw blade with respect to its axis of rotation, as indicated by the arrows. This play or movement, for example, results in excessive degrees of freedom for the saw blade, which causes vibration during sawing. As a result, the vibration causes micro-cracks in the low-k BEOL dielectric.

In contrast, FIG. 3e shows a wafer 301 having a composite buffer layer 350 disposed over the low-k BEOL dielectric 330. In addition to absorbing and dissipating the vibration from the saw blade 376 during dicing, the composite buffer layer 350 also be a saw blade guide. For example, as the saw blade is lowered, as indicated by arrow D, the composite buffer layer contains the saw blade, preventing it from having excessive degrees of freedom. For example, the degrees of freedom that the saw blade has are limited to the direction that the saw blade is lowered. This reduces vibration from the saw blade during dicing, which results in preventing the formation of micro-cracks in the low-k BEOL dielectric.

Figure 3F:
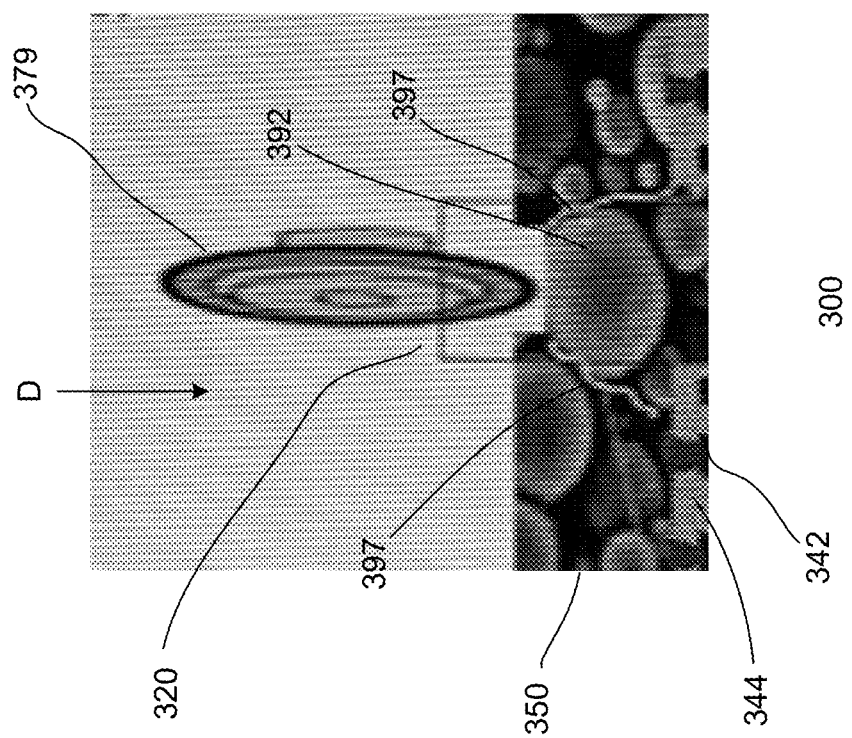
FIG. 3f illustrates the effect of dicing a wafer with a buffer layer having oversized fillers.

Another important aspect of the buffer layer 350 is the size of the fillers. FIG. 3f shows a cross-sectional view 300 of a wafer illustrating problems related to oversized fillers 392. As shown, a buffer layer 350 is formed on a wafer over the low-k BEOL dielectric, passivation layer 344 with openings exposing contact pads 342. The buffer layer 350, as shown, includes fillers 392 which exceeds the width of the saw blade 379 for dicing the wafer. As shown, the oversized fillers 392 are wider than the saw blade. The oversized fillers may be disposed in the buffer layer 350 along a saw street 320 of the wafer. As the rotating saw blade is lowered, as indicated by arrow D, onto the wafer, it contacts the oversized fillers. The fillers have higher tensile strength than the resin of the base buffer layer. When the saw blade contacts the oversized fillers, it causes excessive vibration, creating micro-cracks 397 in the base buffer layer, which extends into the passivation layer and low-k BEOL dielectric below. This significantly impacts the reliability of the device.

However, providing fillers from about 0.5 um to less than the width of the saw blade, such as ½ or ⅓ the width of the saw blade, this problem is avoided. When the saw blade contacts a filler, it can easily be removed as the saw blade cuts the base buffer layer. Also, the base buffer layer can absorb the vibration of the saw blade contacting the fillers. This avoids excessive vibration which prevents micro-cracking formation.

Figure 4A:
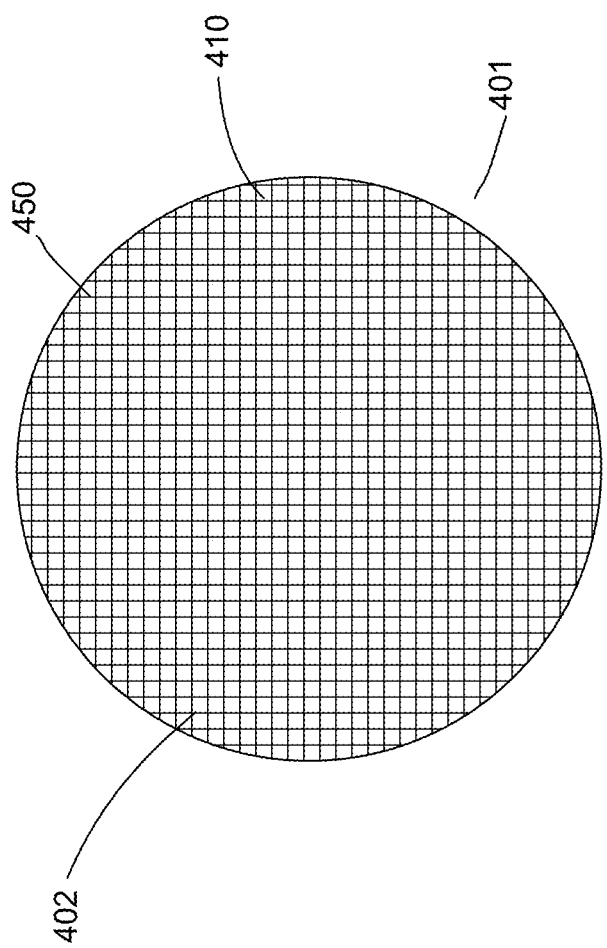
FIG. 4a shows a simplified top view of a processed semiconductor wafer.

FIG. 4a shows a simplified top view of an embodiment of a semiconductor wafer 401 with a buffer layer. The wafer may include a bare wafer. The bare wafer may be a lightly doped p-type silicon wafer. Other types of wafers may also be employed. For example, the wafer may be a silicon (Si), a silicon carbide (SiC) wafer, a gallium nitride (GaN) wafer, a gallium arsenide (GaAs) wafer, or an indium phosphide (InP) wafer. Other types of wafers may also be useful.

Devices 410 are formed on an active surface 402 of the wafer. For example, the active surface may be the top surface of the wafer while the inactive surface may be the bottom surface. The devices are arranged in rows along a first (x) direction and columns along a second (y) direction. A composite buffer layer is disposed on the surface of the wafer over the devices. After processing of the wafer is completed, the wafer is diced along the dicing lines 450 in the x and y directions to singulate the devices into individual dies.

Figure 4B:
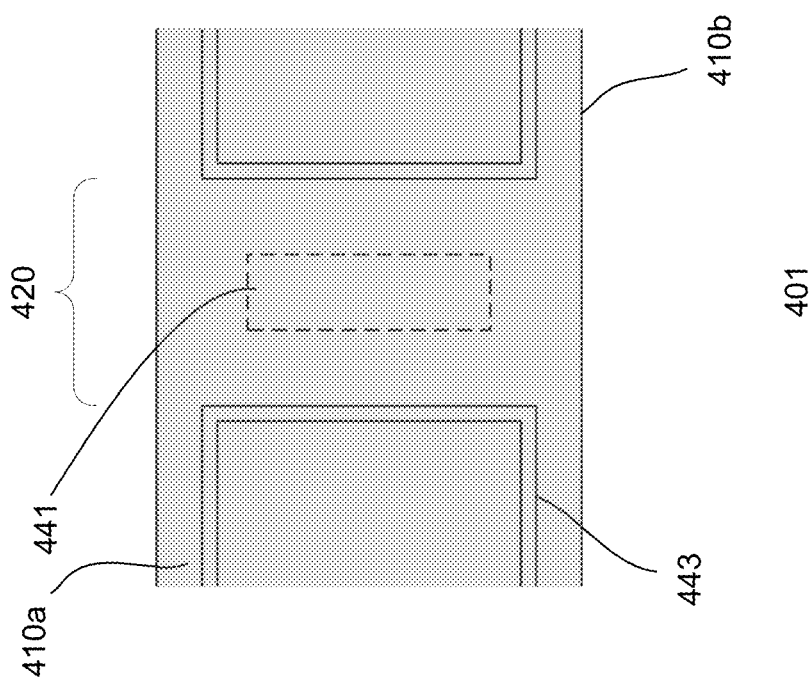
FIG. 4b shows a simplified top view of a portion of a wafer along a saw street between two dies.
Figure 4C:
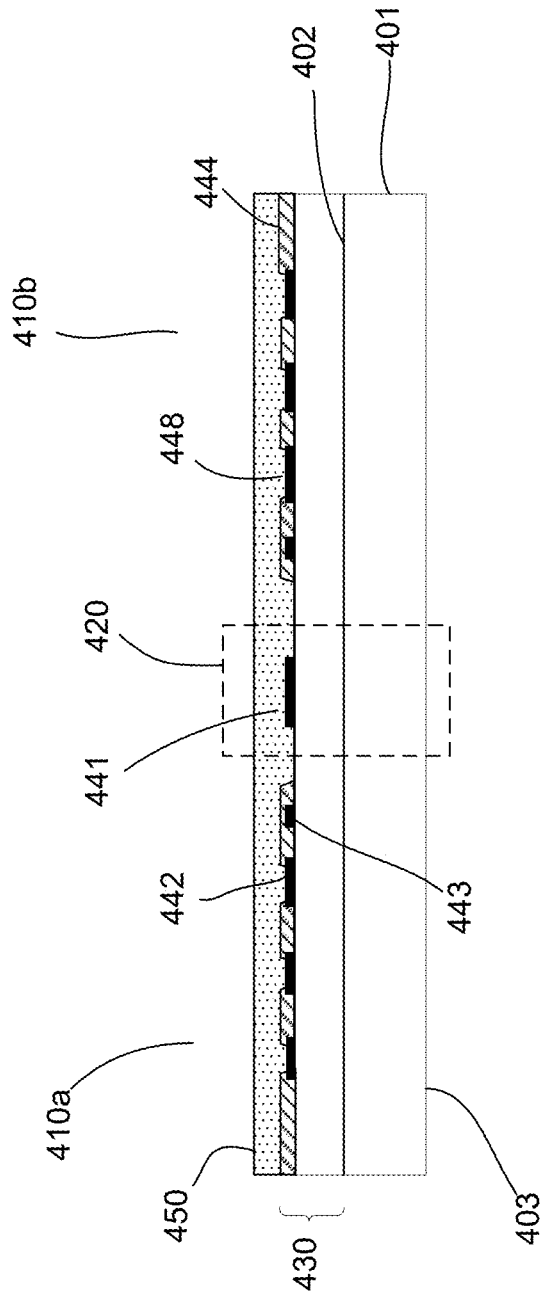
FIGS. 4c, 4e and 4g show simplified cross-sectional views of portions of various embodiments of processed wafers.
Figure 4D:
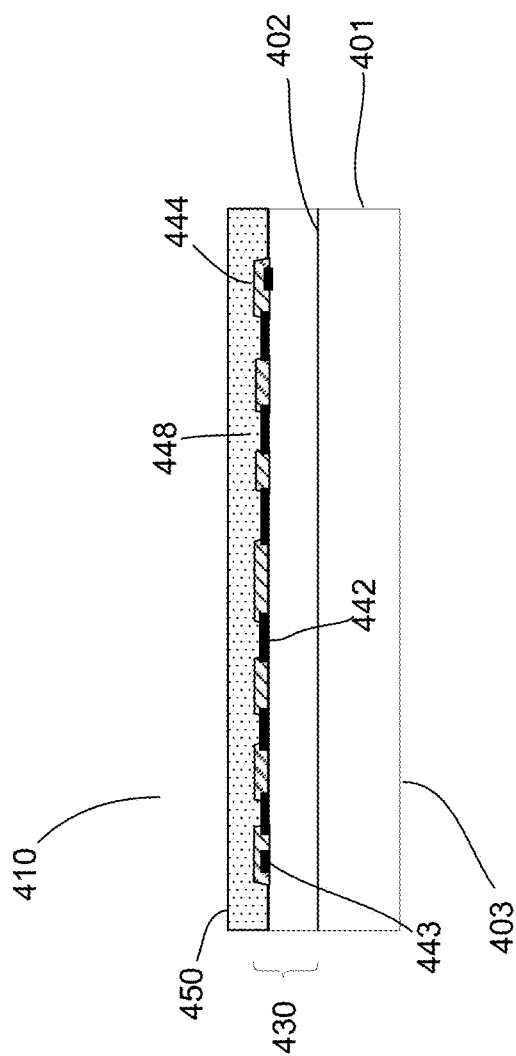
FIGS. 4d, 4f and 4h show simplified cross-sectional views of dies corresponding to wafers of FIGS. 4c, 4e and 4g.
Figure 4E:
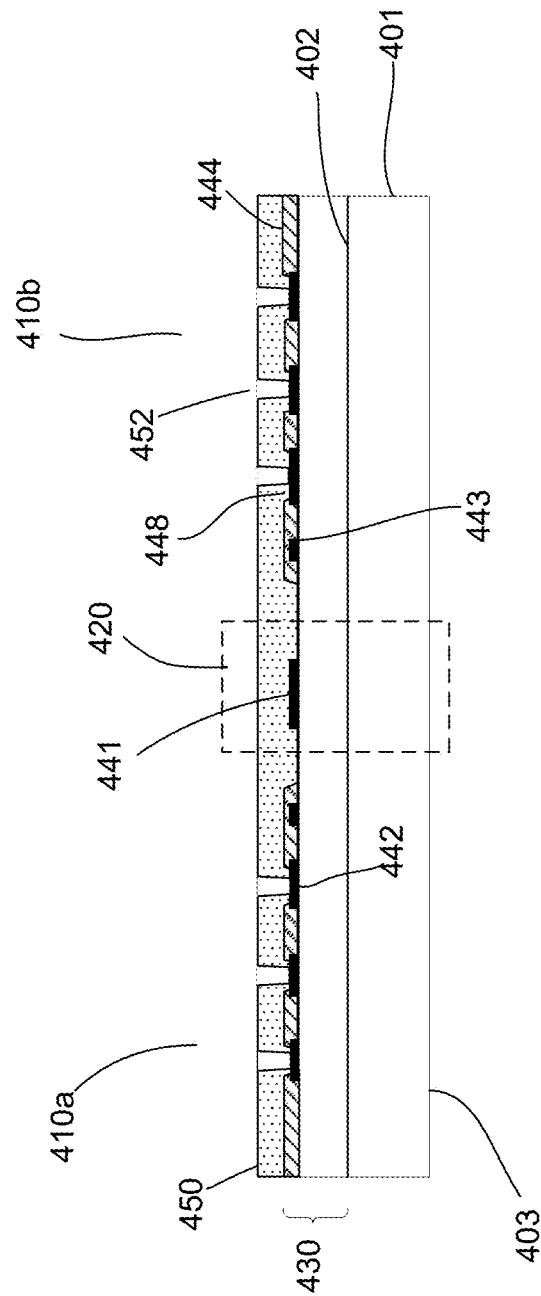
Figure 4F:
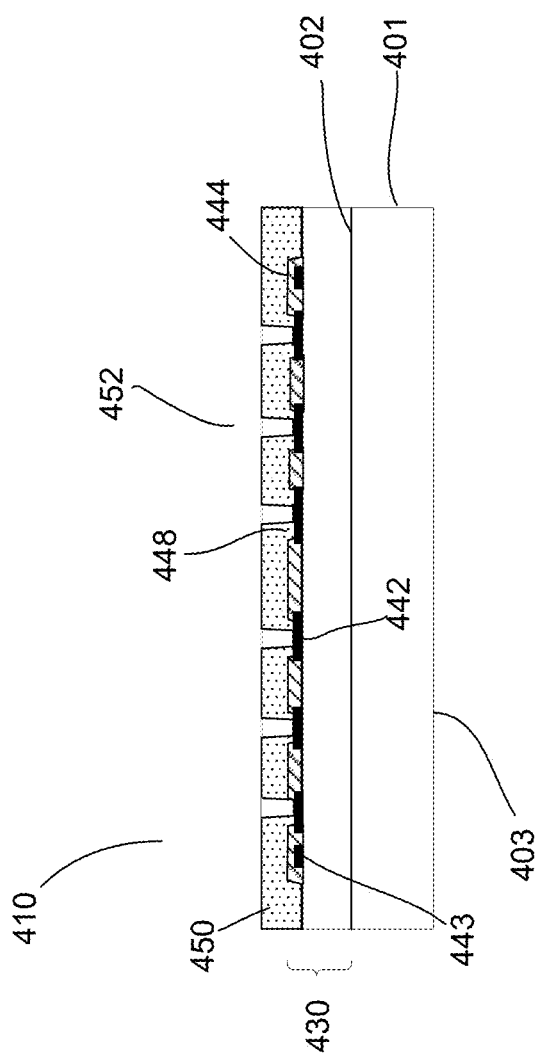
Figure 4G:
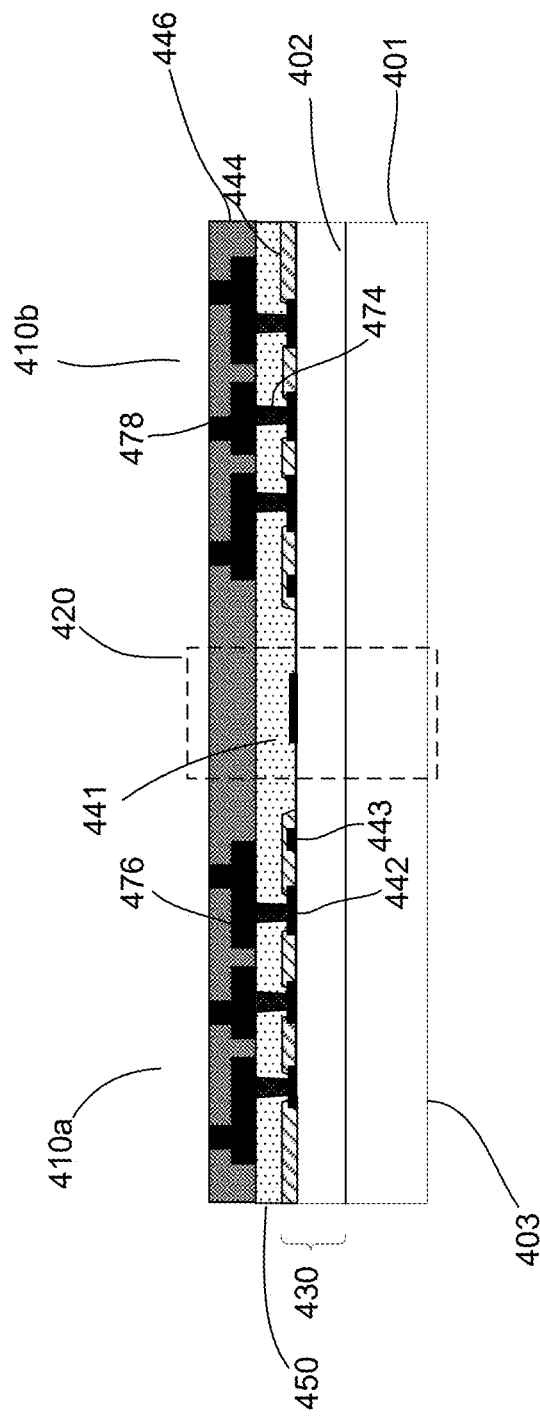
Figure 4H:
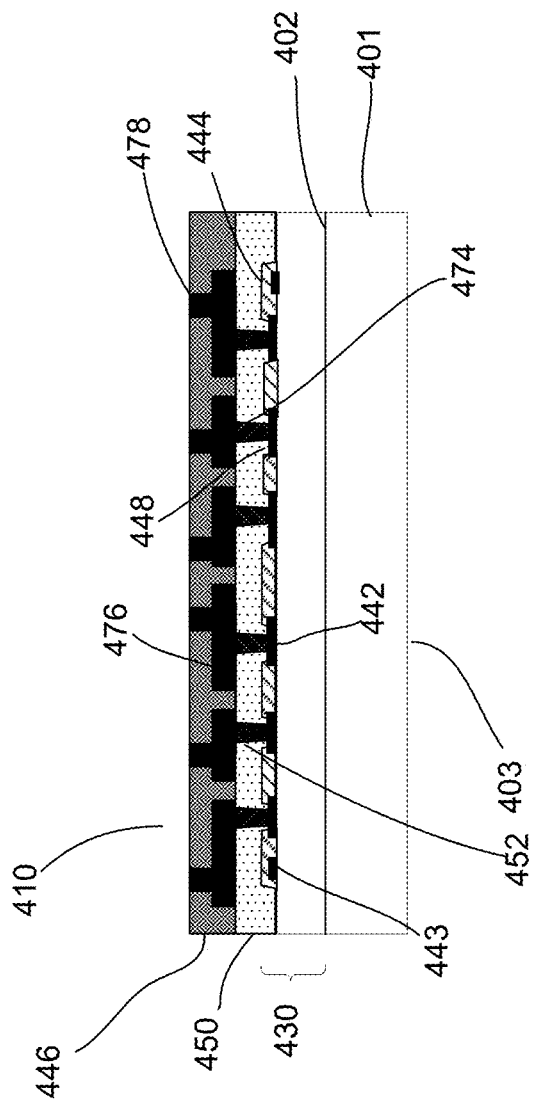

FIG. 4b shows a top view of a portion of a wafer 401 along a saw street 420 between two adjacent devices 410a-b. FIGS. 4c, 4e and 4g show simplified cross-sectional views of portions of various embodiments of processed wafers while FIGS. 4d, 4f and 4h show simplified cross-sectional views of dies corresponding to wafers of FIGS. 4c, 4e and 4g;

Referring to FIGS. 4b, 4c, 4e and 4g, the portion of the wafer includes portions of two adjacent devices 410a-b separated by a saw street or dicing channel 420. As shown, a bare wafer 401 having an active surface 402 and inactive surface 403 is provided. The active and inactive surfaces are opposing surfaces. The wafer, for example, is a semiconductor wafer, such as a silicon wafer. Other types of wafers, such as silicon carbide (SiC), gallium nitride (GaN), gallium arsenide (GaAs), or indium phosphide (InP).

Circuit components (not shown) of the devices are formed on the active surface 402 of the wafer. The circuit components may include active and inactive circuit components. The active components may include, for example, transistors, diodes, and triodes, while the passive components include voltage elements, capacitors, resistors, and inductors. Other types of active and passive components may also be included. The circuit components may be formed using front-end-of-line (FEOL) processing. For example, the circuit components may be formed by using a series of processes such as doping (e.g., implantation or diffusion), deposition (e.g., oxidation, chemical vapor deposition (CVD), plating, and sputtering), and patterning (e.g., lithography and etching). Other techniques may also be employed to form the circuit components.

A back-end-of-line (BEOL) dielectric 430 with interconnects (not shown) is formed on the active surface of the wafer. For example, the BEOL dielectric may cover the circuit components of the devices and the saw street, with interconnects which are configured to interconnect the circuit components and provide external access. The BEOL dielectric may include multiple interconnect levels. For example, metal lines coupled to via contacts may be provided in different BEOL dielectric layers or levels. The BEOL dielectric layers may include low-k dielectrics, ultra low-k dielectrics, as well as GaN and germanium (Ge) coated materials. The conductive lines and via contacts may be formed of copper (Cu) or an alloy thereof (copper alloy) and formed by damascene techniques, such as dual or single damascene techniques. Other techniques, such as reactive ion etching (RIE), as well as other types of conductive materials may also be employed to form the conductive lines and contacts. With respect to the first contact level in which contacts are formed to connect to the circuit components, they may be tungsten contacts.

A top interconnect level may be a pad level with die contact pads 442 for providing external connections. The contact pads or die pads, for example, are aluminum (Al) pads. Other types of contact pads may also be useful. For example, the contact pads may be copper (Cu), nickel (Ni), palladium (Pd), gold (Au), chromium (Cr), as well as Al or alloys thereof, such as Al—Cu. The pad level may include a die seal ring 443. The die seal ring, for example, surrounds the active die region. The die seal ring separates the saw streets from the active region of a die.

A passivation layer 444 may be provided. The passivation layer 444, for example, may be disposed on the top of the BEOL dielectric. The passivation layer may be a passivation stack. The passivation stack may include a combination of dielectric layers, such as silicon oxide and silicon nitride layers. Other types of dielectric layers may also be useful. The passivation layer covers the contact pads and die seal ring. As shown, the passivation layer 444 includes the pad openings 448 to expose the contact pads. The pad openings, in one embodiment, are patterned using masking and etching processes. For example, an anisotropic etch, such as a reactive ion etch (RIE) etches the passivation layer with a patterned photoresist mask to form the pad openings. As such, the pad openings of the passivation layer include anisotropically etched sidewalls, such as plasma or dry anisotropic etched sidewalls. Other techniques for forming the pad openings, such as using an isotropic etch (wet or dry) or laser drilling, may also be useful. The different techniques may result in differently shaped sidewall profiles. For example, anisotropically etched sidewalls, wet isotropically etched sidewalls, wet isotropically etched sidewalls, and laser-etched sidewalls have different profiles.

In one embodiment, the passivation layer 444 includes saw street openings in the saw streets between adjacent rows and columns of devices. The saw street openings may be formed in the same process as forming the pad openings. Alternatively, the saw street openings may be formed in a separate process. The saw street openings expose the low-k dielectric in the saw streets of the wafer. As shown, the saw street may include dummy metal structures 441. The dummy metal structures reduce cracking from dicing the wafer. The width of the dummy metal structures 441 may be narrower or wider than the saw blade width.

The wafer prepared with circuit components, a BEOL dielectric, and a passivation layer with pad openings to expose the contact pads as well as saw street openings may be referred to as a processed wafer. The processed wafer, for example, may be an incoming processed wafer from an external supplier. For example, a packaging vendor may receive the processed wafer. In some cases, the incoming processed wafer may be an internally processed wafer instead of from an external customer. The processed wafer may be further processed. For example, the processed wafer may be subjected to further processing.

In one embodiment, the further processing includes forming a composite buffer layer 450 on the wafer. The composite buffer layer, for example, is disposed on the processed or incoming wafer. As shown, the composite buffer layer is disposed on the top of the BEOL dielectric with contact pads 442 and a patterned passivation layer 444 with pad openings 448 to expose the contact pads and the saw streets 420. In other embodiments, the processed wafer may not have or include the passivation layer. In such cases, the composite buffer layer may be the passivation layer.

As discussed, the composite buffer layer 450 prevents cracking and chipping in the BEOL dielectric during dicing. The buffer layer 450 has a Young's Modulus and Breaking Strength to prevent cracking and chipping in the BEOL dielectric during dicing. In one embodiment, the Young's Modulus is about 10,000-25,000 MPa. In other embodiments, the Young's Modulus is about 14,000-25,000 MPa. In yet other embodiments, the Young's Modulus is about 15,000-25,000 MPa. In another embodiment, the Young's Modulus is about 16,000-25,000 MPa. In another embodiment, the Young's Modulus is about 15,000-20,000. In other embodiments, the Young's Modulus is about 20,000-25,000 MPa.

In one embodiment, the Breaking Strength of the buffer layer is about 45-150 MPa. In other embodiments, the Breaking Strength is about 70-150 MPa. In another embodiment, the Breaking Strength is about 70-120 MPa. In another embodiment, the Breaking Strength is about 70-105 MPa. In another embodiment, the Breaking Strength of the buffer layer is about 80-120 MPa. In yet another embodiment, the Breaking Strength of the buffer layer is about 90-120 MPa. The CTE of the buffer layer, for example, may be about 6-20 ppm/K. The buffer layer has temperature stability through the region −65-+300° C.

The thickness of the buffer layer may be about 10-100 um, 15-100 um, 20-100 um, 25-100 um, 45-100 um or 60-100 um. The tolerance of the buffer layer may be ±1-5 um, depending on the thickness of the buffer layer. Providing buffer layers having other thicknesses may also be useful.

In one embodiment, the composite buffer layer 450 includes a base buffer layer with fillers or granules. The base buffer layer, in one embodiment, is a transparent base buffer layer, such as a transparent polymeric base buffer layer. Various types of polymers may be used for the base buffer layer. The polymeric base buffer may be a thermosetting plastic or a thermoplastic, such as polyimide or resins. In one embodiment, the base buffer layer includes a resin, such as epoxy or cyanate esters. Preferably, the base buffer layer is a low viscosity resin, such as a biphenyl epoxy resin.

The fillers may be organic-based, inorganic-based, or a combination thereof. For example, fillers may include silica ($SiO_2$) fillers, amorphous aluminum oxide ($\alpha$-$Al_2O_3$) fillers, or a combination thereof. Other types of non-conductive fillers may also be useful. For example, the fillers may be silica, glass beads, sand, or a combination thereof. The fillers, for example, may be spherical-shaped fillers. Other shaped fillers may also be useful.

The fillers may be non-uniformly sized fillers. For example, the fillers of the base buffer layer have different diameters. The fillers of the base buffer layer may also have different shapes. Providing fillers having different sizes enables the buffer layer to contain a higher density of fillers. For example, smaller sized fillers are nested in the spaces between larger sized fillers, enabling a higher filler loading for the buffer layer.

The sizes of the fillers may depend on the width of the saw blade used in dicing the wafer. In one embodiment, the sizes of the fillers are less than the width of the saw blade used in dicing. For example, the sizes of the fillers may be less than or equal to about ½ or about ⅓ of the width of the saw blade used in dicing. In one embodiment, the sizes of the fillers may be about 0.5 um to −⅓ of the width of the saw blade used in dicing the wafer. The width of a saw blade is typically about 30-36 um. For example, in the case of a 36 um wide saw blade, the sizes of the fillers may be about 0.5-10 um or about 0.5-12 um in the case of a 30 um wide saw blade.

In one embodiment, the concentration of the fillers in the base buffer layer is selected to tune the Young's Modulus of the buffer layer to about 10,000-25,000 MPa, about 14,000-25,000 MPa, about 15,000-25,000 MPa, about 16,000-25,000 MPa, about 15,000-20,000 MPa or about 20,000-25,000 MPa and the Breaking Strength to about 45-150 MPa, about 70-150 MPa, about 70-120 MPa, about 70-105 MPa, about 80-120 MPa or about 90-100 MPa. In one embodiment, the concentration of fillers in the composite buffer layer is from about 70-90 wt % based on the total weight of the composite buffer layer. In another embodiment, the concentration of fillers in the composite buffer layer is from about 80-90 wt %.

To form the buffer layer, the components may be combined together in a flowable form and applied onto the wafer. For example, a liquid, which includes the epoxy resin and additives (hardener), is combined or mixed with fillers (granules). The liquid mixture with fillers is applied onto the wafer. After application, the wafer is cured to harden the buffer layer with fillers. Such techniques, for example, may include spin-coating onto the wafer or slit die or printing onto the wafer. Other techniques for forming the buffer layer on the wafer may also be useful. For example, compression molding or lamination, such as vacuum type or roller type lamination, may also be employed to form the composite buffer layer on the processed wafer.

As shown in FIG. 4c, processing of the wafer at the wafer-level is completed. The wafer is then sawed to singulate the wafer into individual dies 410, as shown in FIG. 4d.

As shown, the passivation layer includes pad openings to expose the bond pads. Alternatively, the passivation layer does not include pad openings. In yet other embodiments, as discussed, no passivation layer is provided.

In some embodiments, as shown in FIG. 4e, the buffer layer 450 is patterned to form via openings 452 to expose the contact pads 442 before the wafer is subjected to the wafer singulation process. The via openings may be configured with a slanted or tapered sidewall profile. In one embodiment, the via openings are configured such that a ratio of the bottom surface area of the via openings and the top surface area of the via openings is about 60-90%. Other ratios, such as about 70-80% may also be useful. The via openings, as shown, are smaller than the contact pads. In one embodiment, the bottom of the via openings is smaller than the pad openings in the passivation layer. In a preferred embodiment, the bottom of the via openings is positioned to be at about or as close as possible to a central portion of the contact pads. Other configurations of the via openings may also be useful.

In one embodiment, the via openings are formed using a laser etching process. For example, the via openings of the buffer layer have laser-etched sidewalls. Other processes for forming the via openings may also be useful. In a preferred embodiment, the etch process to form the via openings is configured to prevent damage to the contact pads. In one embodiment, the via openings of the buffer layer are formed with a multi-etch process to prevent damage to the contact pads. In one embodiment, the etch process includes a high power laser etch process for forming an upper portion of the via openings and an RIE or inductively coupled plasma-RIE (ICP-RIE) process is used to form a lower portion of the via openings. In another embodiment, the high power laser etch process is used to form an upper portion of the via openings and a low power laser etch process is used to form the lower portion of the via openings. The etch process or processes for forming the via openings may be masked or maskless.

Other configurations of etch processes, such as other numbers of etch steps or a combination of masked or maskless etches, for forming the via openings may also be useful.

Alternatively, in the case that the passivation layer does not include pad openings, the via openings are formed followed by etching the passivation layer to expose the contact pads. In other cases, no passivation layer is provided. As such, the via openings expose the contact pads.

In one embodiment, as shown in FIG. 4e, processing of the wafer at the wafer-level is complete. The wafer is then sawed to singulate the wafer into individual dies 410, as shown in FIG. 4f.

In another embodiment, the further processing of the wafer continues after forming the via openings in the composite buffer layer 450, as shown in FIG. 4g. The wafer is processed with a redistribution layer (RDL) structure. The RDL structure, for example, is formed at the wafer-level. In one embodiment, the RDL structure includes conductive via contacts 474 (RDL via contacts), patterned conductive lines 476 (RDL lines), and studs (RDL studs) 478 on the buffer layer 450. The RDL lines 476 may have a thickness of about 10-100 um while the RDL studs 478 may be about 15-100 um. Other thicknesses may also be useful. As for the RDL via contacts, they may have a height equal to about the thickness of the passivation layer.

The RDL via contacts and RDL lines may be formed in a single process. For example, a conductive layer, such as Cu or Cu-alloy, may be formed on the buffer layer. In one embodiment, the conductive layer may be formed by plating. In such cases, a seed layer (not shown) may line the composite buffer layer, including the via openings. The seed layer may be formed by sputtering. A plating mask (not shown), such as a patterned dry film photoresist laminated on the composite buffer layer with the seed layer, is used to plate a conductive layer. The photoresist is patterned by laser direct imaging (LDI). The patterned photoresist layer includes openings corresponding to the RDL lines, including the via openings. A plating process forms a conductive layer, such as Cu or Cu-alloy, which fills the mask openings, including the via openings, to form RDL lines 476 coupled to the contact pads by RDL via contacts 474 in the via openings. The plating process stops slightly below the height of the patterned photoresist layer. Another dry film photoresist is laminated on the RDL lines 476 and resist mask. The photoresist is patterned by, for example, LDI, to form stud openings over the RDL lines where RDL studs are to be formed. For example, the patterned resist layer may be a plating mask for selectively forming the RDL studs on the RDL lines 476. A plating process is employed to form the RDL studs 478 in the stud openings followed by removal of the resist films. Other techniques for forming the RDL structure may also be useful.

An RDL encapsulation layer 446 is disposed over the buffer layer with the RDL structure. The RDL encapsulation layer, for example, is a wafer-level RDL encapsulation layer. The RDL encapsulation layer, in one embodiment, is an RDL composite encapsulation layer. The RDL composite encapsulation layer may be similar to the composite buffer layer 450. For example, the RDL composite encapsulation layer includes a base RDL encapsulation layer containing fillers or granules.

The RDL encapsulation layer 446, for example, may be preformed into an encapsulation sheet and laminated onto the buffer layer, such as by compression molding or vacuum lamination. Other techniques for forming the RDL encapsulation layer may also be useful. The laminated RDL encapsulation layer covers the buffer layer and RDL structure. A grinding process removes the excess encapsulation material to expose the RDL studs. For example, the grinding process results in a coplanar surface between the RDL studs and the RDL encapsulation layer. In one embodiment, the coplanar surface may be referred to as the first encapsulation layer surface while the opposing surface contacting the buffer layer may be referred to as the second encapsulation layer surface.

In one embodiment, as shown in FIG. 4g, further processing of the wafer at the wafer-level is complete. For example, postprocessing of the wafer is complete after forming the RDL structure with the RDL encapsulation layer. The wafer is then sawed to singulate the wafer into individual dies 410, as shown in FIG. 4h. In some embodiments, package contacts (not shown) may be formed prior to singulating the wafer into individual dies.

Optionally, prior to the singulation process, the inactive wafer surface 403 may be provided with an inactive or backside wafer surface protection layer (not shown). For example, a wafer backside protection layer is formed on the inactive or backside wafer surface. The backside protection layer, in a preferred embodiment, is similar to the composite buffer layer 450. For example, the backside protection layer is a composite backside protection layer. The backside protection layer prevents chipping of the wafer on the backside of the wafer during the singulation process. Other types of backside protection layers may also be useful. After forming the backside protection layer, the wafer is singulated into the individual dies 410.

Figure 5A:
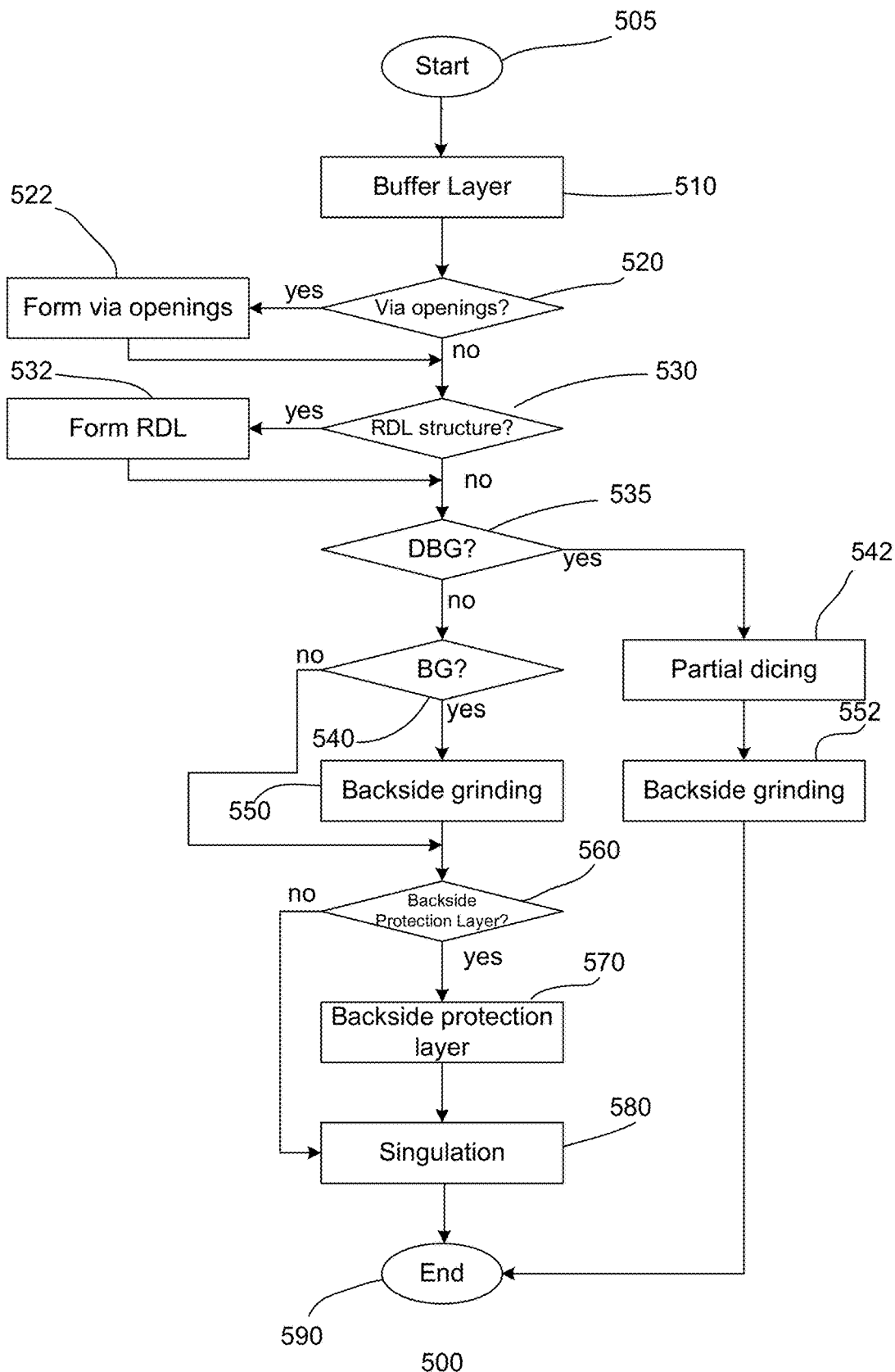
FIGS. 5a-5c show various process flows for processing a wafer.

FIG. 5a shows a simplified embodiment of a general process flow 500 for processing a wafer, such as an incoming or a processed wafer. The incoming wafer, for example, is similar to the incoming wafer 401 as described in FIGS. 4a and 4b. The general process takes into account of various options, including forming fan-in or fan-out packages, performing backside grinding or dice before backside grinding as well as forming a backside protection layer for processing a wafer.

At 505, the process commences. For example, the process for processing the incoming wafer commences. The processed wafer, for example, may be an incoming processed wafer from an external supplier.

The wafer, for example, includes circuit components of the devices formed on an active or top surface thereof. In one embodiment, the BEOL dielectric with interconnects is formed on the active surface of the wafer, covering the circuit components of the devices and the saw street. The interconnects of the BEOL dielectric interconnect the circuit components and provide external access. The BEOL dielectric may include multiple interconnect levels. For example, the metal lines coupled to the via contacts may be provided in different BEOL dielectric layers or levels. The BEOL dielectric layers may include low-k dielectric layers. An uppermost interconnect level may be a pad level with contact pads to provide external connections. The pad level, for example, may be the top of the BEOL. In one embodiment, a passivation layer may be provided over the pad level, with pad openings to expose the contact pads. Alternatively, the incoming or processed wafer may not include a passivation layer or a passivation layer without pad openings.

At 510, the process forms the buffer layer on the wafer. In one embodiment, the process forms the composite buffer layer on the active wafer surface. For example, the composite buffer layer is formed on the wafer, covering the contact pads and passivation layer. In some embodiments, the composite buffer layer is formed over the contact pads without a passivation layer.

In one embodiment, the composite buffer layer includes a base buffer layer containing fillers or granules. For example, the base buffer layer may be a transparent polymeric base buffer layer while the fillers may be organic, inorganic, or a combination thereof. The size of the fillers, for example, may be about 0.5-12 um or about 0.5-10 um.

The sizes of the fillers may depend on the width of the saw blade used in dicing the wafer. In one embodiment, the sizes of the fillers are less than the width of the saw blade used in dicing. For example, the sizes of the fillers may be less than or equal to about ½ or about ⅓ of the width of the saw blade used in dicing. In one embodiment, the sizes of the fillers may be about 0.5 um to ~⅓ of the width of the saw blade used in dicing the wafer. The width of a saw blade is typically about 30-36 um. For example, in the case of a 36 um wide saw blade, the sizes of the fillers may be about 0.5-10 um or about 0.5-12 um in the case of a 30 um wide saw blade. In one embodiment, the concentration of fillers in the composite buffer layer is from about 70-90 wt % based on the total weight of the buffer layer. In another embodiment, the concentration of fillers in the composite buffer layer is from about 80-90 wt %.

As discussed, the composite buffer layer prevents or reduces cracking and chipping in the BEOL dielectric during dicing. The composite buffer layer, in one embodiment, has a Young's Modulus and Breaking Strength to prevent cracking and chipping in the BEOL dielectric during dicing. In one embodiment, the Young's Modulus of the buffer layer is about 10,000-25,000 MPa, about 14,000-25,000 MPa, about 15,000-25,000 MPa, about 16,000-25,000 MPa, about 15,000-20,000 MPa or about 20,000-25,000 MPa and the Breaking Strength to about 45-150 MPa, about 70-150 MPa, about 70-120 MPa, about 70-105 MPa, about 80-120 MPa or about 90-100 MPa. The CTE of the buffer layer, for example, may be about 6-20 ppm/K. The buffer layer has temperature stability through the region −65-+300° C. The thickness of the buffer layer may be about 10-100 um, 15-100 um, 20-100 um, 25-100 um, 45-100 um or 60-100 um. The tolerance of the buffer layer may be ±1-5 um, depending on the thickness of the buffer layer. Providing buffer layers having other thicknesses may also be useful.

The composite buffer layer may be formed by compression molding or lamination, such as vacuum type or roller type lamination. Other techniques for forming the composite buffer layer may also be useful. For example, the composite buffer layer may be formed by spin-coating, slit die or printing, or other types of printing techniques.

At 520, the process determines if via openings are to be formed on the buffer layer. If via openings are not to be formed, the process continues to 530. On the other hand, if via openings are to be formed, the process continues to 522. At 522, via openings are formed in the buffer layer to expose contact pads of the incoming wafer. The via openings, for example, include tapered sidewalls. Various techniques may be employed to form the via openings. For example, a laser etch process or mask and etch process may be employed to form the via openings. In some embodiments, the multi-etch process may be employed to prevent damage to the contact pads. Other techniques for forming the via openings may also be useful. As discussed, the via openings may be formed with a passivation layer with or without pad openings or without a passivation layer.

After via openings are formed, the process proceeds to 530. At 530, the process determines if an RDL structure is formed for each die of the wafer. If no RDL structure is to be formed, the process continues to 535. If the RDL structure is to be formed, the process continues to 532.

In one embodiment, the RDL structure is for a fan-in package with no mold encapsulation. To form the RDL structure, in one embodiment, a seed layer may be formed on the wafer surface. For example, a seed layer lines the surface of the composite buffer layer with via openings. The seed layer, for example, is a Ti—Cu seed layer formed by sputtering.

In one embodiment, a plating mask is formed on the buffer layer with the seed layer. For example, a dry film photoresist is laminated onto the buffer layer with via openings. The photoresist is patterned by LDI to form a patterned resist film may be a plating mask. For example, the patterned resist film includes openings corresponding to RDL lines with the via openings. A plating process is performed to fill the mask openings and via openings in the buffer layer, forming RDL lines coupled to the contact pads by the RDL via contacts. Other techniques for forming the RDL lines may also be useful.

After forming the RDL lines, a dry film photoresist is laminated on the RDL lines and the plating mask. The dry film photoresist is patterned to form stud openings over the RDL lines where RDL studs are to be formed. For example, the patterned photoresist may be a plating mask for selectively forming the RDL studs on the RDL lines. A plating process is employed to form the RDL studs in the stud openings. Other processes for forming the RDL studs may also be useful. The dry photoresist films used to form the RDL lines and RDL studs are removed.

An RDL encapsulation layer is disposed over the buffer layer with the RDL structure. The RDL encapsulation layer covers the RDL lines and RDL studs as well as filling the gaps therebetween. The RDL encapsulation layer, for example, is a dielectric layer which is similar to the composite buffer layer. For example, the RDL encapsulation layer includes a base RDL encapsulation layer with fillers. In one embodiment, the RDL encapsulation layer is laminated onto the wafer surface. Other techniques for forming the RDL encapsulation layer may also be useful. The wafer surface is grinded to remove excess RDL encapsulation material to expose the surface of the RDL studs. This results in a coplanar surface with the RDL studs and the RDL encapsulation layer.

In one embodiment, package contacts are formed. The package contacts, in one embodiment, are formed on the RDL studs. The package contacts include solder or package bumps. The package bumps may be formed by solder bump technology (SBT). SBT, for example, may include solder drop and reflow to form the solder balls. The solder bumps, for example, may be employed for ball grid array (BGA) packages. Other types of package contacts, such as for LGA and QFN packages, may also be useful. For example, the package contacts may be metal-plated contacts, such as tin-plated contacts. Plated contacts can be formed on the studs by, for example, a matt plating process. Other plating processes, such as ENIG and NiAu plating, may also be useful. The process proceeds to 535.

At 535, the process determines if dicing before grinding (DBG) is performed. If DBG is not performed, the process continues to 540. If DBG is performed, the process continues to 542 to commence DBG. At 542, the wafer is partially diced. In one embodiment, the wafer is diced along the dicing lines to a depth equal to about the final thickness of the singulated dies. In some instances, the depth is slightly deeper than the final thickness of the singulated dies to account for process variations. This may be about 10-30% or 10-20% greater than the final thickness of the singulated dies. For example, in the case that the final thickness of the dies is about 80 um, the partial cut may be about 100 um. Other depths may also be useful for the partial dicing.

After partially dicing the wafer, the process moves on to 552 for backside wafer grinding. For example, the backside of the wafer is grinded to thin the wafer to the final die thickness. The grinding process singulates the wafer into individual dies. After singulation, the process terminates at 590.

As discussed, if DBG is not performed, the process proceeds to 540. At 540, the process determines whether or not to perform backside wafer grinding. If no backside wafer grinding is to be performed, the process proceeds to 560. If backside wafer grinding is to be performed, the process proceeds to 550. At 550, the backside of the wafer is grinded. Backside grinding, for example, is performed to reduce the thickness of the wafer. The amount of wafer removed results in a wafer having the final wafer thickness. The final thickness of the wafer, for example, may be equal to about the final thickness of the dies. The final thickness of the dies, for example, does not take into consideration of a backside protection layer which may be subsequently formed on the backside of the wafer. After backside grinding is completed, the process continues to 560.

At 560, the process determines whether or not to apply a backside protection layer on the backside of the wafer (e.g., inactive wafer surface). If no backside protection layer is to be formed, the process proceeds to 580. On the other hand, if a backside protection layer is to be formed, the process proceeds to 570. At 570, a backside protection layer is formed on the inactive wafer surface. The backside protection layer, for example, is the same or similar to the composite buffer layer formed at 510. The backside protection layer may include a backside base protection layer with fillers formed by lamination. The process proceeds to 580 for wafer dicing. After dicing to singulate the wafer into the individual dies, the process terminates at 590.

Figure 5B:
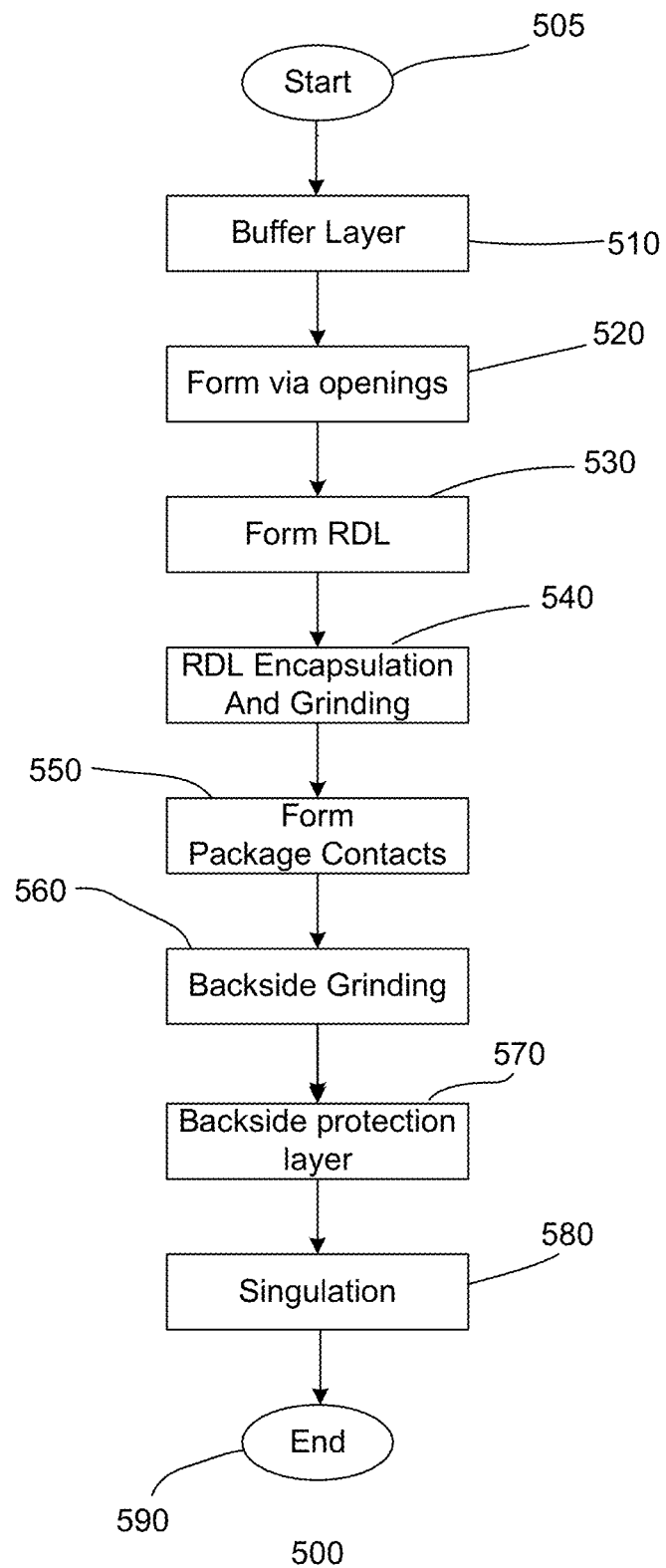

FIG. 5b shows an embodiment of a process flow 500 for processing a wafer, such as an incoming or processed wafer, to form fan-in packages without a molding layer. For example, the process flow is employed to form BGA packages. At 505, the process commences. For example, the process for processing an incoming wafer commences. The processed wafer, for example, may be an incoming processed wafer from an external supplier.

The wafer, for example, includes an active surface with contact pads. In some embodiment, a passivation layer may be provided with pad openings to expose the contact pads. At 510, the process forms the composite buffer layer on the active surface of the wafer. For example, the composite buffer layer is formed on the wafer, covering the contact pads or covering the top of the BEOL dielectric, contact pads, and passivation layer. The composite buffer layer includes a base buffer layer containing fillers or granules. The composite buffer layer prevents cracking and chipping in the BEOL dielectric during dicing. The composite buffer layer may be formed by compression molding or lamination. Other techniques for forming the composite buffer layer may also be useful.

At 520, the process forms via openings in the buffer layer to expose contact pads of the incoming wafer. The via openings, for example, include tapered sidewalls. In one embodiment, the via openings are formed by laser etching. Other techniques for forming the via openings may also be useful.

After via openings are formed, the process proceeds to 530. At 530, the process forms an RDL structure on the buffer layer. The RDL structure may be formed as previously described. For example, the RDL structure which includes RDL via contacts, RDL lines and RDL studs may be formed as previously described. Other techniques for forming the RDL structure may also be useful.

At 540, an RDL encapsulation layer is disposed over the buffer layer with the RDL structure. The RDL encapsulation layer covers the RDL lines and RDL studs as well as filling the gaps therebetween. In one embodiment, the RDL encapsulation layer is the same or similar to the composite buffer layer. The RDL encapsulation layer may be laminated onto the wafer surface. Other techniques for forming the RDL encapsulation layer may also be useful. The wafer surface is grinded to remove excess RDL encapsulation material to expose the surface of the RDL studs. This results in a coplanar surface with the RDL studs and the RDL encapsulation layer.

In one embodiment, package contacts are formed at 550. The package contacts, in one embodiment, are formed on the RDL studs. The package contacts include solder bumps or package bumps. The package bumps may be formed by solder bump technology (SBT). Other types or techniques for forming the package contacts may also be useful.

After forming the package contacts, the backside of the wafer is grinded at 560 to thin the wafer to the final wafer thickness. The final thickness of the wafer, for example, may be equal to the final thickness of the singulated dies without a backside protection layer. Other final wafer thicknesses may also be useful. After backside grinding is completed, the process continues to 570.

A backside protection layer is formed at 570. The backside protection layer, for example, is the same or similar to the composite buffer layer formed at 510. The backside protection layer may include a base backside protection layer with fillers formed by lamination. The process proceeds to 580 to singulate the wafer into the individual packages. The process terminates at 590.

Figure 5C:
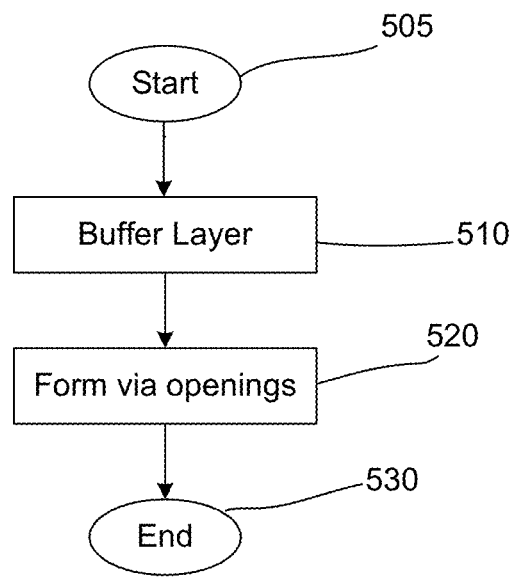

FIG. 5c shows an embodiment of a process flow 500 for processing a wafer, such as an incoming or processed wafer. In particular, the process flow results in processed wafers with a composite buffer layer. At 505, the process commences. For example, the processing of the incoming wafer commences. The processed wafer, for example, may be an incoming processed wafer from an external supplier.

The wafer, for example, includes an active surface with contact pads. In some embodiment, a passivation layer may be provided with pad openings to expose the contact pads. Alternatively, the passivation layer may not include pad openings. In other embodiments, no passivation layer is provided. At 510, the process forms a composite buffer layer on the active surface of the wafer. The composite buffer layer includes a base buffer layer containing fillers or granules. The composite buffer layer is configured to prevent cracking and chipping in the BEOL dielectric during dicing. The composite buffer layer may be formed by compression molding or lamination. Other techniques for forming the composite buffer layer may also be useful.

At 520, the process forms via openings in the buffer layer to expose contact pads of the incoming wafer. The via openings, for example, include tapered sidewalls. In one embodiment, the via openings are formed by laser etching. Other techniques for forming the via openings may also be useful. After via openings are formed, the process terminates at 530. The processed wafer with the composite buffer layer having via openings, for example, may be subsequently processed in parallel with other processed wafers on a wafer carrier.

In some embodiments, forming via openings in the composite buffer layer is skipped, resulting in a processed wafer with a composite buffer layer without via openings. Via openings may be formed subsequently when parallel processing of wafers on a wafer carrier is performed.

Figure 6A:
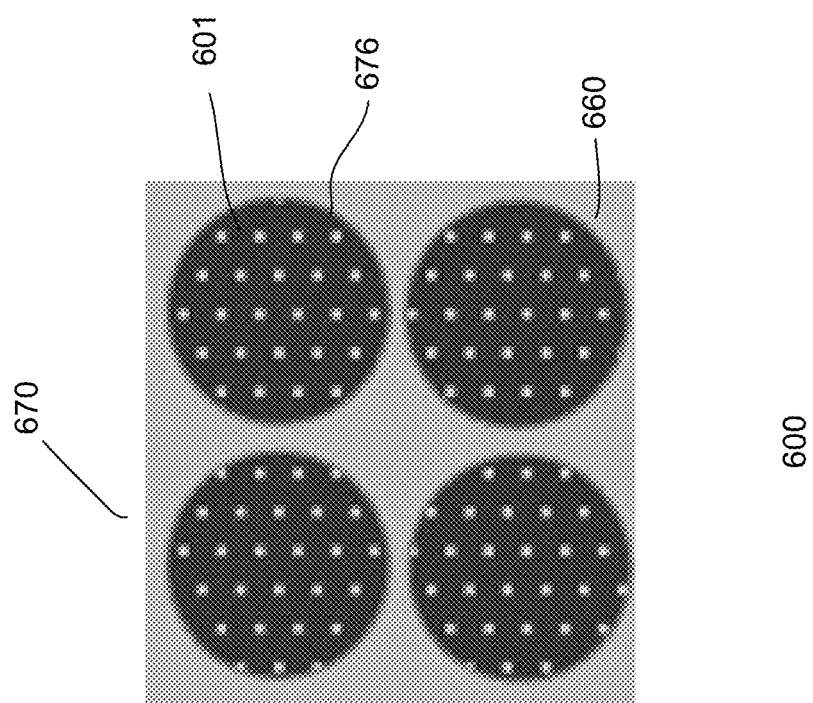
FIG. 6a shows a top view of a process for processing a plurality of wafers.

FIG. 6a shows a top view of an embodiment of a process 600 for processing wafers in parallel on a wafer carrier or panel while FIGS. 6b-6j show cross-section views of an embodiment of the process 600 for processing wafers in parallel on a wafer panel. Processing wafers in parallel on a wafer panel is described in, for example, co-pending patent application titled "Packaging Method, Panel Assembly, Wafer Package and Chip Package", filed on Dec. 5, 2019 (U.S. Ser. No. 16/703,887) which is herein incorporated by reference for all purposes.

Figure 6B:
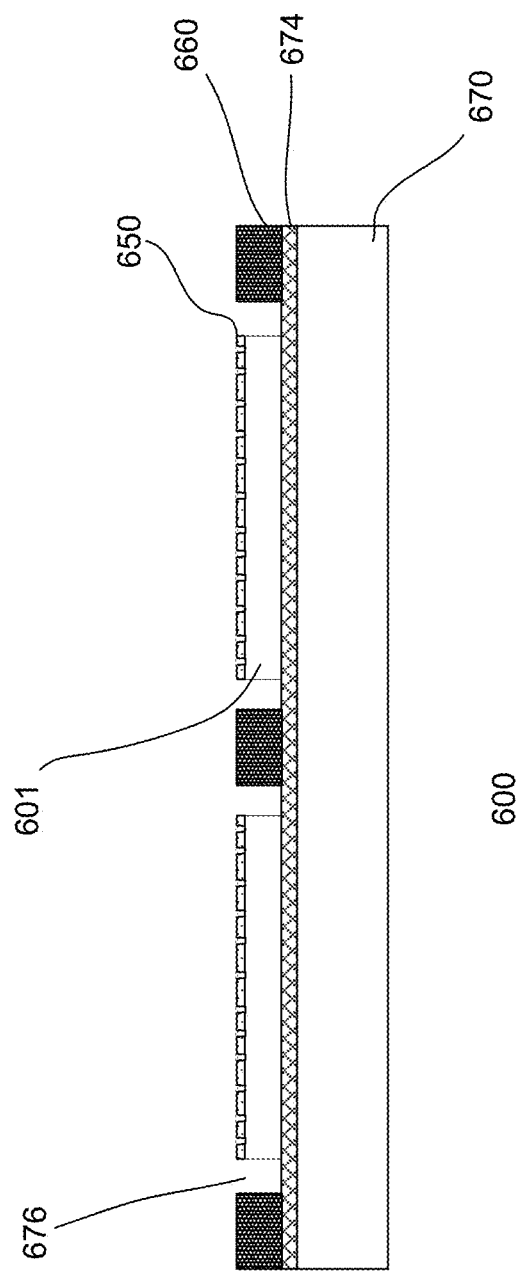
FIGS. 6b-6j show cross-sectional views of a process for processing a plurality of wafers.

Referring to FIGS. 6a-6b, a wafer carrier or panel 670 with a panel adhesion layer 674 on a major surface thereof is provided. For example, the panel adhesion layer 674 is disposed on a processing or top surface of the wafer panel 670. The wafer panel 670 should be sufficiently rigid to enable the processing of wafers 601 attached thereto. Preferably, the wafer panel 670 is capable of being magnetically held during processing. In one embodiment, the wafer panel 670 is metallic. Other types of panels, such as glass, may also be useful. For non-metallic panels, other techniques may be employed for holding it firmly during processing, such as by vacuum pressure. In one embodiment, the panel adhesion layer 674 is a heat release (HR) adhesion layer. For example, the adhesion layer 674 is an HR tape. Subjecting the panel to a thermal treatment enables the wafers to be detached or released from the panel. Other types of adhesives which can temporally hold the wafers in position during processing may also be useful. The adhesion layer 674 may be laminated onto the processing surface of the wafer panel 670. Other techniques, such as printing, spraying, and coating, may also be useful to form the adhesion layer on the processing surface.

As shown, the wafer panel 670 may have a rectangular shape. The panel, as shown, holds four wafers 601 for processing in parallel. For example, the wafer panel 670 holds four 12" wafers 601. Providing a wafer panel which holds other numbers of wafers may also be useful. For example, the wafer panel 670 may be designed to hold nine 8" wafers. Other configurations of the wafer panel may also be useful.

Disposed on the processing surface is a wafer cavity mold layer 660. For example, the cavity mold layer 660 is disposed on the adhesion layer 674. The cavity mold layer 660 includes cavity mold openings for accommodating the wafers 601. For example, each opening accommodates one wafer 601. The shape of a cavity mold opening should be about the same shape as the wafer 601, except that it is slightly bigger, leaving a gap 676 between the cavity mold layer and the wafer 601 when the wafer is mounted on the wafer panel 670. The cavity mold layer 660 may be a glass reinforced epoxy layer, such as FR-4, or a thin metal sheet, such as a Cu foil. Other types of materials may also be useful for the cavity mold layer. The cavity mold layer 660 may be laminated onto the wafer panel 670. The cavity mold layer 660, for example, includes openings prior to lamination. The wafer panel 670 may also include wafer positioning marks or members (not shown) to facilitate the alignment of the wafers 601 in the openings of the cavity mold layer 660.

In one embodiment, the wafers 601 are attached to the wafer panel 670. For example, the wafers are attached to the panel adhesion layer 674. One wafer is mounted in each cavity mold opening of the cavity mold layer 660, leaving a gap 676 between the cavity mold layer 660 and the wafer 601. Mounting the wafers on the wafer panel may be facilitated by alignment members (not shown) on the wafer panel. The wafers 601, for example, are processed wafers with the composite buffer layer 650 having the via openings 652, as described in FIG. 5c. Alternatively, the processed wafers include the composite buffer layer 650 without via openings.

Figure 6C:
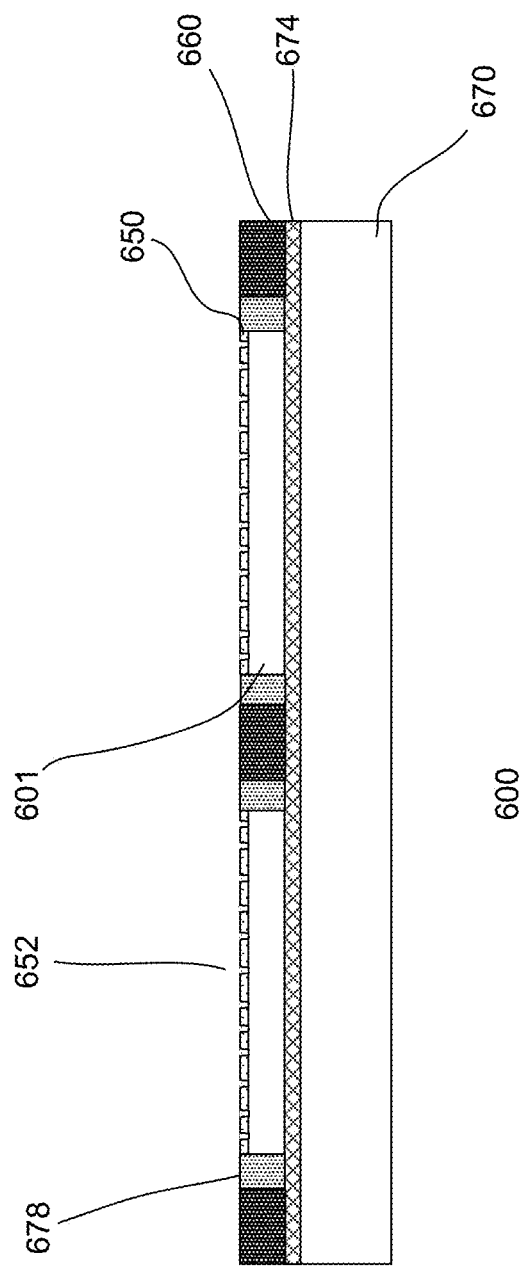

In FIG. 6c, wafer locking members 678 are formed in the gaps of the cavity mold openings with the wafers 601. For example, wafer locking members 678 are formed in the gaps between the cavity mold layer 660 and the wafers 601. The wafer locking members 678, for example, may be an adhesive, such as a UV adhesive. For example, an adhesive is dispensed into the gaps between the wafers 601 and the cavity mold layer 660. After dispensing, the adhesive is cured and hardened by exposure to UV radiation or heat. This, for example, forms a wafer panel assembly with the wafers 601 on the wafer panel 660.

As shown, the composite buffer layer 650 on the wafers includes via openings 652 to expose the contact pads. In some embodiments, the composite buffer layer 650 does not include via openings. In such cases, the process forms via openings 652 in the composite buffer layer 650 to expose the contact pads. Forming the via openings 652, for example, may be achieved using laser etching. Other techniques for forming the via openings, such as plasma etching with a resist mask, may also be useful. In some cases, a multi-step etch process, such as a high power laser etching followed by plasma etching or the high power laser etching followed by a low power laser etching, with a mask or without a mask, may also be useful. In the case that the passivation layer does not include pad openings, the process of forming the via openings 652 also includes forming pad openings to expose the contact pads.

Figure 6D:
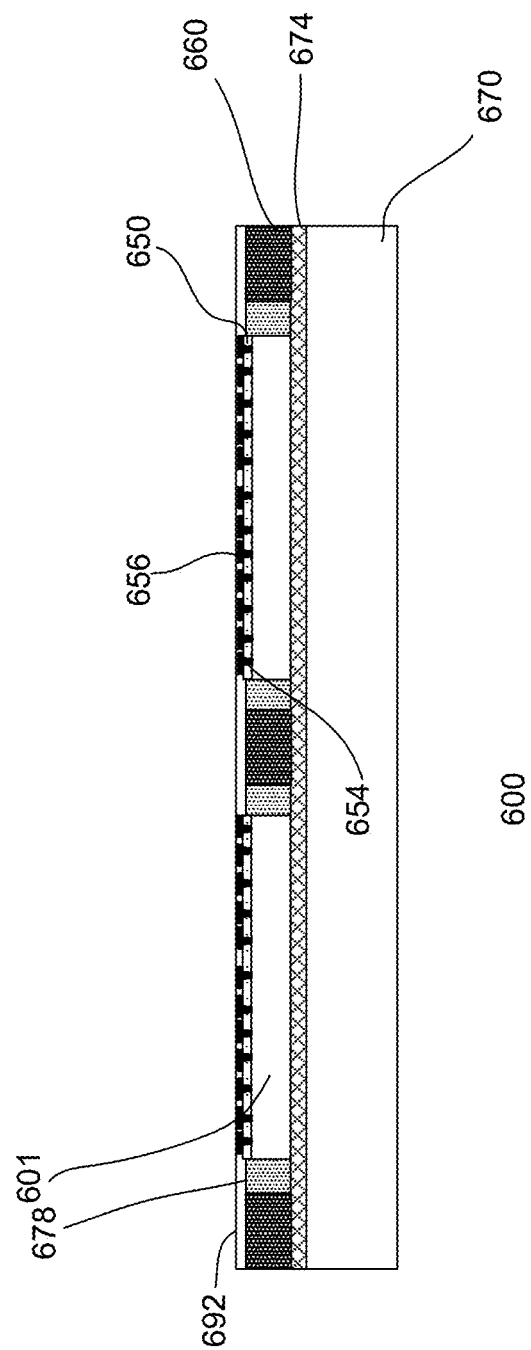

Referring to FIG. 6d, the process for forming RDL structures commences on the wafer panel assembly. In one embodiment, a seed layer, such as Cu—Ti, is formed. The seed layer lines the buffer layer with the via openings. A plating mask 692 is formed on the assembly. The plating mask, in one embodiment, is a patterned dry film photoresist. The dry film photoresist is patterned using, for example, LDI to form openings corresponding to RDL lines. The openings also expose the via openings in the buffer layers of the assembly. A plating process is performed to form an RDL layer, such as Cu or Cu-alloy, filling the mask openings, including the via openings. This forms RDL lines 656 coupled to the pads by the RDL via contacts 654.

Figure 6E:
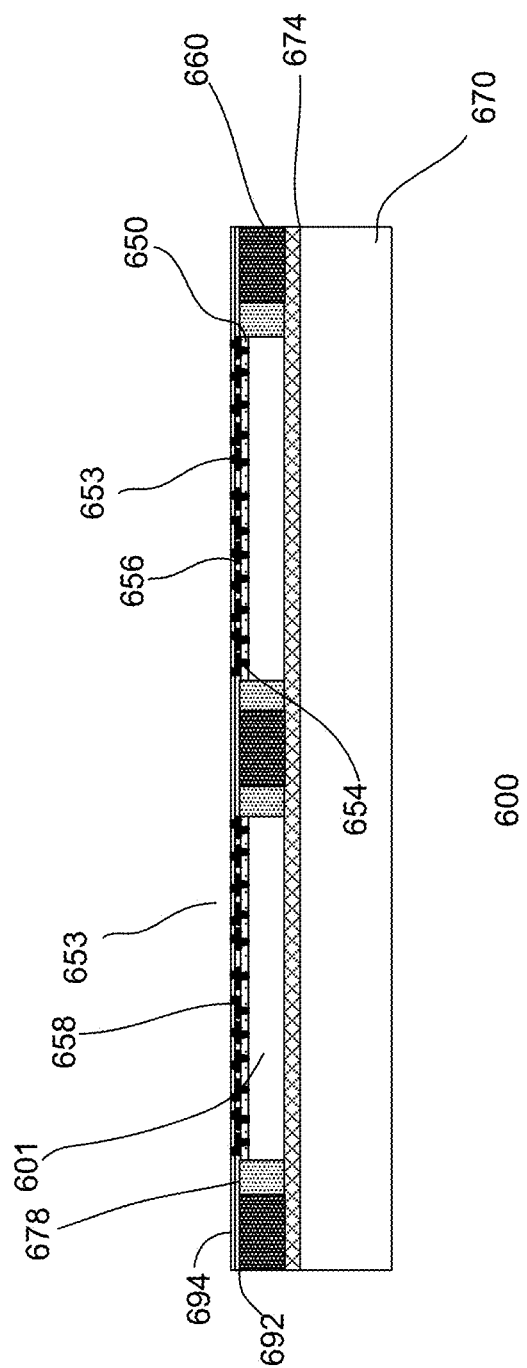

In FIG. 6e, RDL studs 658 are formed on the RDL lines 656. To form the studs, a dry film photoresist 694 is laminated on the RDL lines 656 and the plating mask 692. The photoresist film is patterned by, for example, LDI to form stud openings to expose the RDL lines 656 where RDL studs are to be formed. For example, the patterned photoresist layer 694 may be a plating mask for selectively forming the RDL studs 658 on the RDL lines 656. A plating process is employed to form the RDL studs 658 in the stud openings. After the RDL studs 658 are formed, the photoresist films 692 and 694 are removed. The RDL via contacts 654, the RDL lines 656, and the RDL studs 658 form RDL structures 653 for the dies of the wafers.

Figure 6F:
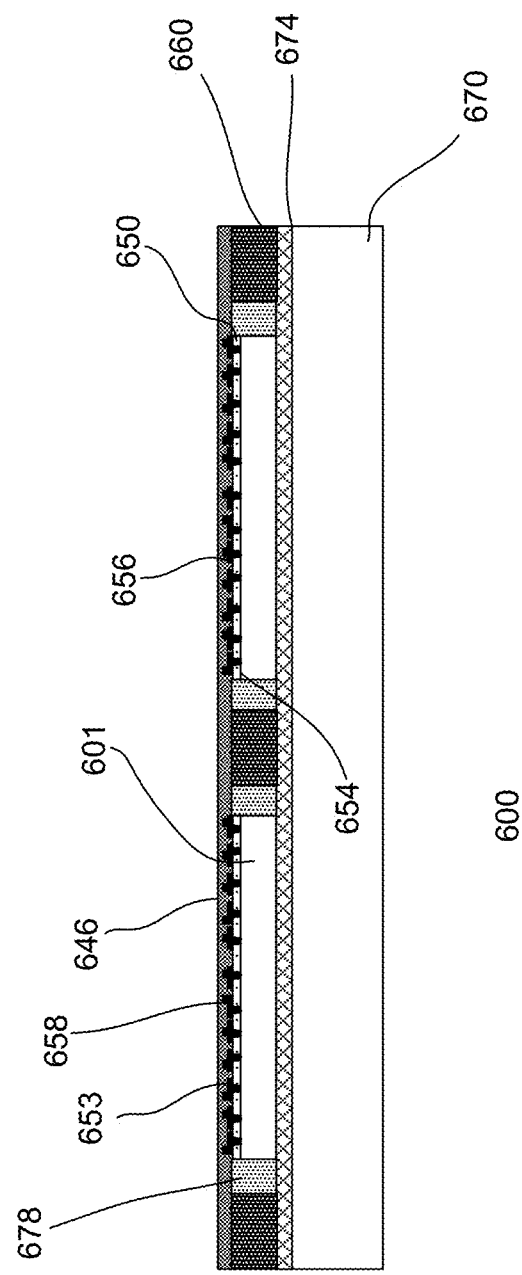

Referring to FIG. 6f, an RDL encapsulation layer 646 is formed on the wafer panel assembly, covering the RDL structures 653 over the composite buffer layer 650. For example, the RDL encapsulation 646 covers the RDL lines 656 and RDL studs 658 as well as filling the gaps therebetween. The RDL encapsulation layer 646, for example, is a dielectric layer which is similar to the composite buffer layer 650. For example, the RDL encapsulation layer includes a base RDL encapsulation layer with fillers. In one embodiment, the RDL encapsulation layer is laminated onto the wafer surface. Other techniques for forming the RDL encapsulation layer may also be useful. As shown, the top surface (exposed surface) of the RDL encapsulation layer is disposed above the RDL structures 653.

Figure 6G:
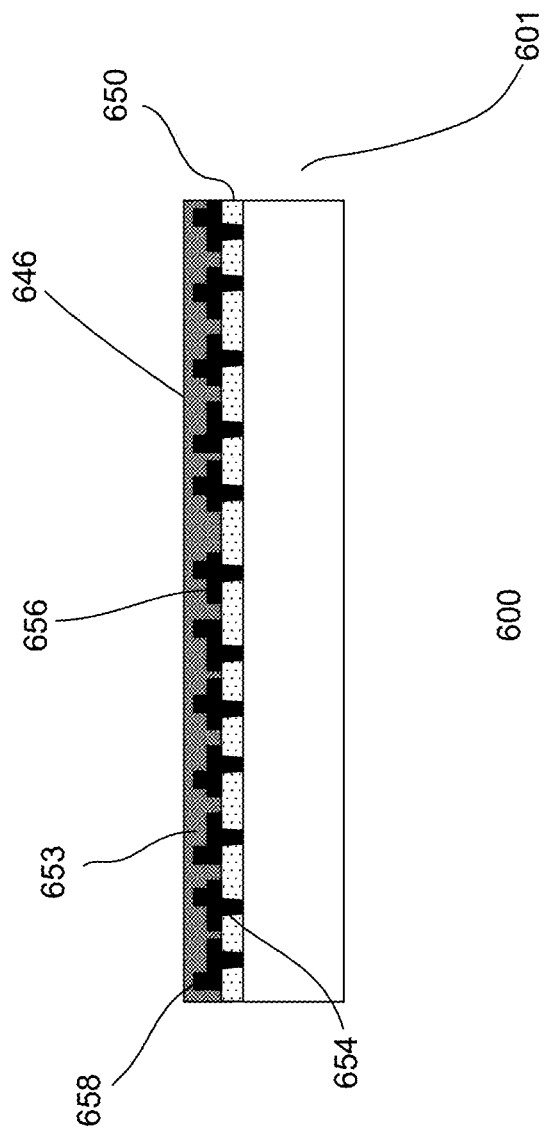

As shown in FIG. 6g, the wafer panel assembly with the wafers 601 is released from the wafer panel and the panel adhesion layer. In one embodiment, the wafer panel assembly, which includes the cavity mold layer, the wafer locking members and wafers, is released from the adhesion tape on the wafer panel. To release the wafer panel assembly, it is subjected to a thermal process, such as at 200° C. After separation, the wafer panel assembly is singulated into individual wafers 601. For example, the wafer panel assembly is laser cut to singulate the wafer panel assembly into individual wafers. The laser cuts the glue (locking members) to release the wafers.

Figure 6H:
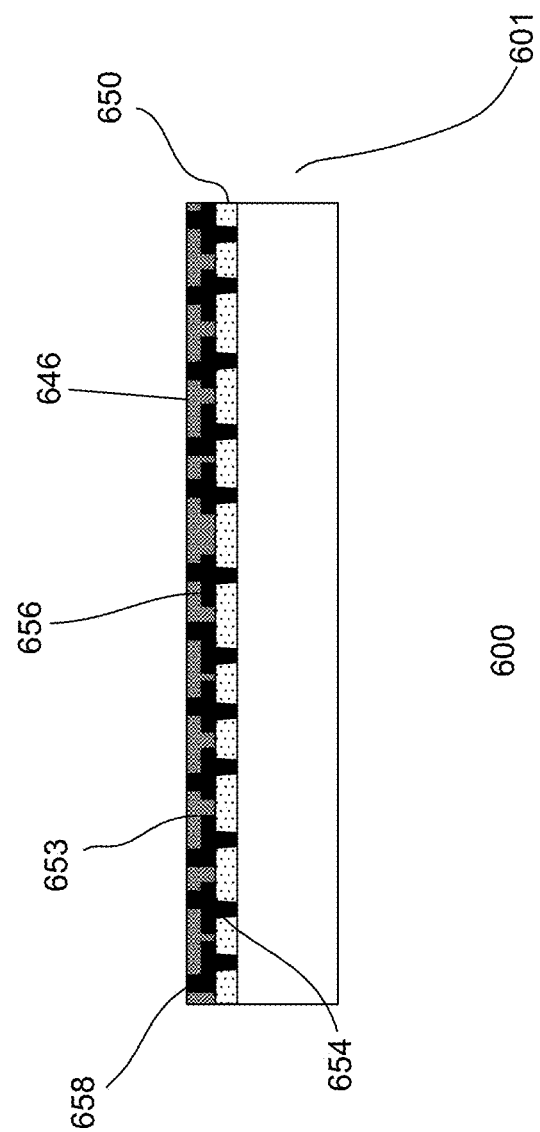

Referring to FIG. 6h, the excess RDL encapsulation layer 646 above the RDL structures 653 is removed. In one embodiment, the excess RDL encapsulation layer is removed by grinding. This produces a planar top surface of the RDL encapsulation layer 646 with the exposed RDL studs 658. For example, the top surface of the RDL studs 658 and the top surface of the RDL encapsulation layer 646 are coplanar.

Figure 6I:
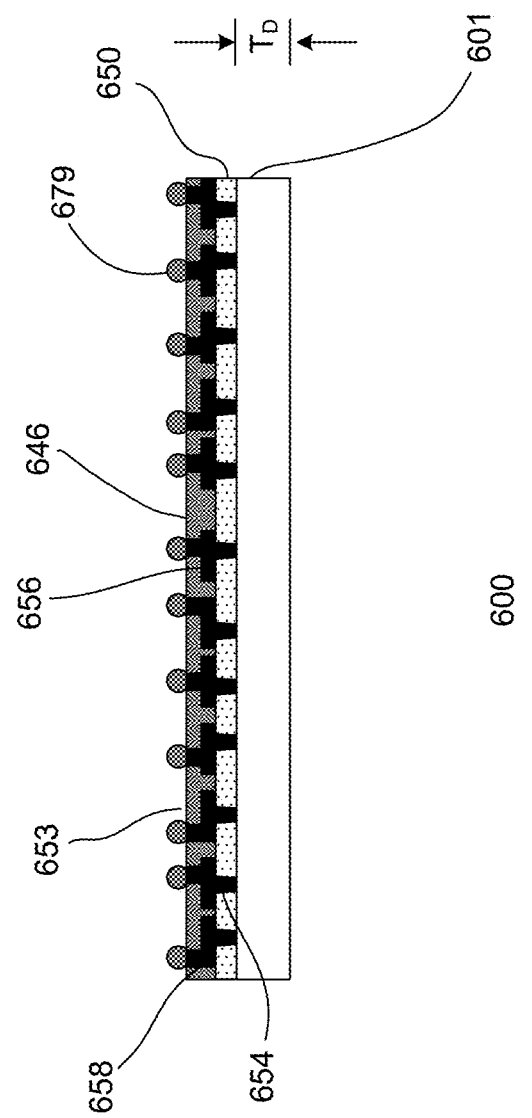

In one embodiment, as shown, in FIG. 6i, package contacts 679 are formed on the exposed surface of the RDL studs 658. The package contacts 679 may include solder bumps or package bumps. The package bumps may be formed by SBT. The solder bumps, for example, may be employed for ball grid array (BGA) packages. Other types of package contacts may also be useful. For example, the package contacts may be metal-plated contacts, such as tin-plated contacts. Plated contacts can be formed on the studs by, for example, a matt plating process. Other techniques for forming the plated contacts may also be useful.

Backside wafer grinding is performed on the wafer 601 after forming the package contacts 679. For example, the backside of the wafer is grinded to reduce the thickness of the wafer. The amount of wafer removed results in a wafer having the final wafer thickness TD.

Figure 6J:
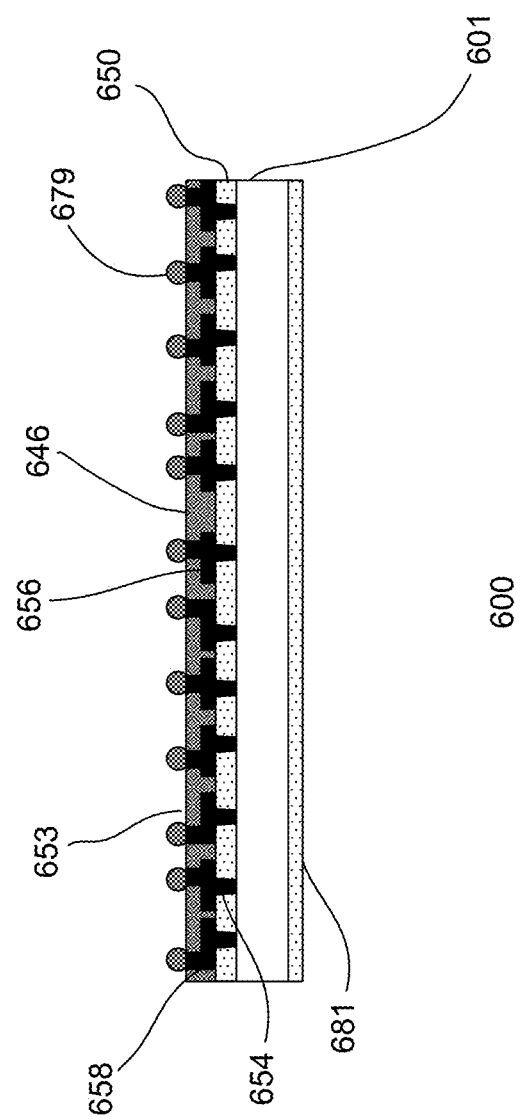

In one embodiment, as shown in FIG. 6j, a backside protection layer 681 is formed on the inactive wafer surface. The backside protection layer 681, for example, may be the same or similar to the composite buffer layer 650. The backside protection layer may include a base backside protection layer with fillers formed by lamination. Other types of or techniques for forming the backside protection layer may also be useful. The thickness of the backside protection layer, for example, may be about 25-200 um, about 25-150 um or about 50-120 um. Other thicknesses for the backside protection layer may also be useful.

After forming the backside protection layer, the wafer is diced to singulate the packages. The backside protection layer prevents or reduces chipping on the backside of the wafer from dicing the wafer, such as that shown in FIG. 2a. For example, the packages are fan-in type packages.

Figure 7:
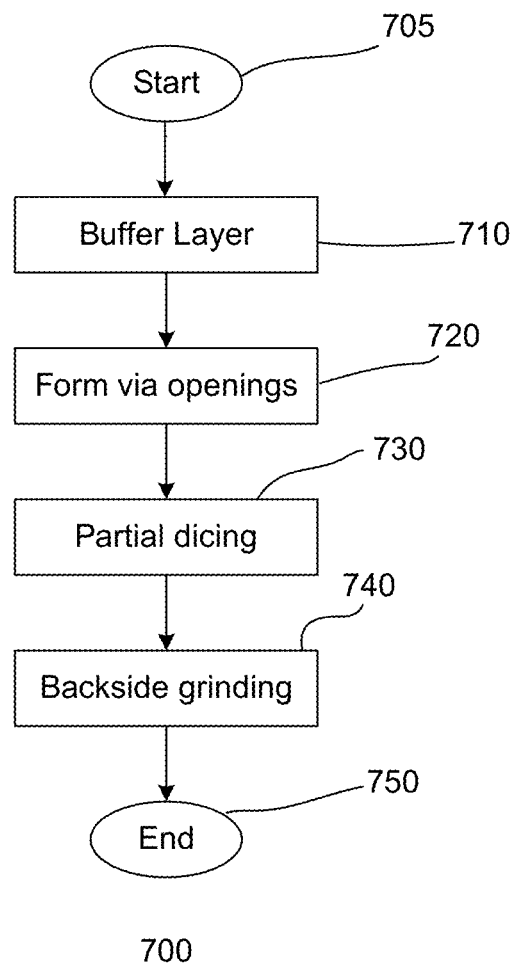
FIG. 7 shows an embodiment of a process flow processing a wafer.

FIG. 7 shows an embodiment of a process flow 700 for processing a wafer, such as an incoming or processed wafer. In particular, the process flow results in singulated dies with the composite buffer layer. The dies are subsequently processed to form packages with a molding layer. For example, the dies are processed to form 6 sided or 5 sided fan-in or fan-out packages. At 705, the process commences. For example, the processing of the incoming wafer commences. The processed wafer, for example, may be an incoming processed wafer from an external supplier.

The wafer, for example, includes an active surface with contact pads. In some embodiment, a passivation layer may be provided with pad openings to expose the contact pads. At 710, the process forms a composite buffer layer on the active surface of the wafer. For example, a composite buffer layer is formed on the wafer, covering the contact pads, or alternatively, covering the top of the BEOL dielectric, contact pads, and passivation layer. The composite buffer layer includes a base buffer layer containing fillers or granules, such as those previously described. The composite buffer layer prevents or reduces cracking and chipping in the BEOL dielectric during dicing. The composite buffer layer may be formed by compression molding or lamination. Other techniques for forming the composite buffer layer may also be useful.

At 720, the process forms via openings in the buffer layer to expose contact pads of the incoming wafer. The via openings, for example, include tapered sidewalls. In one embodiment, the via openings are formed by laser etching. Other techniques for forming the via openings, such as a multi-etch process, may also be useful.

After via openings are formed, the process proceeds to 730. At 730, the process continues to perform DBG processing on the wafer. For example, the wafer is partially diced. In one embodiment, the wafer is diced along the dicing lines to a depth equal to about the final thickness of the singulated dies. In some instances, the depth is slightly deeper than the final thickness of the singulated dies to account for process variations. This may be about 10-30% or about 10-20% greater than the final thickness of the singulated dies.

After partially dicing the wafer, the process continues to 740 for backside wafer grinding. For example, the backside of the wafer is grinded to thin the wafer to the final die thickness without the composite backside protection layer. The grinding process singulates the wafer into individual dies. For example, the individual dies may be similar to the die described in FIG. 4f. In some cases, the composite buffer layer may not include via openings. In such cases, the dies are similar to the die described in FIG. 4d. After singulation, the process terminates at 750.

Figure 8A:
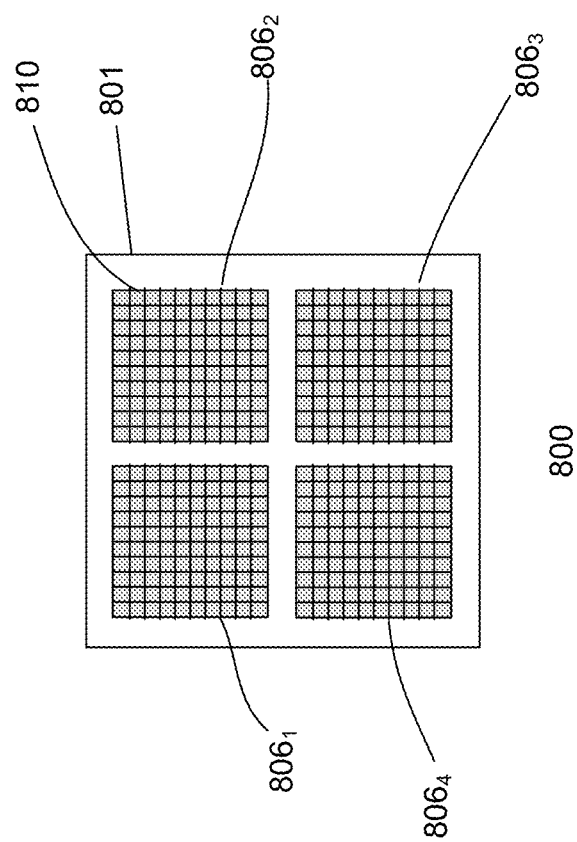
FIG. 8a shows a top view of processing a panel assembly.

FIG. 8a shows a top view of an embodiment of a process 800 for processing dies in parallel on a die carrier or panel while FIGS. 8b-8j show cross-section views of an embodiment of the process 800 for processing dies in parallel on a die panel. Processing dies in parallel on a die panel is described in, for example, co-pending patent application titled "Method of Packaging Chip and Chip Package Structure", filed on Jun. 14, 2021 (U.S. Ser. No. 17/346,310), which is already herein incorporated by reference for all purposes.

Figure 8B:
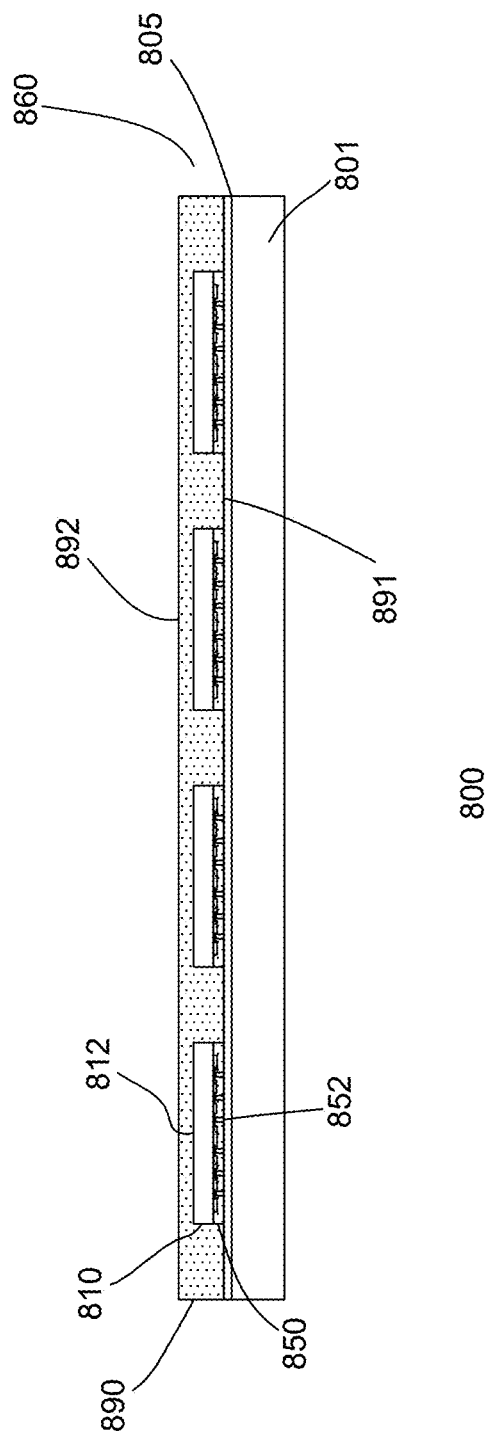

Referring to FIGS. 8a-8b, a die carrier or panel 801 is shown. In one embodiment, the die panel is configured to accommodate a plurality of dies 810 for processing. The dies, for example, may be processed with the composite buffer layer 850. The composite buffer layer may include via openings as described in FIG. 4f, or without via openings as described in FIG. 4d. As shown, the composite buffer layer 850 includes via openings 852. The process for processing a wafer to produce individual dies with the composite buffer layers is, for example, described in FIG. 7. Other processes may also be employed to process a wafer to produce individual dies with the composite buffer layer.

The die panel 801 should be sufficiently rigid to enable processing of dies 810 attached thereto. In one embodiment, the die panel may be formed from a material having a low coefficient of expansion (CTE). For example, the CTE of the panel may be at or less than 8 ppm/K. Low CTE material, for example, may include Alloy 42 (CTE 3-4.5 ppm/K) or Alloy 46 (CTE 7-8 ppm/K). Preferably, the die panel 801 can be magnetically held, such as a metallic panel, enabling the panel to be firmly held. Other types of panels, such as glass, may also be useful.

A panel adhesion layer 805 is formed on a major surface thereof. For example, the panel adhesion layer 805 is disposed on a processing or top surface of the die panel 801. The adhesion layer 805 holds the dies mounted on the processing surface of the die panel. In one embodiment, the panel adhesion layer 805 is a heat release (HR) adhesion layer. For example, the adhesion layer is an HR tape. Subjecting the panel to a thermal treatment enables a die panel assembly or reconstituted wafer 860 to be detached or released from the die panel 801. Other types of adhesives which can temporally hold the dies in position during processing to form the die panel assembly may also be useful. The adhesion layer 805 may be laminated onto the processing surface of the die panel. Other techniques, such as printing or spray coating, may also be useful to form the adhesion layer on the processing surface.

As shown, the die panel 801 is a rectangular-shaped panel. Other shapes may also be useful. The dies 810 are attached to the die panel 801. In one embodiment, the dies 801 are bonded face down on the processing surface of the die panel 801, facilitated by the adhesion layer. For example, the active die surface of the dies 810 faces the die panel 801 while the inactive die surface 812 is distal from the die panel. A die bonder may be employed to pick and bond dies on the die panel. Alignment marks may be included to facilitate accurate positioning of the dies on the die panel. For example, die regions on which dies are bonded may include local alignments. Other techniques for aligning the dies to the die regions may also be useful.

In one embodiment, the dies 810 are arranged in a die matrix with rows and columns of dies 810. In one embodiment, the dies 810 are separated into four die blocks or die matrices $806_{1-4}$. Other configurations of the dies 810 on the die panel 801 may also be useful. For example, the dies 810 on the panel 801 may be configured with other numbers of blocks, including 1. Preferably, where the panel 801 includes more than 1 block, the number of blocks is an even number. Dividing the dies into blocks enables a greater number of dies to be processed in parallel while reducing position errors of the dies. This increases die position accuracy for processing.

After the dies 810 are bonded face down on the die panel 801, a molding process is performed to encapsulate the dies with a mold compound or mold layer 890. As shown, the mold layer 890 fills the gaps between the dies as well as covers the inactive surface 812 of the dies 810, encapsulating the dies 810. The molding process, for example, may be a compression molding process. Other types of molding processes, such as high temperature molding processes, may also be useful. The dies 810 with the mold layer 890 forms the die panel assembly or reconstituted wafer 860. An exposed surface 892 of the mold layer 890 may be referred to as the inactive mold layer or bottom mold layer surface.

The opposing surface of the mold layer may be referred to as an active mold layer or top mold layer surface 891.

After forming the die panel assembly 860, it is released from the die panel 801. For example, the die panel with the die panel assembly is subjected to a thermal process, causing the adhesion layer to lose its adhesive property. This enables the die panel 801 to be separated from the die panel assembly 860.

In some embodiments, prior to releasing the die panel assembly 860 from the die panel 801, a grinding process is performed to reduce the height of the mold layer 890 to the final height. In one embodiment, as shown, the final height of the mold layer is above the inactive surfaces 812 of the dies 810. In other embodiments, the grinding process removes excess mold layer 890 above the inactive surface 812 of the dies 810. For example, the grinding process removes excess mold layer material to expose the inactive surfaces 812 of the dies 810.

Figure 8C:
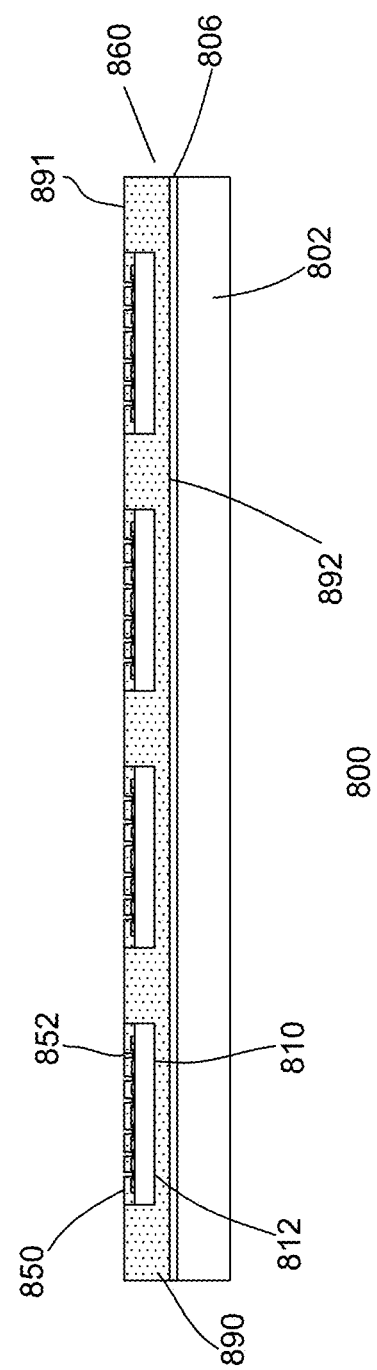

In FIG. 8c, the die panel assembly 860 is mounted onto an assembly carrier 802. As shown, the inactive mold layer surface 892 is mounted on the assembly carrier 802. An assembly carrier adhesion layer 806 is formed on the processing surface of the assembly carrier 802 to facilitate the temporary bonding of the die panel assembly 860. The carrier adhesion layer 806, for example, is an HR adhesion layer, similar to the adhesion layer used to attach dies to the die panel. The active mold layer surface 891 and the active surface of the dies 810 are exposed or facing away from the assembly carrier 802.

In the case that the composite buffer layer 850 does not include via openings, via openings are formed in the composite buffer layer 850. For example, laser etching may be employed to form via openings in the composite buffer layer 850 to expose the die contact pads. Other techniques, such as a multi-etch technique may be employed. The multi-etch technique may include a high power laser etching followed by a low power laser etching. In other embodiments, the multi-etch technique may include the high power laser etching followed by plasma etching. In the case that the passivation layer does not include pad openings, the process of forming via openings also include forming pad openings in the passivation layer.

Figure 8D:
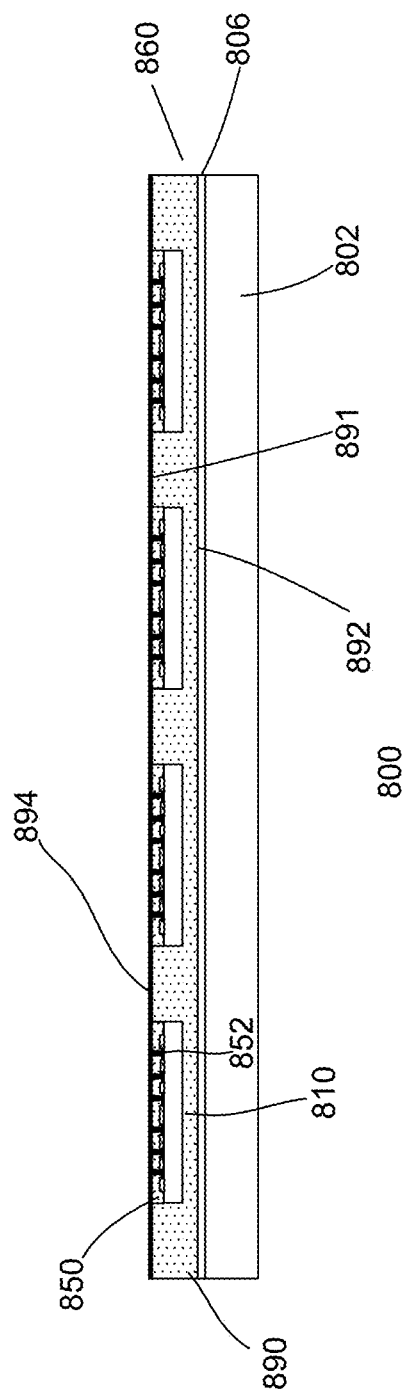
Figure 8E:
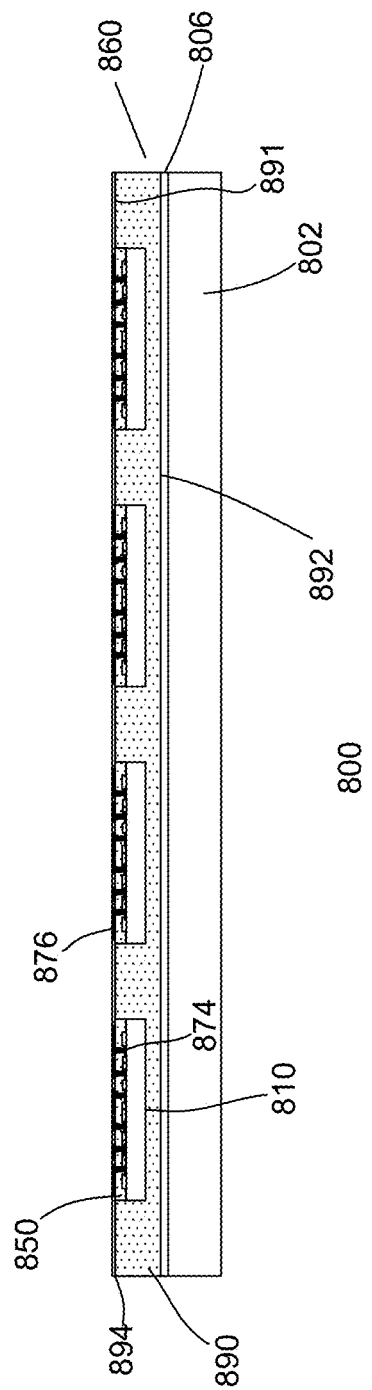

As shown in FIGS. 8d to 8e, the process proceeds to form RDL lines 876 and RDL via contacts 874. The RDL lines 876 and RDL via contacts 874 may be formed by a plating process, as previously described. The plating process, for example, includes forming a seed layer on the buffer layer 850, laminating a dry film photoresist 894 thereon and patterning it by LDI to form openings corresponding to the RDL lines and via openings. The plating process forms a conductive layer which fills the mask openings and via openings, forming RDL lines 876 coupled to the contact pads by the RDL via contacts 874 in the via openings. As shown in FIG. 8e, the RDL lines 876 are patterned to be disposed within the die footprint. In one embodiment, the RDL lines 876 are for a fan-in package. Forming a fan-out package may also be useful. In such cases, the RDL lines 876 may extend beyond the footprint of the die but within the die package footprint.

Figure 8F:
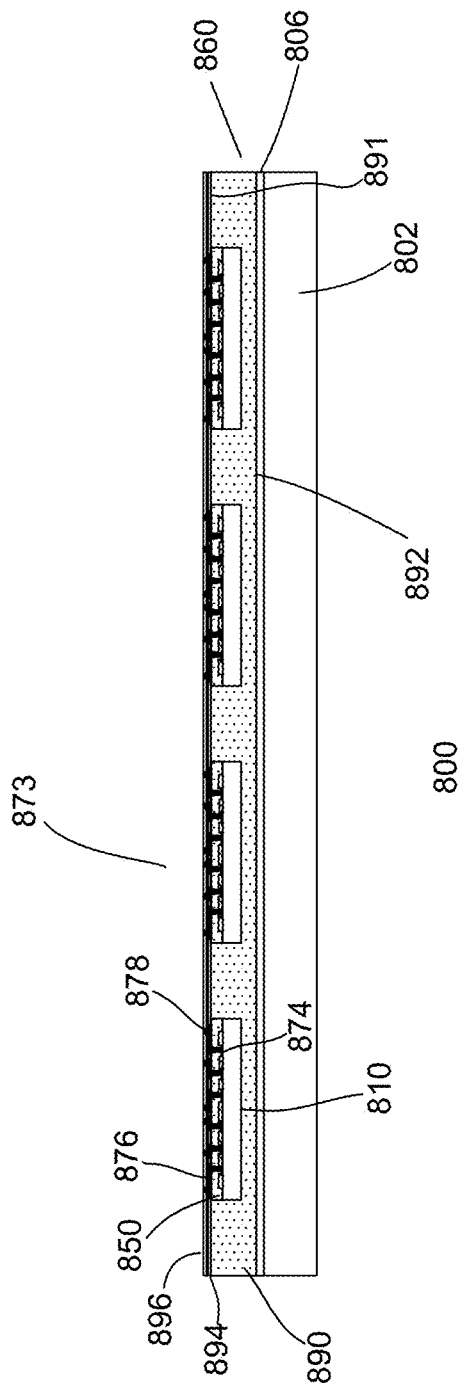

In one embodiment, RDL studs 878 are formed on the RDL lines 876, as shown in FIG. 8f. The RDL studs 878 are formed by laminating a dry film photoresist 896 on the RDL lines 876 and the patterned dry film photoresist 894. The photoresist film 894 is patterned by, for example, LDI to form openings to expose the RDL lines 876 where RDL studs are to be formed. A plating process is employed to form the RDL studs 878 in the stud openings followed by the removal of the patterned photoresist films 894 and 896. The RDL via contacts 874, RDL lines 876, and studs 878 form RDL structures 873 of the dies.

Figure 8G:
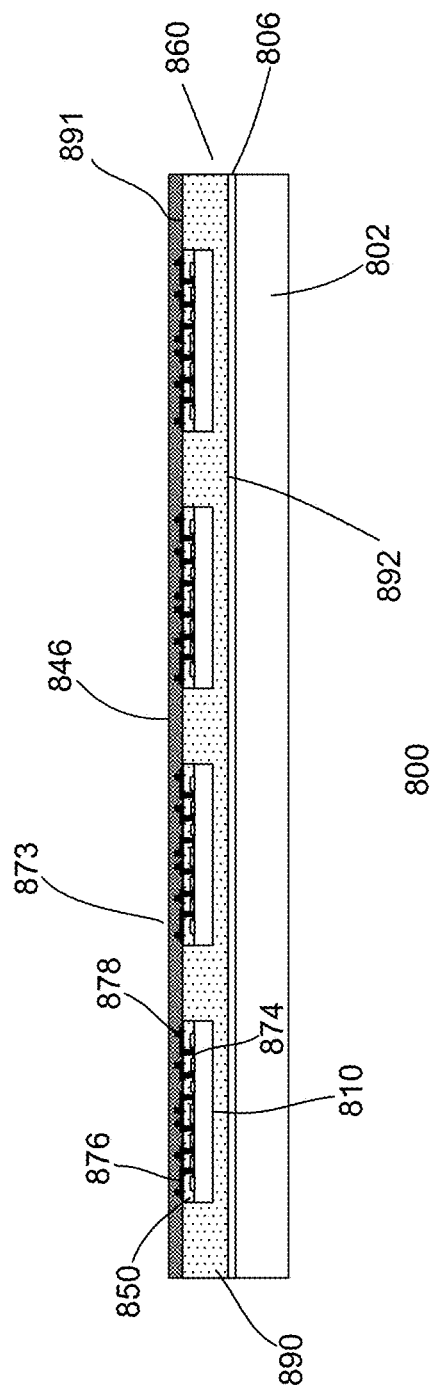

Referring to FIG. 8g, an RDL encapsulation layer 846 is formed on the die panel assembly 860. The RDL encapsulation layer 846, as shown, covers the RDL structures 873 over the composite buffer layer 850. For example, the RDL encapsulation layer 846 covers the RDL lines 876 and the RDL studs 878 as well as filling the gaps therebetween. The RDL encapsulation layer 846 may be a dielectric layer which is similar to the composite buffer layer 850. For example, the RDL encapsulation layer 846 includes a base RDL encapsulation layer with fillers. The encapsulation layer may be an EMC layer. In one embodiment, the RDL encapsulation layer may include fillers that are from 20-60 um. Other sized fillers may also be useful.

In one embodiment, the RDL encapsulation layer 846 is laminated onto the wafer surface. Other techniques for forming the RDL encapsulation layer 846 may also be useful. For example, the RDL encapsulation layer 846 may be formed by film molding. Other techniques for forming the RDL encapsulation layer may also be useful. As shown, the top surface (exposed surface) of the RDL encapsulation layer 846 is disposed above the RDL structures 873.

In the case where the die panel assembly 860 includes multiple blocks or matrices of dies, it is released from the die panel. For example, the die panel assembly is subjected to a thermal process to release the die panel assembly 860 from the assembly carrier 802. The die panel assembly 860 is then processed to separate it into individual blocks of dies 810. For example, the die panel assembly 860 is cut to separate it into individual block panel assemblies. Separating the die panel assembly into block panel assemblies may be achieved using laser cutting. Alternatively, the die panel assembly 860 may be cut by sawing. Other techniques for separating the die panel assembly 860 into block panel assemblies may also be useful. The block panel assemblies are then attached to a block panel carrier using a block panel adhesion layer, such as an HR adhesion layer. In the case that the die panel assembly only includes one block, there is no need to release the die panel assembly 860 from the assembly carrier 802.

Figure 8H:
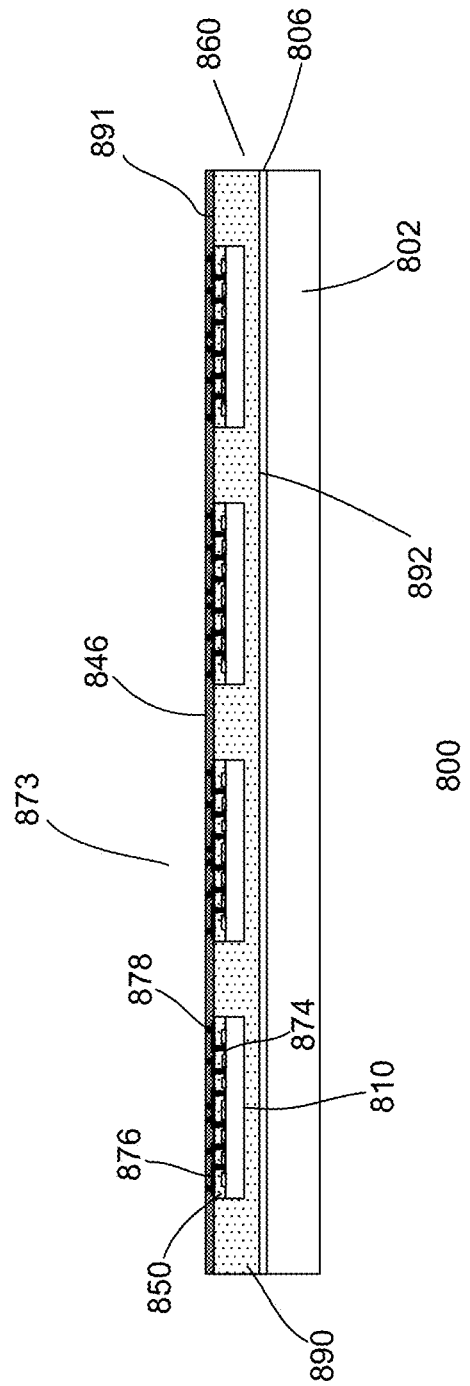

As shown in FIG. 8h, the die panel assembly 860 is processed to remove excess RDL encapsulation layer 846 above the RDL structures 873. The die panel assembly 860, for example, may be the block panel assembly in the case the panel assembly is separated into block assemblies. In one embodiment, the excess RDL encapsulation layer 846 is removed by grinding. This produces a planar top surface of the RDL encapsulation layer 846 with the exposed RDL studs 878. For example, the top surface of the RDL studs 878 and the top surface of the RDL encapsulation layer 846 are coplanar.

Figure 8I:
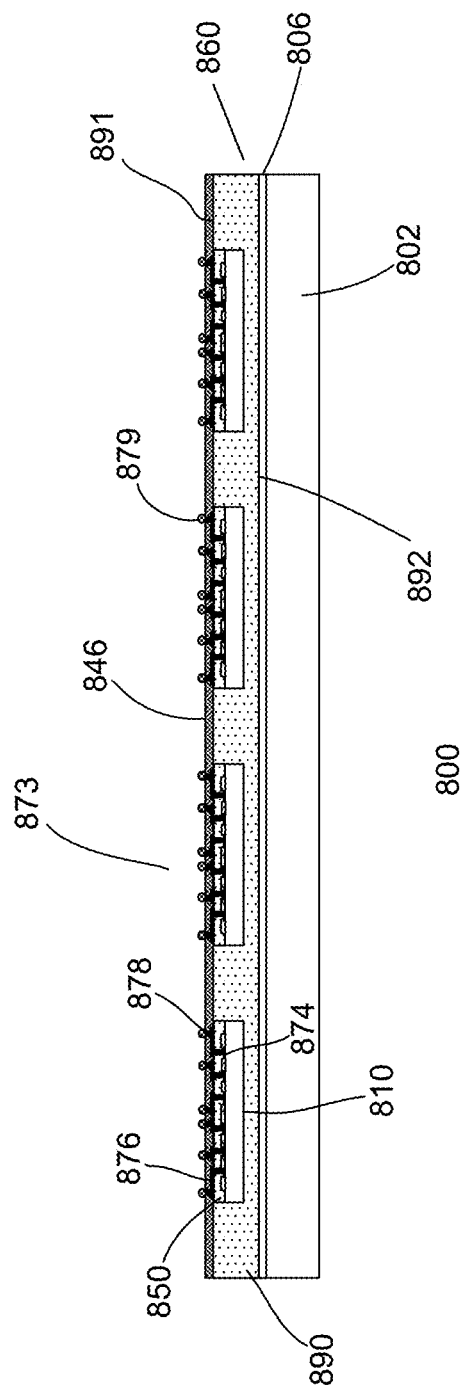

In one embodiment, as shown, in FIG. 8i, package contacts 879 are formed on the exposed surface of the RDL studs 878. The package contacts 879 may include solder bumps or package bumps. The package bumps may be formed by SBT. The solder bumps, for example, may be employed for chip-scale packages (CSPs). Other types of package contacts may also be formed.

After forming the package contacts 879, the die panel assembly 860 is released from the panel carrier. As shown in FIG. 8j, the die panel assembly is singulated to produce individual packages 811. The individual packages are, for example, CSP packages with 6-sided wall protection.

In alternative embodiments, the process may be configured to form fan-out packages. For example, the RDL layer, as described in FIG. 8d, may be patterned to form RDL lines 876 which may extend beyond the footprint of the dies 810. The process continues as described.

In one embodiment, the package contacts may be formed, as described in FIG. 8*i*. For example, the process forms package bumps for BGA packages. Alternatively, the package contacts may include plated contacts on the surface of the studs. The plated contacts may be formed by matt tin plating. Plated contacts, for example, are used to form LGA or QFN packages. After forming the package contacts, the process continues by releasing the die panel assembly from the panel carrier and singulating the die panel assembly to produce individual packages 811. As described, the process forms 6-sided protected fan-out packages. Forming 6-sided protected fan-in packages may also be useful.

As described, the RDL structures include one line level. For example, the RDL structure includes one rewiring level which includes RDL lines 876. Forming RDL structures with multiple rewiring levels may also be useful.

Figure 9:
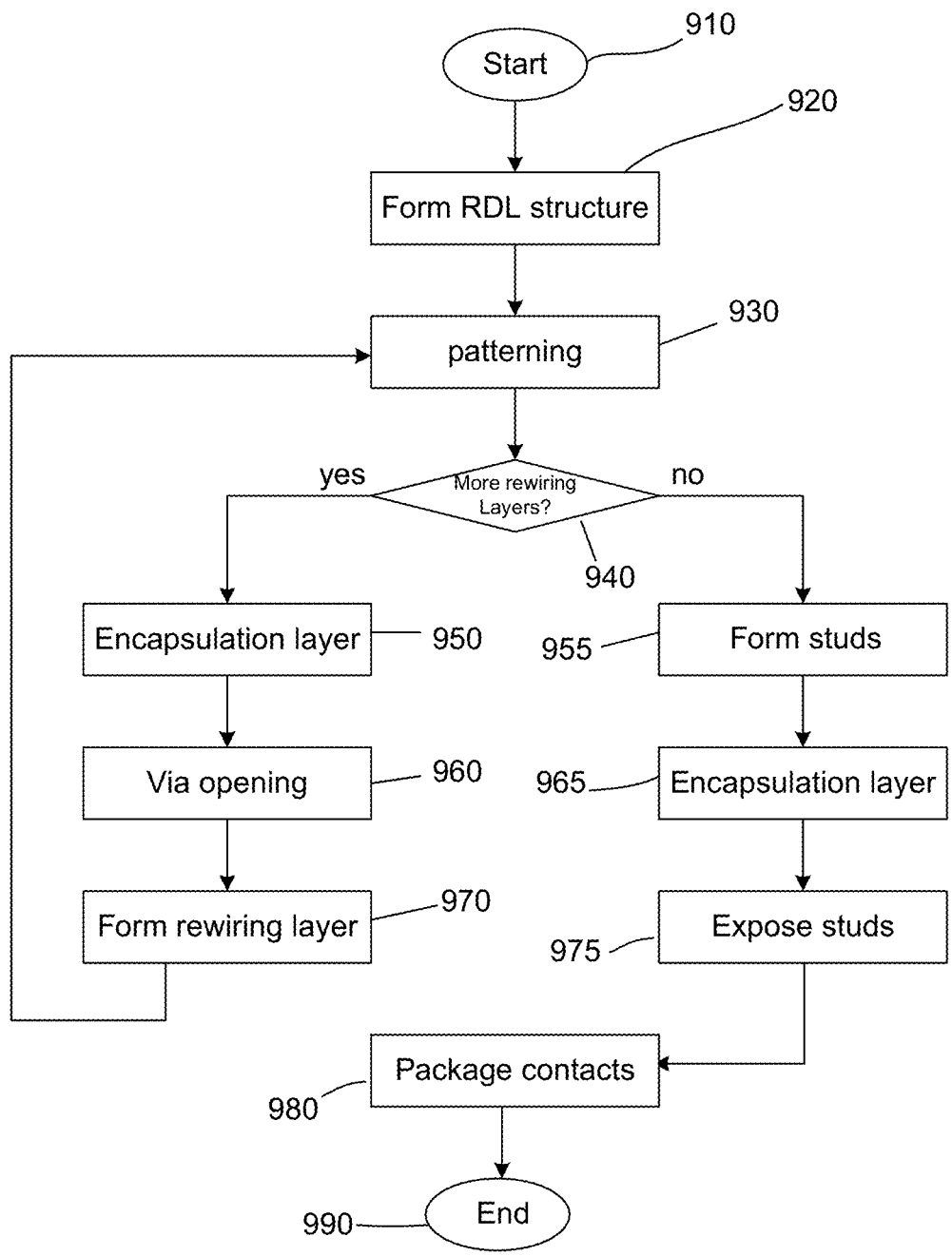
FIG. 9 shows a process flow for forming redistribution layer structures.

FIG. 9 shows an embodiment of a process flow 900 for forming RDL structures. The process flow can be applied to a single wafer on a carrier, multiple wafers on a wafer carrier as described in FIGS. 6*a*-6*j* or a die panel assembly, as described in FIGS. 8*a*-8*j*. The process commences at 910. For example, processing commences to form RDL structures.

In the case that the composite buffer layer includes via openings, the process continues to 920 to form an RDL layer. If the composite buffer layer does not include via openings, via openings are formed in the composite buffer layer to expose the contact pads of the dies. The via openings may be formed by laser etching (masked or maskless) or plasma etching using a resist mask. In other embodiments, the via openings may be formed using a multi-etch process. The via openings expose the contact pads of the dies. After the via openings are formed, the process proceeds to 920.

At 920, a rewiring layer of the RDL structure is formed. For example, a first rewiring layer (i=1) of the RDL structure is formed. An RDL structure may have x number of rewiring layers, where x is a whole number greater than or equal to 1. Typically, the RDL structure may have 1-5 rewiring layers.

The rewiring layer may, for example, be a Cu or Cu-alloy layer. In one embodiment, the rewiring layer is formed by plating. Prior to plating, a seed layer, such as Ti—Cu, may be formed on the panel assembly, lining the composite buffer layers and via openings. The seed layer may be formed by sputtering. After forming the seed layer, a patterned mask layer is formed. For example, a dry film photoresist is laminated and patterned by LDI to form openings corresponding to RDL lines, which includes via openings. The patterned resist film, for example, may be the plating mask for the $i^{th}$ rewiring layer.

At 930, the conductive rewiring layer, such as Cu or Cu-alloy, is plated, filling the mask openings and via openings in the buffer layer. This forms RDL lines coupled to the contact pads of the dies by RDL via contacts in the via openings of the composite buffer layer of the dies. The RDL conductive lines, for example, are conductive lines of the first rewiring level (x=1). The RDL lines may be fan-in or fan-out RDL lines. After forming the RDL lines, the process proceeds to 940.

At 940, the process determines if there are more rewiring layers to be formed. If there are more rewiring layers to be formed, the process continues to 950. For example, if i≠x, the process continues to 950. On the other hand, if i=x, indicating that there are no more rewiring layers, the process continues to 955.

At 950, in the case that there are more rewiring layers or levels, the plating mask for the $i^{th}$ rewiring layer is removed. An RDL encapsulation layer is formed. For example, an $i^{th}$ encapsulation layer corresponding to the $i^{th}$ rewiring layer is formed. The encapsulation layer, for example, is a dielectric layer which is similar to the composite buffer layer. For example, the RDL encapsulation layer includes a base encapsulation layer with fillers. The size of the fillers of the RDL encapsulation layer may be from 20-60 um. Other filler sizes may also be useful. Other types of RDL encapsulation layers, such as a preformed RDL encapsulation layer or an EMC layer, may also be useful. The RDL encapsulation layer covers the conductive lines of the rewiring layer. The thickness of the encapsulation layer takes into account of covering the RDL conductive lines as well as subsequently formed RDL via contacts of the next rewiring layer (i=i+1).

In one embodiment, the RDL encapsulation layer is laminated onto the wafer surface. Other techniques for forming the RDL encapsulation layer may also be useful. For example, the RDL encapsulation layer may be formed by film molding.

At 960, via openings are formed in the RDL encapsulation layer to expose portions of the conductive lines below at locations where via contacts are to be formed. The via openings may be formed by laser drilling. For example, the laser employed is configured for drilling of a non-photoimageable layer. Other techniques for forming the via openings may also be useful.

A next level (i=i+1) rewiring layer of the RDL structure is formed at 970. The rewiring layer may, for example, be a Cu or Cu-alloy layer formed by plating. Other types of conductive rewiring layers may also be useful. In one embodiment, a seed layer, such as Cu—Ti, is formed to line the encapsulation layer and via openings. A patterned mask layer is formed on the seed layer. For example, a dry film photoresist is laminated and patterned by LDI to form openings corresponding to RDL lines, which includes via openings. The patterned photoresist film, for example, may be the plating mask for the $i^{th}$+1 rewiring layer. A plating process is performed to form a conductive rewiring layer, such as Cu or Cu-alloy. The rewiring layer fills the mask openings and via openings of the encapsulation layer. This forms the $i^{th}$+1 RDL lines coupled to the $i^{th}$ RDL lines by RDL via contacts in the via openings of the encapsulation layer. The process returns to 940 to determine if there are more rewiring layers to be formed. The process continues and repeats until all rewiring layers are formed. For example, i=x, where x is the number of rewiring layers or levels of the RDL structure.

If no more rewiring layers are to be formed, the process proceeds to 955 to form RDL studs. In one embodiment, the RDL studs are selectively formed by plating. To form the RDL studs, a patterned mask, such as a patterned dry film photoresist, is employed. For example, a dry film photoresist is laminated and patterned by LDI to form openings to expose RDL lines where RDL studs are to be formed. A plating process is employed to form the RDL studs in the stud openings followed by removal of the plating mask.

The process proceeds to 965 to form an RDL encapsulation layer. The encapsulation layer is similar to that described in 950. For example, the RDL encapsulation layer is a composite RDL encapsulation layer with fillers. Other types of RDL encapsulation layers may also be useful. The RDL encapsulation layer covers the RDL lines and studs.

In one embodiment, the RDL encapsulation layer is laminated onto the wafer surface. Other techniques for forming the RDL encapsulation layer may also be useful.

For example, the RDL encapsulation layer may be formed by film molding. Other techniques for forming the RDL encapsulation layer may also be useful.

After forming the final RDL encapsulation layer, the carrier is released from the wafer assembly or the die panel assembly. After carrier release, the wafers are singulated in the case of multiple wafers. In one embodiment, in the case of a panel assembly with multiple blocks, it is singulated into individual blocks.

The process proceeds to 975. At 975, the final RDL encapsulation layer is grinded to remove excess encapsulation material to expose the conductive RDL studs. Package contacts are formed on the exposed RDL studs at 980. The package contacts may be solder bumps for CSP packages or plated contacts for LGA/QFN packages. After forming the package contacts, the process terminates at 990.

Depending on whether the RDL structure is formed on a wafer or on a panel assembly, different downstream processing may be performed. For example, in the case of a wafer, the backside of the wafer may be grinded to thin the wafer. A backside protection layer may be formed on the inactive surface of the wafer followed by wafer singulation to form individual packages. In the case of a panel assembly, it is singulated to form individual packages.

Experiment

An experiment was conducted to test the effectiveness of the composite buffer layer (CBL) in preventing cracks and chipping caused by the wafer singulation process. The experiment was conducted on two 12" wafers with low-k BEOL dielectric, one wafer with a CBL and the other wafer without a CBL. Wafer 1 (without CBL) and Wafer 2 (with CBL) are described in Table 1 below:

TABLE 1

|  | Wafer 1 | Wafer 2 |
|---|---|---|
| Wafer size: | 12" | 12" |
| Wafer type: | Low K | Low K |
| Thickness: | 775 ± 10 um | 775 ± 10 um |
| Thickness with CBL: | N/A | 800 ± 10 um |
| Chip size without scribe | 4.5 × 4.5 mm | 4.5 × 4.5 mm |
| Scribe width XY: | 0.09 mm | 0.09 mm |

The composite buffer layer is configured according to Table 2 below:

TABLE 2

|  | CBL |
|---|---|
| Base layer material: | Resin |
| Filler type: | $SiO_2$ |
| Filler content (wt %): | 87 |
| Average/maximum filler size (um): | 3/10 |
| Young's Modulus (GPa): | 20 |
| Breaking Strength (MPa): | 90 |
| Cure condition (° C. × min) | 180 × 90 |

Figure 10A:
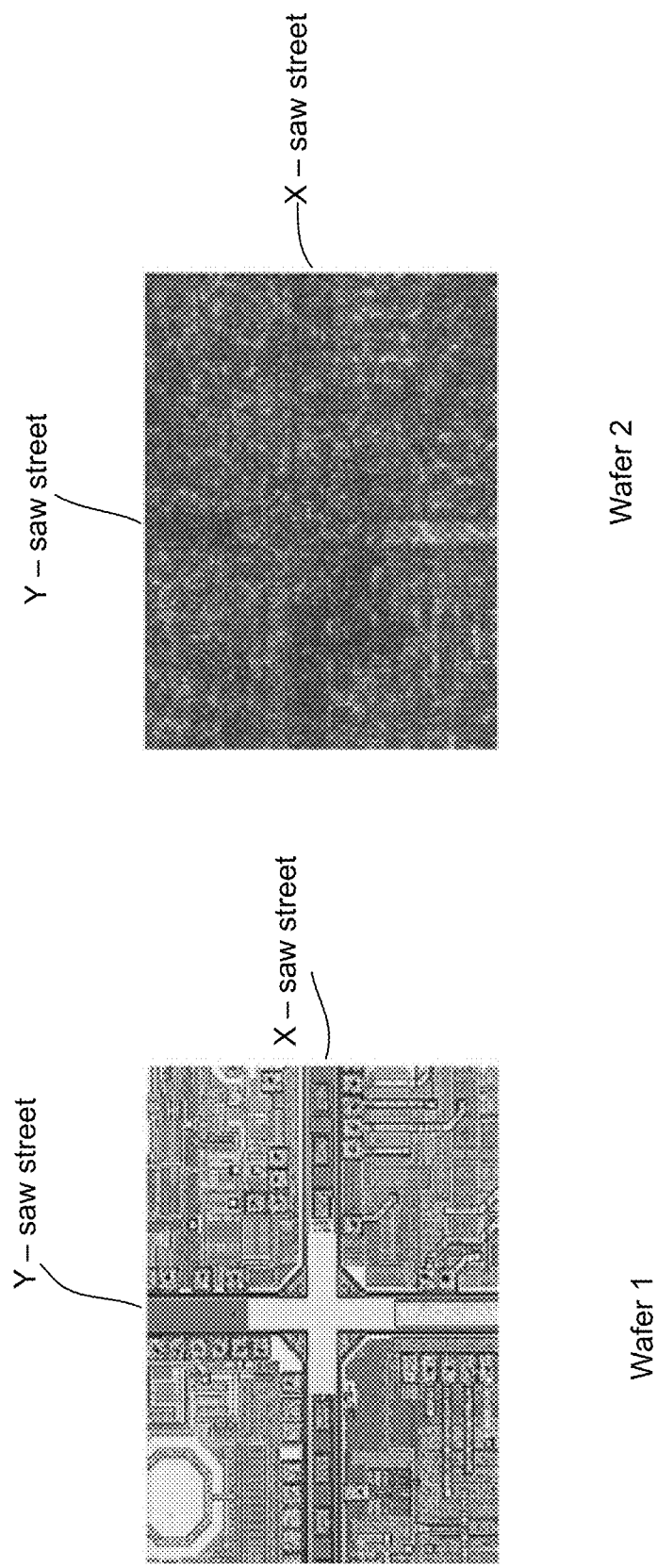
FIGS. 10a-10c show images of wafers with and without a composite buffer layer before and after dicing.
Figure 10B:
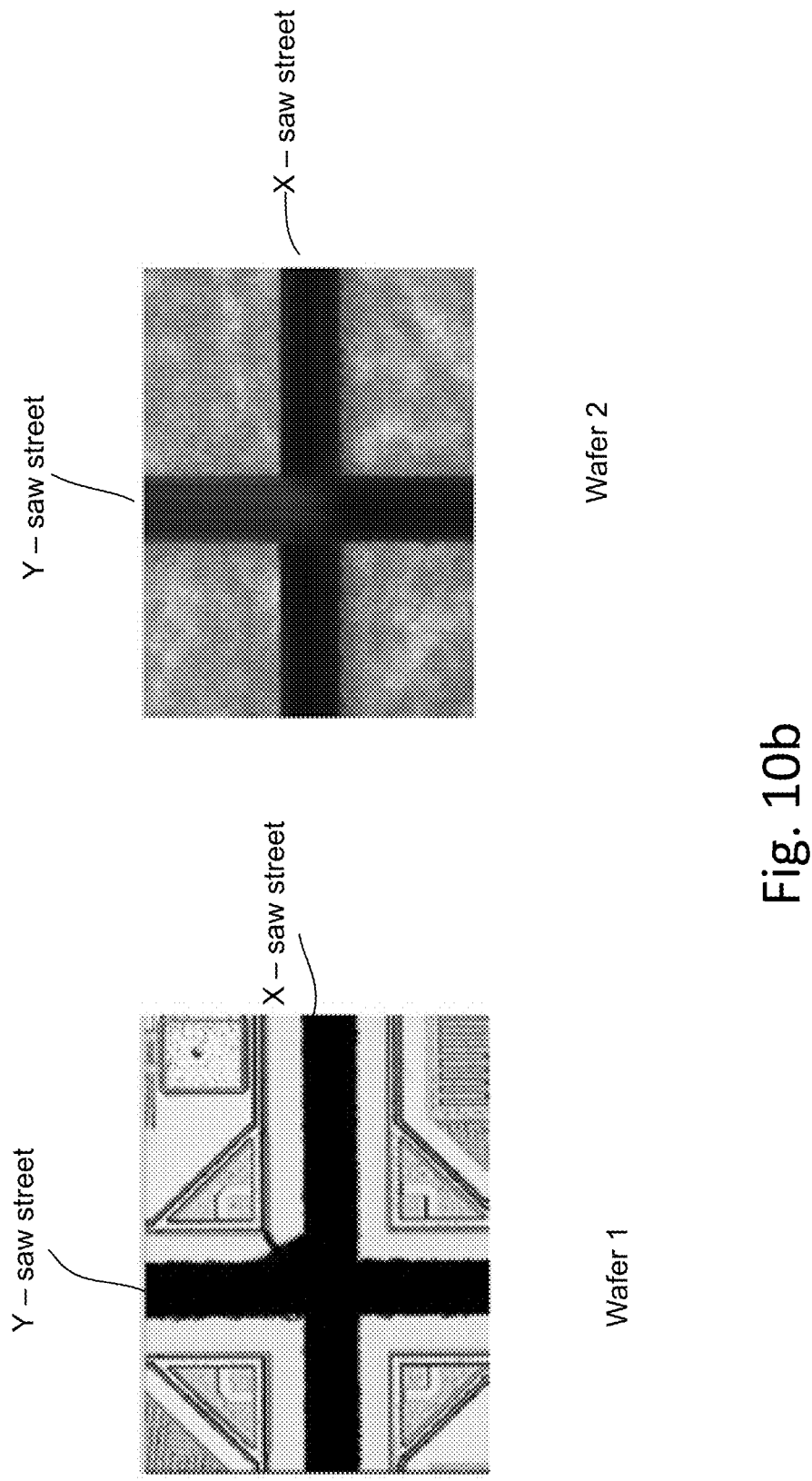
Figure 10C:
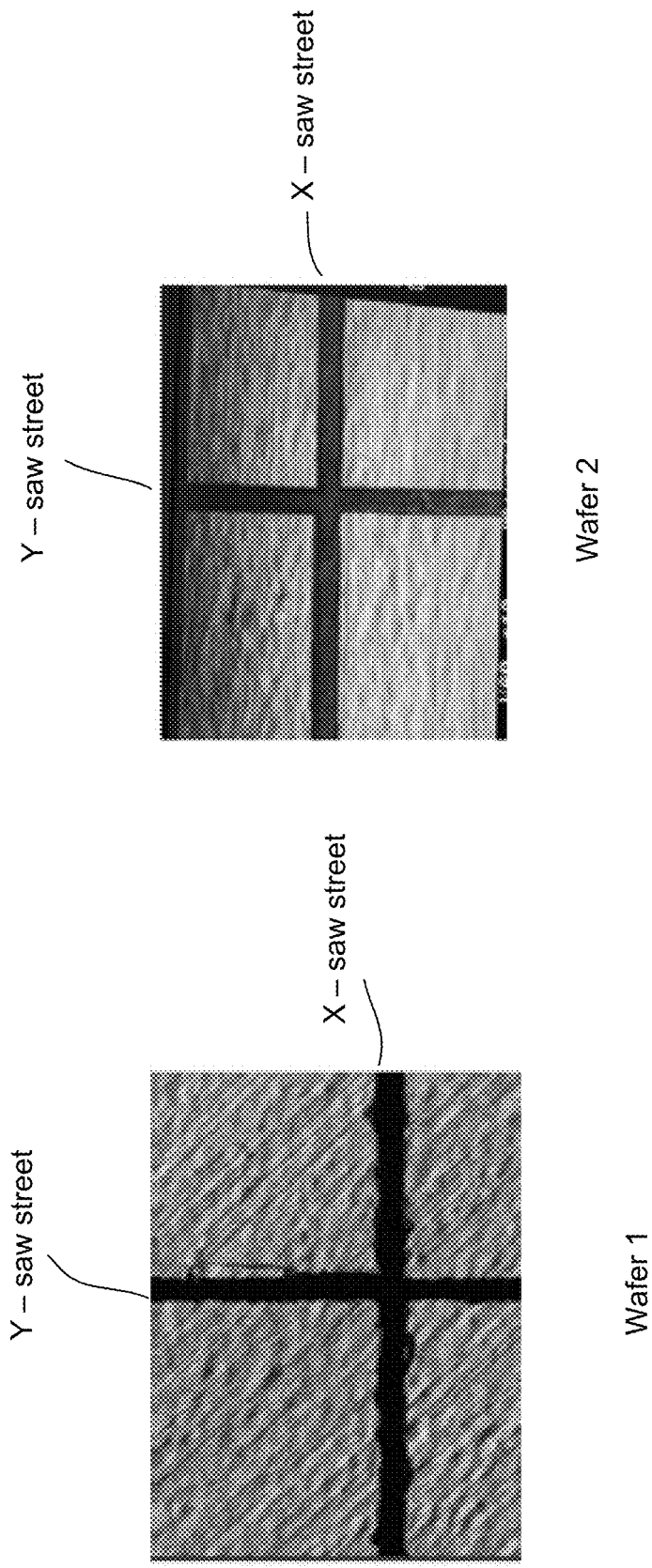

FIG. 10a shows images of Wafer 1 and Wafer 2 at the X saw street and Y saw street before dicing. Wafer 1 was diced using direct sawing from the frontside and Wafer 2 was singulated with dice before grind (DBG). FIG. 10b shows images of Wafer 1 and Wafer 2 at the X and Y saw streets after dicing. For Wafer 1, chipping of more than 50 um in size was observed. On the other hand, no chipping was observed on Wafer 2. For example, chipping of less than 3 um, which is negligible, was observed. FIG. 10c shows images of the backside of Wafer 1 and Wafer 2 at the X and Y saw streets after dicing. For Wafer 1, chipping of more than 80 um in size was observed. For Wafer 2, chipping of less than 5 um in size was observed, which is negligible. Providing a composite buffer layer on the backside of the wafer may further reduce chipping on the backside of the wafer. The results of the experiment indicate that the composite buffer layer of the present disclosure is effective in reducing or preventing chipping caused by the wafer singulation process.

Another experiment was conducted with wafers that are similar to Wafer 2 of Table 1. However, 3 composite buffer layers with different Young's Modulus and Breaking Strength are used. The composite buffer layers CBL1, CBL2, and CBL3 are described in Table 3 below:

TABLE 3

|  | CBL1 | CBL2 | CBL3 |
|---|---|---|---|
| Base layer material: | Resin | Resin | Resin |
| Filler type: | $SiO_2$ | $SiO_2$ | $SiO_2$ |
| Filler content (wt %): | 82 | 87 | 84 |
| Average/maximum filler size (um): | 1/5 | 3/10 | Average 5 |
| Young's Modulus (GPa): | 5.5 | 20 | 16 |
| Breaking Strength (MPa): | 37 | 90 | 90 |
| Cure condition (° C. × min) | 180 × 90 | 180 × 90 |  |

The wafers were singulated using DBG. Chipping at the saw streets was observed on the wafer with CBL1. As for CBL2 and CBL3, no chipping was observed. The results of the experiment indicate that a composite buffer layer with higher Young's Modulus, such as greater 10-25 GPa and higher Breaking Strength, such as 50-100 MPa, is effective in reducing chipping from the wafer singulation process.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

The invention claimed is:

1. A semiconductor package comprising:
    a die with active and inactive surfaces, wherein the active surface includes die pads on a back-end-of-line (BEOL) dielectric;
    a buffer layer disposed on the active surface of the die, wherein the buffer layer includes a vibration damping composition to prevent cracking of the BEOL dielectric from a wafer singulation process;
    via openings in the buffer layer to expose the die pads; and
    via contacts disposed on the via openings to provide electrical connection to the die pads.

2. The semiconductor package of claim 1 further comprising a redistribution layer (RDL) structure which comprises:
    the via contacts;
    patterned conductive lines coupled to the via contacts; and
    an RDL encapsulation layer covering the RDL structure, wherein the RDL structure is disposed within a footprint of the die.

3. The semiconductor package of claim 2 wherein the semiconductor package comprises a package footprint equal to about the footprint of the die.

4. The semiconductor package of claim 2 wherein the semiconductor package comprises a backside buffer layer disposed on the inactive surface of the die, wherein the backside buffer layer prevents chipping of the die.

5. The semiconductor package of claim 2 wherein the semiconductor package comprises:
an encapsulation layer which covers and surrounds the die; and
the RDL encapsulation layer has a footprint which is about the same as the encapsulation layer.

6. The semiconductor package of claim 2 wherein the semiconductor package comprises:
an encapsulation layer which covers and surrounds the die and having a top encapsulation layer surface which is coplanar with the inactive surface of the die; and
the RDL encapsulation layer has a footprint which is about the same as the encapsulation layer.

7. The semiconductor package of claim 1 further comprising a redistribution layer (RDL) structure which comprises:
the via contacts;
patterned conductive lines coupled to the via contacts; and
an RDL encapsulation layer covering the RDL structure, wherein the RDL structure is disposed beyond a footprint of the die.

8. The semiconductor package of claim 7 wherein the semiconductor package comprises:
an encapsulation layer which covers and surrounds the die; and
the RDL encapsulation layer has a footprint which is about the same as the encapsulation layer.

9. The semiconductor package of claim 7 wherein the fan-out semiconductor package comprises:
an encapsulation layer which covers and surrounds the die and having a top encapsulation layer surface which is coplanar with the inactive surface of the die; and
the RDL encapsulation layer has a footprint which is about the same as the encapsulation layer.

10. The semiconductor package of claim 1 wherein the buffer layer comprises a composite buffer layer comprising:
a base buffer layer; and
fillers disposed within the base buffer layer.

11. The semiconductor package of claim 10 wherein the base buffer layer comprises a polymer-based buffer layer.

12. The semiconductor package of claim 10 wherein the fillers of the composite buffer layer comprise organic fillers, inorganic fillers or a combination thereof.

13. The semiconductor package of claim 10 wherein sizes of the fillers range from about 0.5 to about 12 um.

14. The semiconductor package of claim 13 wherein the fillers are non-uniform in size and have different shapes for reaching a higher density within the base buffer layer.

15. The semiconductor package of claim 10 wherein sizes of the fillers range from about 0.5 um to about ⅓ of a width of a saw blade used in the wafer singulation process.

16. The semiconductor package of claim 10 wherein the composite buffer layer has a thickness of about 10-100 um.

17. The semiconductor package of claim 10 wherein the composite buffer layer comprises a preformed composite buffer layer.

18. The semiconductor package of claim 1 wherein the buffer layer comprises a Young's Modulus of about 10,000-25,000 MPa.

19. The semiconductor package of claim 1 wherein the back-end-of-line (BEOL) dielectric comprises low-k dielectrics, ultra low-k dielectrics, GaN and germanium (Ge) coated materials or a combination thereof.

20. A semiconductor package comprising:
a die with active and inactive surfaces, wherein the active surface includes die pads on a back-end-of-line (BEOL) dielectric;
a buffer layer disposed on the active surface of the die, wherein the buffer layer comprises a Young's Modulus and a Breaking Strength to prevent cracking of the BEOL dielectric from a wafer singulation process; and
via openings in the buffer layer to expose the die pads; and
via contacts disposed on the via openings to provide electrical connection to the die pads.

* * * * *